(12) United States Patent
Nakamura

(10) Patent No.: US 10,424,632 B2
(45) Date of Patent: Sep. 24, 2019

(54) DISPLAY DEVICE AND ELECTRONIC DEVICE

(71) Applicant: Semiconductor Energy Laboratory Co., Ltd., Atsugi-shi, Kanagawa-ken (JP)

(72) Inventor: Daiki Nakamura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 59 days.

(21) Appl. No.: 15/358,337

(22) Filed: Nov. 22, 2016

(65) Prior Publication Data

US 2017/0154947 A1     Jun. 1, 2017

(30) Foreign Application Priority Data

Nov. 30, 2015  (JP) ................................. 2015-232969
May 20, 2016  (JP) ................................. 2016-101538

(51) Int. Cl.
*H01L 27/32* (2006.01)
*H01L 51/52* (2006.01)
*H01L 51/00* (2006.01)

(52) U.S. Cl.
CPC ...... *H01L 27/3293* (2013.01); *H01L 51/0097* (2013.01); *H01L 51/5275* (2013.01); *H01L 51/5281* (2013.01); *H01L 51/5284* (2013.01); *H01L 27/3297* (2013.01); *Y02E 10/549* (2013.01)

(58) Field of Classification Search
CPC ....................... H01L 27/3267; H01L 27/3293
See application file for complete search history.

(56) References Cited

U.S. PATENT DOCUMENTS

| 5,801,797 A | 9/1998 | Iida et al. |
| 9,088,006 B2 | 7/2015 | Yamazaki et al. |
| 2002/0113546 A1 | 8/2002 | Seo et al. |
| 2003/0032210 A1 | 2/2003 | Takayama et al. |
| 2003/0090198 A1 | 5/2003 | Aston |
| 2005/0285811 A1 | 12/2005 | Kawase et al. |
| 2008/0197769 A1 | 8/2008 | Seo et al. |
| 2009/0239320 A1 | 9/2009 | Takayama et al. |
| 2010/0164906 A1 | 7/2010 | Fukunaga et al. |

(Continued)

FOREIGN PATENT DOCUMENTS

| JP | 09-311344 A | 12/1997 |
| JP | 2002-324673 A | 11/2002 |

(Continued)

*Primary Examiner* — Jamie C Niesz
(74) *Attorney, Agent, or Firm* — Fish & Richardson P.C.

(57) ABSTRACT

A display device including a wide display region in which a seam is less likely to be noticed is provided. The display device includes two display panels that overlap with each other. An upper display panel includes a first display region and a region that transmits visible light. A lower display panel includes a second display region and a region that blocks visible light. The second display region overlaps with, on a display surface side, the region that transmits visible light. The region that blocks visible light overlaps with the first display region. At least part of an insulating layer included in the upper display panel is provided in the first display region and not provided in the region that transmits visible light.

23 Claims, 38 Drawing Sheets

(56) References Cited

U.S. PATENT DOCUMENTS

| | | |
|---|---|---|
| 2010/0177018 A1 | 7/2010 | Wang et al. |
| 2011/0050657 A1 | 3/2011 | Yamada |
| 2011/0057861 A1 | 3/2011 | Cok et al. |
| 2012/0268445 A1 | 10/2012 | Ogata et al. |
| 2013/0200783 A1 | 8/2013 | Van Heck et al. |
| 2013/0201636 A1 | 8/2013 | Van Den Brand et al. |
| 2013/0201637 A1 | 8/2013 | De Kok et al. |
| 2013/0214324 A1 | 8/2013 | Takayama et al. |
| 2015/0028316 A1 | 1/2015 | Kojima et al. |
| 2015/0228704 A1* | 8/2015 | Miyake ............... H01L 51/0097 257/40 |
| 2015/0325812 A1 | 11/2015 | Yamazaki et al. |
| 2016/0014882 A1 | 1/2016 | Jongman et al. |

FOREIGN PATENT DOCUMENTS

| | | |
|---|---|---|
| JP | 2003-174153 A | 6/2003 |
| JP | 2010-266777 A | 11/2010 |
| JP | 2011-022302 A | 2/2011 |
| JP | 2011-192567 A | 9/2011 |
| JP | 2012-028638 A | 2/2012 |
| JP | 2014-197522 A | 10/2014 |

\* cited by examiner

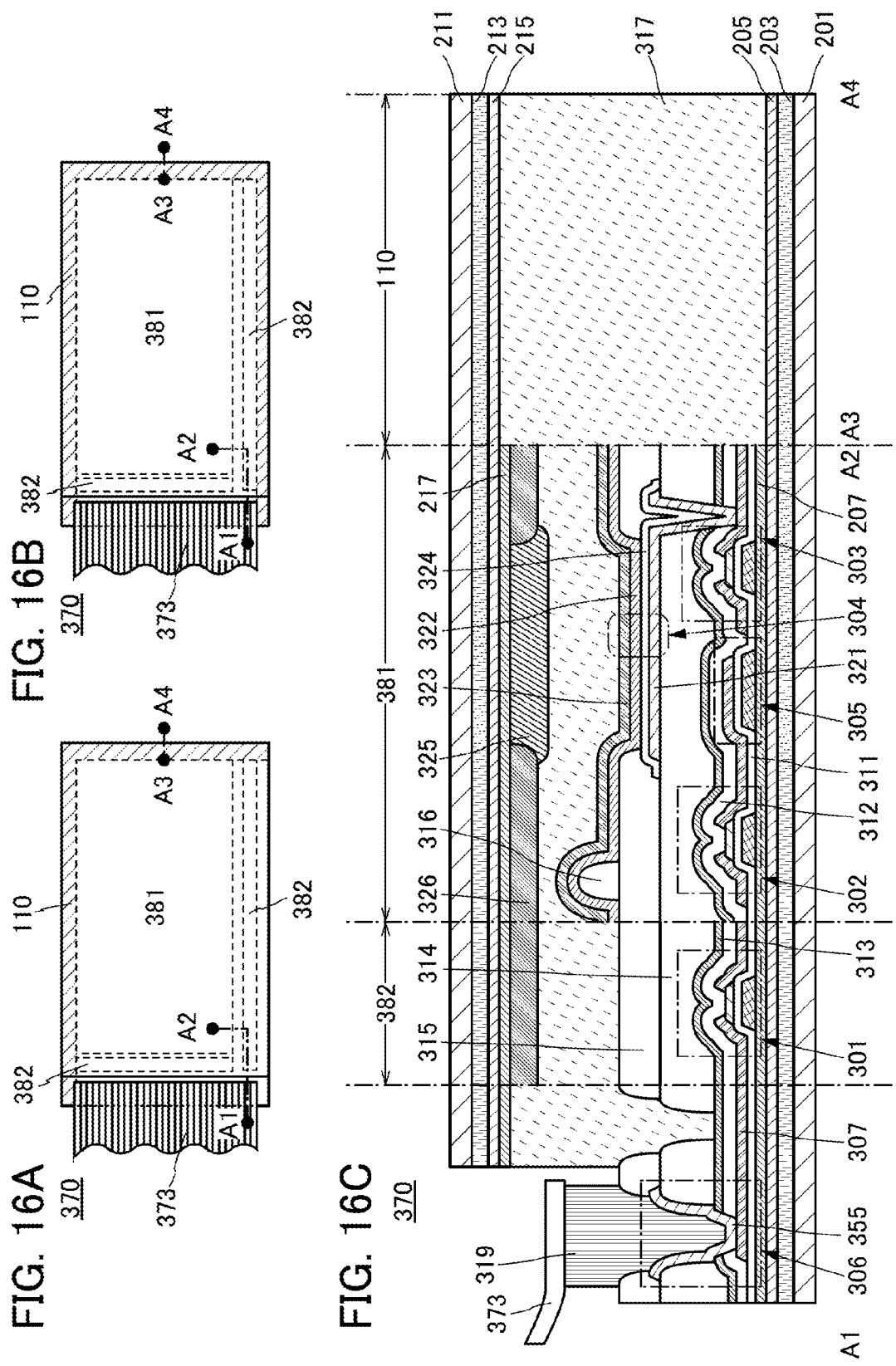

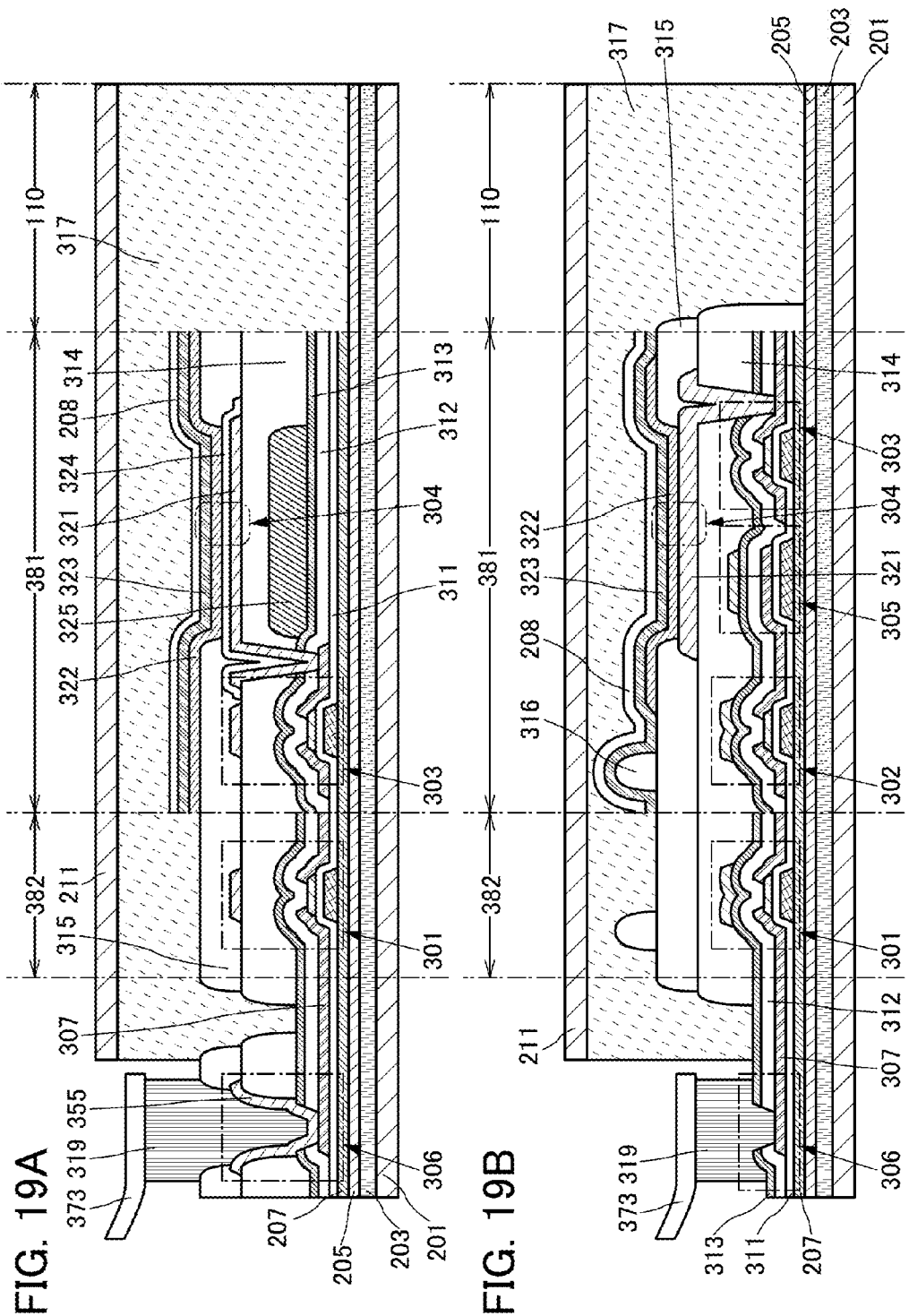

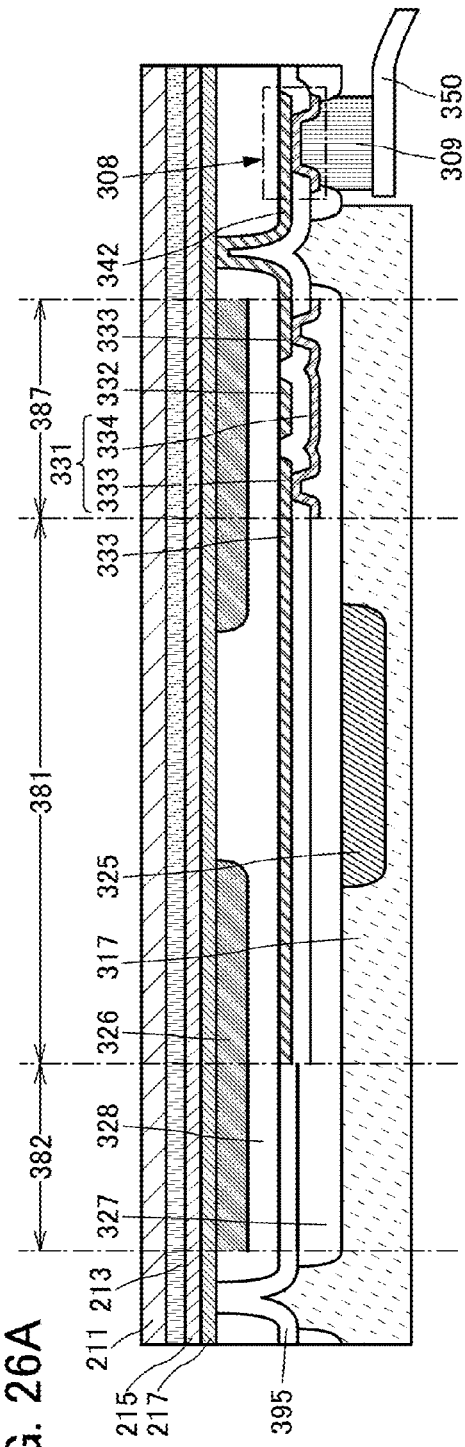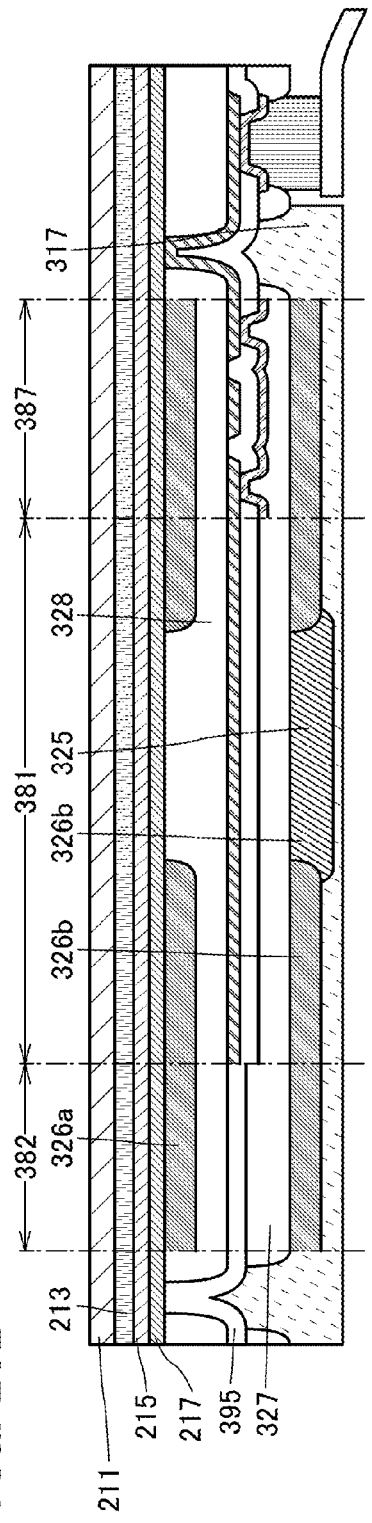

FIG. 30A1
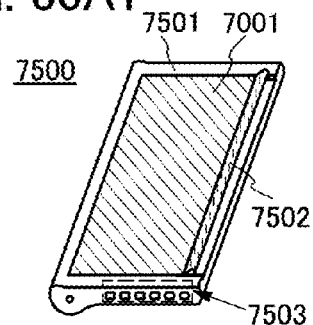
FIG. 30B
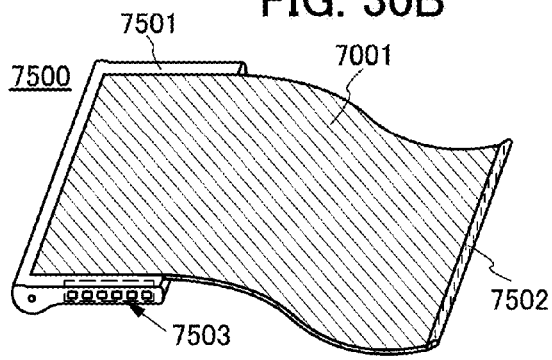
FIG. 30A2
FIG. 30C
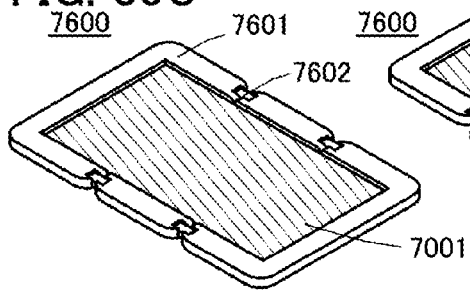
FIG. 30D
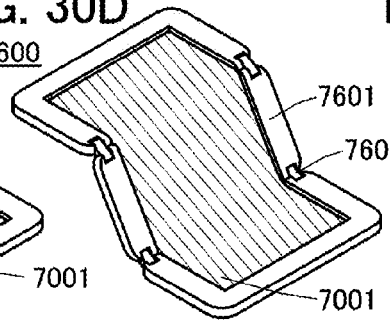
FIG. 30E
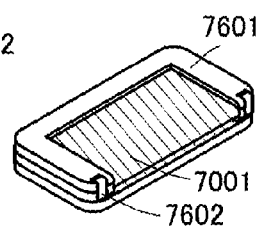
FIG. 30F
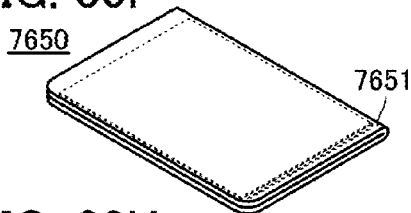
FIG. 30G
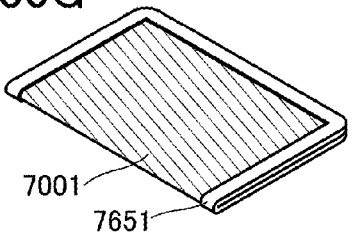
FIG. 30H
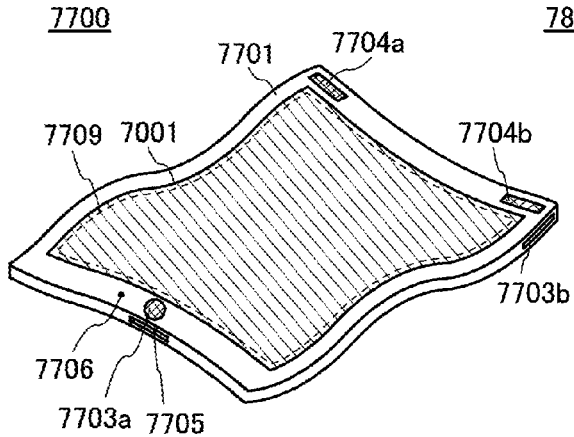
FIG. 30I
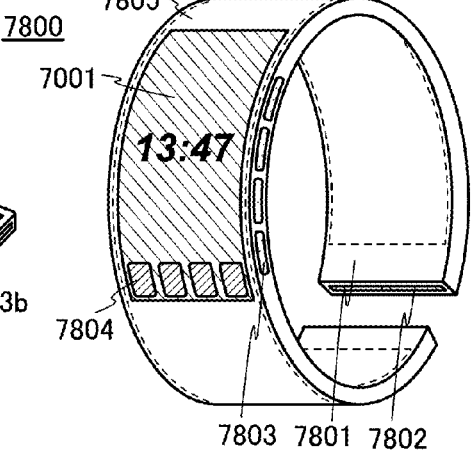

Sample a

Sample b

Sample c

Sample d

DISPLAY DEVICE AND ELECTRONIC DEVICE

BACKGROUND OF THE INVENTION

1. Field of the Invention

One embodiment of the present invention relates to a display device, an electronic device, and a method for manufacturing thereof.

Note that one embodiment of the present invention is not limited to the above technical field. Examples of the technical field of one embodiment of the present invention include a semiconductor device, a display device, a light-emitting device, a power storage device, a memory device, an electronic device, a lighting device, an input device, an input/output device, a method for driving any of them, and a method for manufacturing any of them.

2. Description of the Related Art

In recent years, larger display devices have been required. Examples of uses for a large display device include a television device for home use (also referred to as a TV or a television receiver), digital signage, and a public information display (PID). A larger display region of a display device can provide more information at a time. In addition, a larger display region attracts more attention, so that the effectiveness of the advertisement is expected to be increased, for example.

Light-emitting elements utilizing electroluminescence (also referred to as EL elements) have features such as ease of thinning and lightening, high-speed response to an input signal, and driving with a direct-current low voltage source; thus, application of the EL elements to display devices has been proposed. For example, Patent Document 1 discloses a flexible light-emitting device including an organic EL element.

REFERENCE

Patent Document

[Patent Document 1] Japanese Published Patent Application No. 2014-197522

SUMMARY OF THE INVENTION

An object of one embodiment of the present invention is to increase the size of a display device. Another object of one embodiment of the present invention is to provide a display device including a wide display region in which a seam is less likely to be noticed. Another object of one embodiment of the present invention is to suppress display unevenness or luminance unevenness of a display device. Another object of one embodiment of the present invention is to reduce the thickness or weight of a display device. Another object of one embodiment of the present invention is to provide a display device that can display images along a curved surface. Another object of one embodiment of the present invention is to provide a highly browsable display device. Another object of one embodiment of the present invention is to provide a novel display device.

Note that the descriptions of these objects do not disturb the existence of other objects. In one embodiment of the present invention, there is no need to achieve all the objects. Other objects can be derived from the description of the specification, the drawings, and the claims.

A display panel of one embodiment of the present invention includes a first substrate, a second substrate, a first bonding layer, a second bonding layer, a first insulating layer, a second insulating layer, and a display element. The display panel includes a display region and a region that transmits visible light. The display region is adjacent to the region that transmits visible light. The first bonding layer is positioned between the first substrate and the first insulating layer. The second bonding layer is positioned between the second substrate and the first insulating layer. In the display region, the second insulating layer is in contact with the first insulating layer and is positioned between the first insulating layer and the second bonding layer. In the display region, the display element is positioned between the second insulating layer and the second bonding layer. In the region that transmits visible light, the first insulating layer is in contact with the second bonding layer. The first insulating layer is preferably an oxide insulating film. The second insulating layer preferably includes a nitride insulating film. The first substrate and the second substrate are preferably flexible. The difference in refractive index between the first substrate and the first bonding layer is preferably less than or equal to 0.20. Similarly, each of the differences in refractive index between the first bonding layer and the first insulating layer, between the second bonding layer and the first insulating layer, and between the second substrate and the second bonding layer is preferably less than or equal to 0.20.

A display panel of another embodiment of the present invention includes a first substrate, a second substrate, a first bonding layer, a second bonding layer, a third bonding layer, a first insulating layer, a second insulating layer, a third insulating layer, a fourth insulating layer, and a display element. The display panel includes a display region and a region that transmits visible light. The display region is adjacent to the region that transmits visible light. The first bonding layer is positioned between the first substrate and the first insulating layer. The second bonding layer is positioned between the second substrate and the third insulating layer. The third bonding layer is positioned between the first insulating layer and the third insulating layer. In the display region, the second insulating layer is in contact with the first insulating layer, the fourth insulating layer is in contact with the third insulating layer, and the third bonding layer is positioned between the second insulating layer and the fourth insulating layer. In the display region, the display element is positioned between the second insulating layer and the third bonding layer. In the region that transmits visible light, the third bonding layer is in contact with the first insulating layer and the third insulating layer. Each of the first and third insulating layers is preferably an oxide insulating film. Each of the second and fourth insulating layers preferably includes a nitride insulating film. The first substrate and the second substrate are preferably flexible. The difference in refractive index between the first substrate and the first bonding layer is preferably less than or equal to 0.20. Similarly, each of the differences in refractive index between the first bonding layer and the first insulating layer, between the third bonding layer and the first insulating layer, between the second substrate and the second bonding layer, between the second bonding layer and the third insulating layer, and between the third bonding layer and the third insulating layer is preferably less than or equal to 0.20.

In each of the above display panels having the structures, the first insulating layer is provided in the display region and the region that transmits visible light, and the second insulating layer is provided in the display region and is not provided in the region that transmits visible light. It is preferable that a gate insulating layer of a transistor be provided in the display region and not be provided in the region that transmits visible light. It is preferable that an inorganic insulating film covering the transistor be provided in the display region and not be provided in the region that transmits visible light. It is preferable that an organic insulating film covering the transistor be provided in the display region and not be provided in the region that transmits visible light.

A display device of one embodiment of the present invention includes a first display panel and a second display panel. The first display panel includes a first display region and a region that transmits visible light. The second display panel includes a second display region and a region that blocks visible light. The first display region is adjacent to the region that transmits visible light. The second display region overlaps with, on a display surface side, the region that transmits visible light. The region that blocks visible light overlaps with the first display region. The first display panel includes a first substrate, a second substrate, a first bonding layer, a second bonding layer, a first insulating layer, a second insulating layer, and a display element. The first bonding layer is positioned between the first substrate and the first insulating layer. The second bonding layer is positioned between the second substrate and the first insulating layer. In the first display region, the second insulating layer is in contact with the first insulating layer and positioned between the first insulating layer and the second bonding layer. In the first display region, the display element is positioned between the second insulating layer and the second bonding layer. In the region that transmits visible light, the first insulating layer is in contact with the second bonding layer. The first insulating layer is preferably an oxide insulating film. The second insulating layer preferably includes a nitride insulating film. The first substrate and the second substrate are preferably flexible. The difference in refractive index between the first substrate and the first bonding layer is preferably less than or equal to 0.20. Similarly, each of the differences in refractive index between the first bonding layer and the first insulating layer, between the second bonding layer and the first insulating layer, and between the second substrate and the second bonding layer is preferably less than or equal to 0.20.

A display device of one embodiment of the present invention includes a first display panel and a second display panel. The first display panel includes a first display region and a region that transmits visible light. The second display panel includes a second display region and a region that blocks visible light. The first display region is adjacent to the region that transmits visible light. The second display region overlaps with, on a display surface side, the region that transmits visible light. The region that blocks visible light overlaps with the first display region. The first display panel includes a first substrate, a second substrate, a first bonding layer, a second bonding layer, a third bonding layer, a first insulating layer, a second insulating layer, a third insulating layer, a fourth insulating layer, and a display element. The first bonding layer is positioned between the first substrate and the first insulating layer. The second bonding layer is positioned between the second substrate and the third insulating layer. The third bonding layer is positioned between the first insulating layer and the third insulating layer. In the first display region, the second insulating layer is in contact with the first insulating layer, the fourth insulating layer is in contact with the third insulating layer, and the third bonding layer is positioned between the second insulating layer and the fourth insulating layer. In the first display region, the display element is positioned between the second insulating layer and the third bonding layer. In the region that transmits visible light, the third bonding layer is in contact with the first insulating layer and the third insulating layer. Each of the first and third insulating layers is preferably an oxide insulating film. Each of the second and fourth insulating layers preferably includes a nitride insulating film. The first substrate and the second substrate are preferably flexible. The difference in refractive index between the first substrate and the first bonding layer is preferably less than or equal to 0.20. Similarly, each of the differences in refractive index between the first bonding layer and the first insulating layer, between the third bonding layer and the first insulating layer, between the second substrate and the second bonding layer, between the second bonding layer and the third insulating layer, and between the third bonding layer and the third insulating layer is preferably less than or equal to 0.20.

It is preferable that a circular polarizer be further included in each of the above display devices having the structures. The circular polarizer is positioned so that the first and second display regions overlap with the circular polarizer on the display surface side. Each of the first substrate and the second substrate is preferably a substrate that is highly optically isotropic.

In each of the above display devices having the structures, the first display panel and the second display panel are preferably flexible.

Each of the above display devices having the structures may include the first display panel and the second display panel as part of a module such as a module provided with a connector such as a flexible printed circuit (hereinafter also referred to as an FPC) or a tape carrier package (TCP) or a module mounted with an integrated circuit (IC) by a chip on glass (COG) method, a chip on film (COF) method, or the like.

One embodiment of the present invention is an electronic device including any of the above display devices, and at least one of an antenna, a battery, a housing, a camera, a speaker, a microphone, and an operation button.

A separation method of one embodiment of the present invention includes a first step of forming a separation layer over a substrate; a second step of forming a first insulating layer over the separation layer; a third step of forming a second insulating layer over the first insulating layer; a fourth step of heating the separation layer, the first insulating layer, and the second insulating layer; a fifth step of removing part of the second insulating layer; and a sixth step of separating the substrate from the first insulating layer. Plasma treatment is preferably performed on a surface of the separation layer between the first step and the second step. The plasma treatment is preferably performed under an atmosphere containing nitrous oxide, further preferably under an atmosphere containing nitrous oxide and silane.

A separation method of one embodiment of the present invention includes a first step of forming a first separation layer over a first formation substrate; a second step of forming a first insulating layer over the first separation layer; a third step of forming a second insulating layer over the first insulating layer; a fourth step of heating the first separation layer, the first insulating layer, and the second insulating layer; a fifth step of removing part of the second insulating layer; a sixth step of forming a second separation layer over a second formation substrate; a seventh step of forming a third insulating layer over the second separation layer; an eighth step of forming a fourth insulating layer over the third insulating layer; a ninth step of heating the second separation layer, the third insulating layer, and the fourth insulating layer; a tenth step of removing part of the fourth insulating layer; an eleventh step of attaching the first formation substrate to the second formation substrate using an adhesive; a twelfth step of separating the first formation substrate from the first insulating layer; a thirteenth step of attaching the first insulating layer to the first substrate using an adhesive; a fourteenth step of separating the second formation substrate from the third insulating layer; and a fifteenth step of attaching the third insulating layer from the second substrate. Plasma treatment is preferably performed on a surface of the first separation layer between the first step and the second step. The plasma treatment is preferably performed on a surface of the second separation layer between the sixth step and the seventh step. The plasma treatment is preferably performed under an atmosphere containing nitrous oxide, further preferably under an atmosphere containing nitrous oxide and silane.

One embodiment of the present invention can increase the size of a display device. One embodiment of the present invention can provide a display device including a wide display region in which a seam is less likely to be noticed. One embodiment of the present invention can suppress display unevenness or luminance unevenness of a display device. According to one embodiment of the present invention, the display device can be thin or lightweight. One embodiment of the present invention can provide a display device capable of displaying an image along a curved surface. One embodiment of the present invention can provide a highly browsable display device. One embodiment of the present invention can provide a novel display device.

Note that the description of these effects does not preclude the existence of other effects. One embodiment of the present invention does not necessarily achieve all the effects listed above. Other effects can be derived from the description of the specification, the drawings, and the claims.

BRIEF DESCRIPTION OF THE DRAWINGS

FIGS. 16A to 16C are top views and a cross-sectional view illustrating an example of a display panel.

FIGS. 19A and 19B are cross-sectional views each illustrating an example of a display panel.

FIGS. 26A and 26B are cross-sectional views illustrating examples of a touch panel.

FIGS. 30A1 and 30A2 and FIGS. 30B to 30I each illustrate an example of an electronic device.

DETAILED DESCRIPTION OF THE INVENTION

Figure 1A:
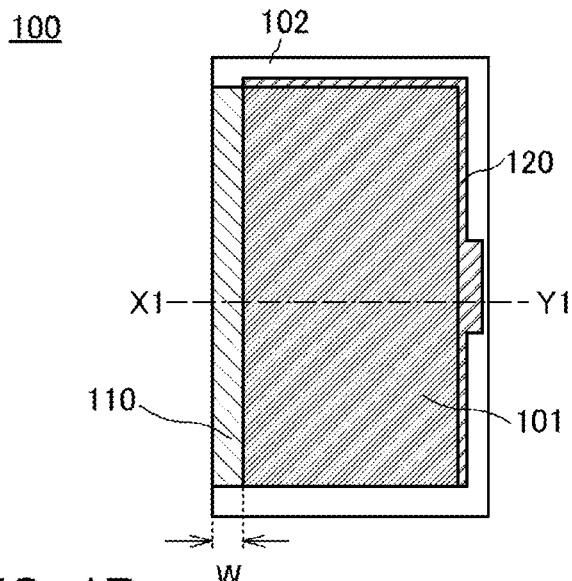
FIGS. 1A to 1C are a top view and cross-sectional views illustrating an example of a display panel.

Embodiments are described in detail with reference to the drawings. Note that the present invention is not limited to the following description. It is readily appreciated by those skilled in the art that modes and details of the present invention can be modified in various ways without departing from the spirit and scope of the present invention. Thus, the present invention should not be construed as being limited to the description in the following embodiments.

Note that in the structures of the invention described below, the same portions or portions having similar functions are denoted by the same reference numerals in different drawings, and description of such portions is not repeated.

Furthermore, the same hatching pattern is applied to portions having similar functions, and the portions are not especially denoted by reference numerals in some cases.

The position, size, range, or the like of each structure illustrated in drawings is not accurately represented in some cases for easy understanding. Therefore, the disclosed invention is not necessarily limited to the position, size, range, or the like disclosed in the drawings.

Note that the terms "film" and "layer" can be interchanged with each other depending on the case or circumstances. For example, the term "conductive layer" can be changed into the term "conductive film". In addition, the term "insulating film" can be changed into the term "insulating layer".

(Embodiment 1)

In this embodiment, a display device of one embodiment of the present invention is described with reference to FIGS. 1A to 1C, FIGS. 2A and 2B, FIGS. 3A to 3D, FIGS. 4A to 4C, FIGS. 5A to 5F, FIGS. 6A to 6C, FIGS. 7A and 7B, FIGS. 8A to 8G, FIGS. 9A to 9E, FIGS. 10A to 10C, FIGS. 11A to 11E, FIGS. 12A to 12D, FIGS. 13A to 13C, FIGS. 14A to 14C, and 15A to 15C.

When a plurality of display panels are arranged in one or more directions (e.g., in one column or in matrix), a display device with a large display region can be manufactured.

In the case where a large display device is manufactured using a plurality of display panels, each of the display panels is not required to be large. Thus, an apparatus for manufacturing the display panel does not need to be increased in size, whereby space-saving can be achieved. Furthermore, since an apparatus for manufacturing small- and medium-sized display panels can be used and a novel apparatus for manufacturing large display devices is unnecessary, manufacturing cost can be reduced. In addition, a decrease in yield caused by an increase in the size of a display panel can be suppressed.

A display device including a plurality of display panels has a larger display region than a display device including one display panel when the display panels have the same size, and has an effect of displaying more information at a time, for example.

However, each of the display panels has a non-display region that surrounds a display region. Thus, for example, in the case where output images of a plurality of display panels are used to display one image, the image appears divided to a user of the display device.

Making the non-display regions of the display panels small (using display panels with narrow frames) can prevent an image displayed on the display panels from appearing divided; however, it is difficult to totally remove the non-display regions of the display panel.

A small non-display region of the display panel leads to a decrease in the distance between an end portion of the display panel and an element in the display panel, in which case the element easily deteriorates by impurities entering from outside the display panel in some cases.

Thus, in one embodiment of the present invention, a plurality of display panels are arranged to partly overlap with one another. In two display panels overlapping with each other, at least a display panel positioned on the display surface side (upper side) includes a region that transmits visible light and a display region adjacent to each other. In one embodiment of the present invention, a display region of a display panel positioned on a lower side and the region that transmits visible light of the display panel on the upper side overlap with each other. Thus, a non-display region between the display regions of the two overlapping display panels can be reduced and even removed. As a result, a large-sized display device in which a seam of the display panels is hardly seen by the user can be obtained.

At least part of a non-display region of the display panel on the upper side transmits visible light, and can overlap with the display region of the display panel on the lower side. Furthermore, at least part of a non-display region of the display panel on the lower side can overlap with the display region of the display panel on the upper side or a region that blocks visible light thereof. It is not necessary to reduce the areas of the non-display regions because a reduction in the area of the frame of the display device (a reduction in area except a display region) is not affected by these regions.

A large non-display region of the display panel leads to an increase in the distance between the end portion of the display panel and an element in the display panel, in which case the deterioration of the element due to impurities entering from outside the display panel can be suppressed. For example, in the case where an organic EL element is used as a display element, impurities such as moisture or oxygen are less likely to enter (or less likely to reach) the organic EL element from outside the display panel as the distance between the end portion of the display panel and the organic EL element increases. Since a sufficient area of the non-display region of the display panel can be secured in the display device of one embodiment of the present invention, a highly reliable large display device can be fabricated even when a display panel including an organic EL element or the like is used.

However, the region that transmits visible light reflects or absorbs visible light (e.g., light at a wavelength greater than or equal to 400 nm and less than or equal to 700 nm). When the region that transmits visible light reflects external light, a user of the display device can easily notice an area in which two or more display panels overlap with each other (hereinafter, also referred to as an overlapping area). The user of the display device can easily notice the overlapping area particularly when the display panel on the lower side does not perform display or performs black display. Moreover, the luminance (brightness) of display on the display panel on the lower side is different between a portion seen through the region that transmits visible light and a portion seen not through the region.

Thus, in one embodiment of the present invention, the number of interfaces which are included in the region that transmits visible light and at which a difference in refractive index is large is reduced. That is, a difference in refractive index between two layers that are in contact with each other is reduced. Accordingly, reflection of external light in the region that transmits visible light is suppressed, so that the overlapping area cannot be easily noticed by a user of the display device. Therefore, a display device including a wide display region in which a seam is less likely to be noticed can be fabricated.

By reducing the number of interfaces included in the region that transmits visible light and at which a difference in refractive index is large, the transmittance of visible light in the region that transmits visible light can be increased. Thus, the difference in the luminance (brightness) of display on the display panel on the lower side between a portion seen through the region that transmits visible light and a portion seen not through the region can be small. Accordingly, the display unevenness or luminance unevenness of the display region can be suppressed.

<Structural Example 1 of Display Panel>

FIG. 1A is a top view of a display panel 100.

The display panel 100 includes a display region 101 and a region 102. Here, the region 102 is a portion other than the display region 101 of the display panel 100 in a top view. The region 102 can also be referred to as a non-display region.

The region 102 includes a region 110 that transmits visible light and a region 120 that blocks visible light. The region 110 that transmits visible light and the region 120 that blocks visible light are each adjacent to the display region 101.

The region 110 that transmits visible light and the region 120 that blocks visible light can each be provided along part of the outer end portion of the display region 101. In the display panel 100 illustrated in FIG. 1A, the region 110 that transmits visible light is provided along one side of the display region 101. The region 110 that transmits visible light may be provided along two or more sides of the display region 101. The region 110 that transmits visible light is preferably in contact with the display region 101 and provided so as to extend to end portions of the display panel as illustrated in FIG. 1A.

In the display panel 100 in FIG. 1A, the region 120 that blocks visible light is provided along two sides of the display region 101. The region 120 that blocks visible light may be extended close to an end portion of the display panel.

Note that in the region 102 illustrated in FIG. 1A, a region other than the region 110 that transmits visible light and the region 120 that blocks visible light does not necessarily have visible light transmittance.

The display region 101 includes a plurality of pixels arranged in a matrix and can display an image. One or more display elements are provided in each pixel. As the display element, a light-emitting element such as an EL element, an electrophoretic element, a display element with use of micro electro mechanical systems (MEMS), a liquid crystal element, or the like can be used, for example.

A material that transmits visible light is used for the region 110 that transmits visible light. A substrate, a bonding layer, or the like included in the display panel 100 may also be used, for example. The region 110 that transmits visible light preferably has a higher transmittance of visible light because extraction efficiency of light from the display panel under the region 110 that transmits visible light can be increased. The region 110 that transmits visible light preferably has a light transmittance of higher than or equal to 70%, further preferably higher than or equal to 80%, and still further preferably higher than or equal to 90% on average at a wavelength greater than or equal to 400 nm and less than or equal to 700 nm.

In the region 120 that blocks visible light, for example, a wiring electrically connected to the pixels (specifically, transistors, display elements, or the like) included in the display region 101 is provided. In addition to such a wiring, driver circuits (e.g., a scan line driver circuit or a signal line driver circuit) for driving the pixels can be provided.

The display panel can include at least one of the scan line driver circuit and the signal line driver circuit. Alternatively, the display panel may include neither the scan line driver circuit nor the signal line driver circuit. For example, an IC serving as at least one of the scan line driver circuit and the signal line driver circuit can be electrically connected to the display panel. The IC can be mounted on a display panel by a COG method or a COF method. Alternatively, an FPC, a tape automated bonding (TAB), a TCP, or the like on which the IC is mounted can be connected to a display panel.

Furthermore, the region 120 that blocks visible light includes a terminal electrically connected to an FPC or the like (also referred to as a connection terminal), a wiring electrically connected to the terminal, and the like. Note that in the case where the terminal, wiring, and the like transmit visible light, the terminal, wiring, and the like can be provided to extend to the region 110 that transmits visible light.

Here, a width W of the region 110 that transmits visible light illustrated in FIG. 1A is preferably greater than or equal to 0.5 mm and less than or equal to 150 mm, further preferably greater than or equal to 1 mm and less than or equal to 100 mm, and still further preferably greater than or equal to 2 mm and less than or equal to 50 mm. In the case where the width W of the region 110 that transmits visible light varies depending on the display panel, or in the case where the width varies depending on the positions of the same display panel, the shortest length is preferably within the above range. The region 110 that transmits visible light serves as a sealing region. As the width W of the region 110 that transmits visible light is larger, the distance between the end portion of the display panel 100 and the display region 101 can become longer, in which case entry of an impurity such as water from the outside into the display region 101 can be suppressed. Note that the width W of the region 110 that transmits visible light corresponds to the shortest distance between the display region 101 and the end portion of the display panel 100 in some cases.

In the case where an organic EL element is used as the display element, for example, the width W of the region 110 that transmits visible light is set to be greater than or equal to 1 mm, whereby deterioration of the organic EL element can be effectively suppressed, which leads to an improvement in reliability. Note that also in a portion other than the region 110 that transmits visible light, the distance between the end portion of the display region 101 and the end portion of the display panel 100 is preferably in the above range.

Figure 1B:
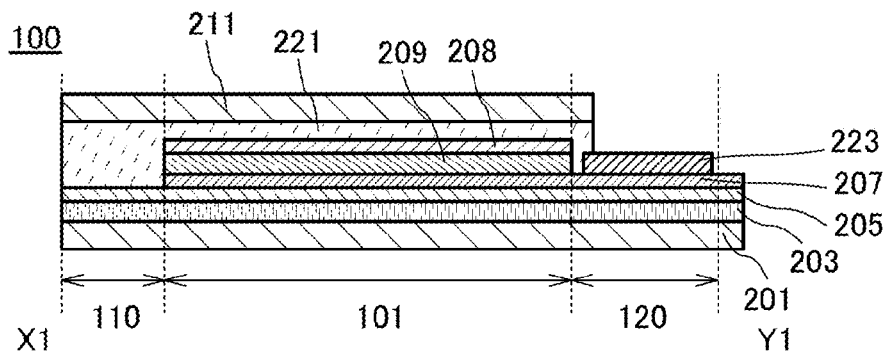
Figure 1C:
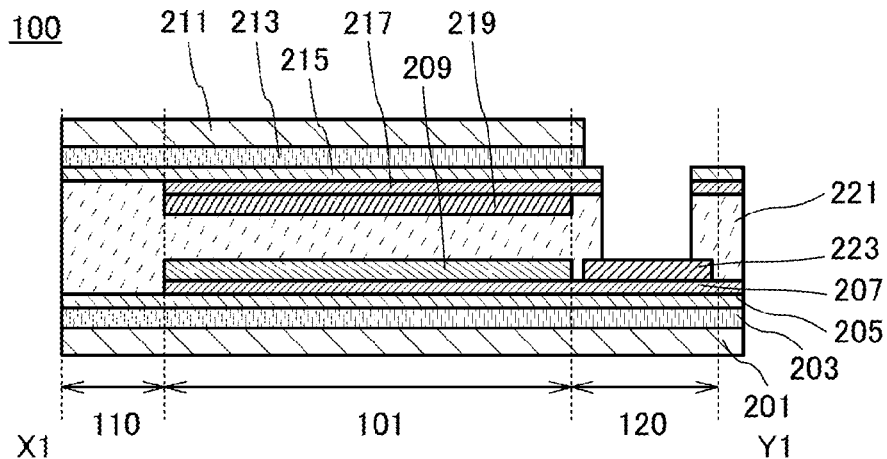

FIGS. 1B and 1C are cross-sectional views along dashed-dotted line X1-Y1 in FIG. 1A.

The display panel 100 illustrated in FIG. 1B includes a substrate 201, a bonding layer 203, a first insulating layer 205, a second insulating layer 207, an insulating layer 208, an element layer 209, a substrate 211, a bonding layer 221, and a connection terminal 223.

The bonding layer 203 is positioned between the substrate 201 and the first insulating layer 205. The bonding layer 221 is positioned between the substrate 211 and the first insulating layer 205.

In the display region 101, the second insulating layer 207 is in contact with the first insulating layer 205 and is positioned between the first insulating layer 205 and the bonding layer 221.

The display region 101 includes the element layer 209. The element layer 209 includes a display element. The display element is positioned between the second insulating layer 207 and the bonding layer 221. The display element is covered with the insulating layer 208.

In the region 110 that transmits visible light, the first insulating layer 205 is in contact with the bonding layer 221.

In the region 120 that blocks visible light, the connection terminal 223 is positioned over the second insulating layer 207. The connection terminal 223 includes an exposed portion not overlapping with the bonding layer 221 or the substrate 211.

In FIG. 1B, the second insulating layer 207 is provided in the display region 101 and is not provided in the region 110 that transmits visible light. Furthermore, in FIG. 1B, the insulating layer 208 covering the display element is provided in the display region 101 and is not provided in the region 110 that transmits visible light.

The display panel 100 illustrated in FIG. 1C includes the substrate 201, the bonding layer 203, the first insulating layer 205, the second insulating layer 207, the element layer 209, the substrate 211, a bonding layer 213, a third insulating layer 215, a fourth insulating layer 217, a functional layer 219, the bonding layer 221, and the connection terminal 223.

The bonding layer 203 is positioned between the substrate 201 and the first insulating layer 205. The bonding layer 213 is positioned between the substrate 211 and the third insulating layer 215. The bonding layer 221 is positioned between the first insulating layer 205 and the third insulating layer 215.

In the display region 101, the second insulating layer 207 is in contact with the first insulating layer 205, the fourth insulating layer 217 is in contact with the third insulating layer 215, and the bonding layer 221 is positioned between the second insulating layer 207 and the fourth insulating layer 217.

The display region 101 includes the element layer 209 and the functional layer 219.

The element layer 209 includes a display element. The display element is positioned between the second insulating layer 207 and the bonding layer 221.

The functional layer 219 includes at least one of a coloring layer (e.g., a color filter), a light-blocking layer (e.g., a black matrix), and a sensor (e.g., a touch sensor). The functional layer 219 is positioned between the fourth insulating layer 217 and the bonding layer 221.

In the region 110 that transmits visible light, the bonding layer 221 is in contact with the first insulating layer 205 and the third insulating layer 215.

In the region 120 that blocks visible light, the connection terminal 223 is positioned over the second insulating layer 207. The connection terminal 223 includes an exposed portion that does not overlap with the bonding layer 221, the fourth insulating layer 217, the third insulating layer 215, the bonding layer 213, or the substrate 211.

In FIG. 1C, the second insulating layer 207 and the fourth insulating layer 217 are provided in the display region 101 and are not provided in the region 110 that transmits visible light.

In each of the display panels illustrated in FIGS. 1B and 1C, the number of insulating layers included in the region 110 that transmits visible light is smaller than that of insulating layers included in the display region 101. The number of insulating layers included in the region 110 that transmits visible light is reduced as described above, and thus the number of interfaces at which a difference in refractive index is large in the region 110 that transmits visible light can be reduced.

Each of the first insulating layer 205 and the third insulating layer 215 is preferably an oxide insulating film. In a method for manufacturing a display panel, which is described later, separation is performed at an interface between a separation layer and an oxide insulating film. To increase a yield of the separation step, the oxide insulating film is preferably formed over the entire area of the display panel. For example, as the oxide insulating film, a silicon oxide film is preferably used. The refractive index of the silicon oxide film is approximately 1.5, and the difference in refractive index between the silicon oxide film and each of the substrates and the bonding layers that are used in the display panel is small. Thus, even when the silicon oxide film is provided in the region 110 that transmits visible light as the first insulating layer 205 or the third insulating layer 215, the reflection of light at the interface between the first insulating layer 205 or the third insulating layer 215 and another layer can be reduced.

In FIG. 1B, the display element is positioned between the second insulating layer 207 and the insulating layer 208. In FIG. 1C, the display element is positioned between the second insulating layer 207 and the fourth insulating layer 217. Each of the second insulating layer 207, the insulating layer 208, and the fourth insulating layer 217 preferably includes a nitride insulating film. A nitride insulating film is an insulating film with high resistance to moisture. By providing a display element between a pair of insulating films with high resistance to moisture, entry of an impurity such as moisture into the display element can be suppressed. Thus, a highly reliable display panel can be obtained. For example, as a nitride insulating film, a silicon nitride film is preferably used. The refractive index of the silicon nitride film is approximately 2.0, and the difference in refractive index between the silicon nitride film and each of the substrates and the bonding layers that are used in the display panel tends to be large. Thus, it is preferable that the second insulating layer 207, and the insulating layer 208 or the fourth insulating layer 217 be provided in the display region 101 and not be provided in the region 110 that transmits visible light. Accordingly, entry of an impurity into the display element and the reflection of light in the region 110 that transmits visible light can be suppressed.

The smaller differences between layers included in the region 110 that transmits visible light are, the more the reflection of light in the region 110 that transmits visible light can be suppressed.

In the region 110 that transmits visible light, the difference in refractive index between two layers that are in contact with each other is preferably smaller than or equal to 0.20, further preferably smaller than or equal to 0.15, still further preferably smaller than or equal to 0.10. For example, in FIG. 1B, each of the differences in refractive index between the substrate 201 and the bonding layer 203, between the bonding layer 203 and the first insulating layer 205, between the first insulating layer 205 and the bonding layer 221, and between the bonding layer 221 and the substrate 211 is preferably smaller than or equal to 0.20. For example, in FIG. 1C, each of the differences in refractive index between the substrate 201 and the bonding layer 203, between the bonding layer 203 and the first insulating layer 205, between the first insulating layer 205 and the bonding layer 221, between the bonding layer 221 and the third insulating layer 215, between the third insulating layer 215 and the bonding layer 213, and between the bonding layer 213 and the substrate 211 is preferably smaller than or equal to 0.20. It is preferable to reduce the difference in refractive index between layers included in the region 110 that transmits visible light because the reflection of light due to the difference in refractive index can be suppressed. The difference in refractive index between layers included in the region 110 that transmits visible light is preferably smaller than or equal to 0.20, further preferably smaller than or equal to 0.15, still further preferably smaller than or equal to 0.10.

It is preferable that the region 110 that transmits visible light not include insulating layers included in the element layer 209 and in the functional layer 219. For example, when the element layer 209 includes a transistor, it is preferable that a gate insulating layer of the transistor be provided in the display region 101 and not be provided in the region 110 that transmits visible light. It is preferable that an inorganic insulating film covering the transistor be provided in the display region 101 and not be provided in the region 110 that transmits visible light. It is preferable that an organic insulating film covering the transistor be provided in the display region 101 and not be provided in the region 110 that transmits visible light.

Note that one embodiment of the present invention is a structure in which at least part of the region 110 that transmits visible light is not provided with the second insulating layer 207, the element layer 209, and the fourth insulating layer 217. The region 110 that transmits visible light may partly include the second insulating layer 207, the element layer 209, and the fourth insulating layer 217. For example, these layers may be provided near the interface between the region 110 that transmits visible light and the display region 101.

The substrates 201 and 211 are preferably flexible. Using the flexible substrates can increase the flexibility of the display panel.

The thickness of each of the substrates 201 and 211 is preferably greater than or equal to 1 µm and less than or equal to 100 µm, further preferably greater than or equal to 1 µm and less than or equal to 50 µm, still further preferably greater than or equal to 1 µm and less than or equal to 25 µm. By reducing the thicknesses of the substrates, a step can be reduced when display panels overlap with each other.

Each of the substrates 201 and 211 preferably has a light transmittance of higher than or equal to 70%, further preferably higher than or equal to 80%, and still further preferably higher than or equal to 90% on average at a wavelength longer than or equal to 450 nm and shorter than or equal to 700 nm. As the transmittance of visible light in the substrates is higher, the transmittance of visible light in the region 110 that transmits visible light can be increased and extraction efficiency of light of the display device can be increased.

Each of the substrates 201 and 211 has a glass transition temperature preferably higher than or equal to 150° C., further preferably higher than or equal to 200° C., and still further preferably higher than or equal to 250° C. The higher the heat resistance of the substrates is, the more defects of the display panel due to preservation in high temperature environment, a pressure-bonding step of an FPC, or the like can be reduced.

The coefficient of thermal expansion of each of the substrates 201 and 211 is preferably lower than or equal to 60 ppm/° C., further preferably lower than or equal to 30 ppm/° C., still further preferably lower than or equal to 15 ppm/° C. The lower the coefficient of thermal expansion of substrate is, the less the display panel is influenced by a temperature change of an environment in which the display panel is stored. For example, even when the temperature of a storage environment is changed, generation of creases in the display panel and a crack in an inorganic film can be suppressed.

The coefficient of humidity expansion of each of the substrates 201 and 211 is preferably lower than or equal to 100 ppm/% RH, further preferably lower than or equal to 50 ppm/% RH, still further preferably lower than or equal to 20 ppm/% RH. The lower the coefficient of humidity expansion of substrate is, the less the display panel is influenced by a humidity change of an environment in which the display panel is stored. For example, even when the humidity of a storage environment is changed, generation of creases in the display panel and a crack in an inorganic film can be suppressed.

<Structure Example 1 of Display Device>

Figure 2A:
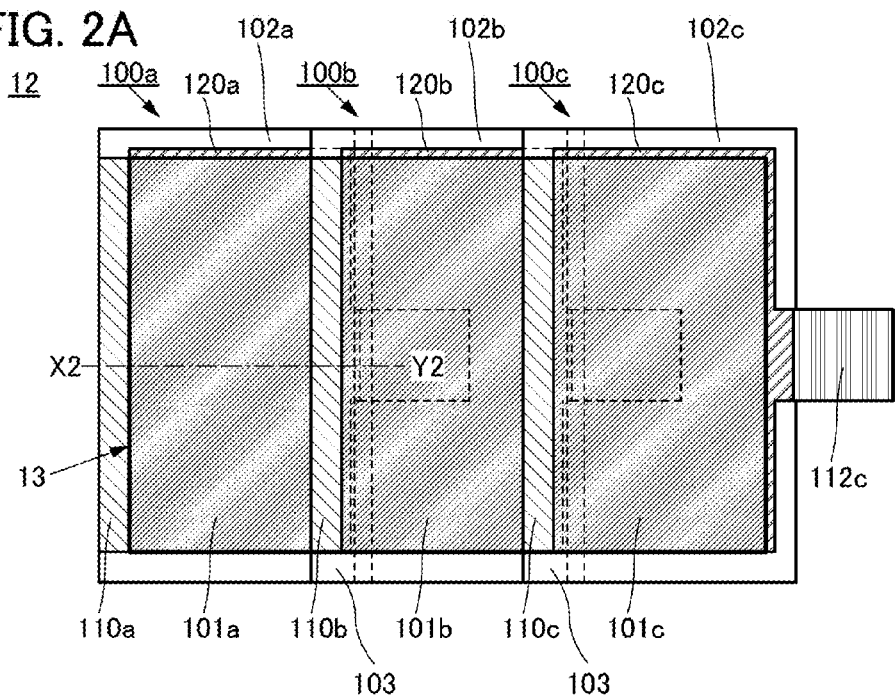
FIGS. 2A and 2B are a top view and a cross-sectional view illustrating an example of a display device.

FIG. 2A is a top view of a display device 12. The display device 12 illustrated in FIG. 2A includes three display panels 100 illustrated in FIG. 1A arranged in one direction (a lateral direction). FIG. 2A illustrates an example where each of the display panels is electrically connected to an FPC.

In this embodiment, to distinguish the display panels from each other, the same components included in the display panels from each other, or the same components relating to the display panels from each other, letters are added to reference numerals in some cases. Unless otherwise specified, "a" is added to reference numerals for a display panel and components placed on the lowest side (the side opposite to the display surface side), and to one or more display panels and components placed thereover, "b", "c", and the like are added in alphabetical order from the lower side. Furthermore, unless otherwise specified, in describing a structure in which a plurality of display panels is included, letters are not added when a common part of the display panels or the components is described.

The display device 12 in FIG. 2A includes a display panel 100a, a display panel 100b, and a display panel 100c.

The display panel 100b is placed so that part of the display panel 100b is stacked over an upper side (a display surface side) of the display panel 100a. Specifically, a region 110b that transmits visible light of the display panel 100b is provided to overlap with a display region 101a of the display panel 100a. A region 120b that blocks visible light of the display panel 100b is provided so as not to overlap with the display region 101a of the display panel 100a. A display region 101b of the display panel 100b is provided to overlap with a region 102a of the display panel 100a and a region 120a that blocks visible light of the display panel 100a.

Similarly, the display panel 100c is placed so as to partly overlap with an upper side (display surface side) of the display panel 100b. Specifically, a region 110c that transmits visible light of the display panel 100c is provided to overlap with the display region 101b of the display panel 100b. A region 120c that blocks visible light of the display panel 100c is provided so as not to overlap with the display region 101b of the display panel 100b. A display region 101c of the display panel 100c is provided to overlap with a region 102b of the display panel 100b and the region 120b that blocks visible light of the display panel 100b.

The region 110b that transmits visible light is provided to overlap with the display region 101a; thus, a user of the display device 12 can see the entire image on the display region 101a even when the display panel 100b overlaps with a display surface of the display panel 100a. Similarly, the region 110c that transmits visible light is provided to overlap with the display region 101b; thus, a user of the display device 12 can see the entire image on the display region 101b even when the display panel 100c overlaps with a display surface of the display panel 100b.

The display region 101b of the display panel 100b overlaps with upper sides of the region 102a and the region 120a that blocks visible light; as a result, a non-display region does not exist between the display region 101a and the display region 101b. Similarly, the display region 101c of the display panel 100c overlaps with upper sides of the region 102b and the region 120b that blocks visible light; as a result, a non-display region does not exist between the display region 101b and the display region 101c. Thus, a region where the display region 101a, the display region 101b, and the display region 101c are placed seamlessly can serve as a display region 13 of the display device 12.

Figure 2B:
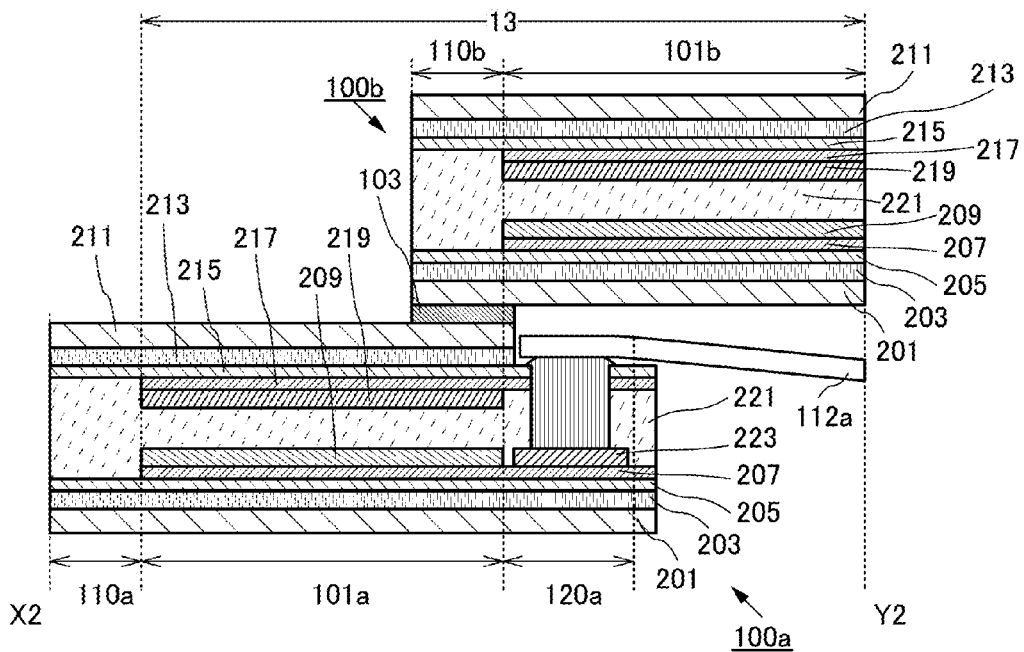

FIG. 2B is a cross-sectional view along dashed-dotted line X2-Y2 in FIG. 2A.

The display panels 100a and 100b illustrated in FIG. 2B each have the same structure as the structure of the display panel illustrated in FIG. 1C.

As described above, in the display panel of one embodiment of the present invention, the reflection of light in the region 110 that transmits visible light is suppressed. Thus, the reflection of external light by the region 110b that transmits visible light is suppressed, and it is possible that an area in which the region 110b that transmits visible light overlaps with the display region 101a (an overlapping area) is less likely to be seen by a user of the display device 12. Moreover, in the display of the display panel 100a, a difference in luminance (brightness) between a portion seen through the region 110b that transmits visible light and a portion seen not through the region can be small.

Furthermore, to reduce the step between two adjacent display panels 100, the thickness of the display panel 100 is preferably small. For example, the thickness of the display panel 100 is preferably less than or equal to 1 mm, further preferably less than or equal to 300 µm, still further preferably less than or equal to 100 µm. The display panel is preferably thin because the thickness or weight of the whole display device can also be reduced.

When air exists between the region that transmits visible light of the upper display panel and the display region of the lower display panel, part of light extracted from the display region is reflected at the interface between the display region and air and the interface between air and the region that transmits visible light, which may result in a decrease in luminance of the display. As a result, the light extraction efficiency of a region in which a plurality of display panels overlap with each other might be decreased. In addition, a difference in luminance of the display region of the lower display panel might occur between a portion overlapping with the region that transmits visible light of the upper display panel and a portion not overlapping with the region that transmits visible light of the upper display panel, so that a seam between the display panels is easily noticed by a user in some cases.

As illustrated in FIG. 2B, the display device 12 includes a light-transmitting layer 103 between the display region 101a and the region 110b that transmits visible light. The light-transmitting layer 103 has a refractive index higher than that of air and transmits visible light. Thus, air can be prevented from entering between the display region 101a and the region 110b that transmits visible light, so that the interface reflection due to a difference in refractive index can be suppressed. In addition, display unevenness or luminance unevenness of the display device can be reduced.

Note that the light-transmitting layer 103 preferably has a high transmittance of visible light because the light extraction efficiency of the display device can be increased. The light-transmitting layer 103 preferably has a light transmittance of higher than or equal to 80% and further preferably higher than or equal to 90% on average at a wavelength greater than or equal to 400 nm and less than or equal to 700 nm.

The difference in refractive index between the light-transmitting layer and a layer in contact with the light-transmitting layer is preferably as small as possible because the light reflection can be suppressed. For example, the refractive index of the light-transmitting layer is higher than that of air, and preferably higher than or equal to 1.3 and lower than or equal to 1.8. The difference in refractive index between the light-transmitting layer and the layer in contact with the light-transmitting layer (e.g., a substrate included in the display panel) is preferably lower than or equal to 0.30, further preferably lower than or equal to 0.20, and still further preferably lower than or equal to 0.15.

It is preferable that the light-transmitting layer be detachably in contact with at least one of the lower display panel and the upper display panel. In the case where the display panels included in the display device are individually detachable, when malfunction occurs in one of the display panels, for example, only the defective display panel can be easily replaced with a new display panel. The continuous use of the other display panel enables the display device to be used longer and at lower cost.

When there is no need to attach and detach the display panels, the display panels are fixed to each other with the light-transmitting layer including a material having an adhesive property (adhesive or the like).

Either of an inorganic material and an organic material can be used for the light-transmitting layer. A liquid substance, a gelatinous substance, or a solid substance can be used for the light-transmitting layer.

For the light-transmitting layer, a liquid substance such as water, a solution, a fluorine-based inactive liquid, a refractive liquid, or silicone oil can be used, for example.

In the case where the display device is inclined to the horizontal plane (a plane perpendicular to a direction in which gravity acts) or in the case where the display device is placed so as to be perpendicular to the horizontal plane, the viscosity of a liquid substance is preferably 1 mPa·s or more, further preferably 1 Pa·s or more, still further preferably 10 Pa·s or more, and yet still further preferably 100 Pa·s or more. In the case where the display device is placed so as to be parallel to the horizontal plane, for example, the viscosity of the liquid substance is not limited thereto.

The light-transmitting layer is preferably inactive because damage to another layer included in the display device can be suppressed, for example.

A material contained in the light-transmitting layer is preferably nonvolatile. Accordingly, entry of air into the interface due to volatilization of a material used for the light-transmitting layer can be suppressed.

For the light-transmitting layer, a high molecular material can be used. For example, a resin such as an epoxy resin, an acrylic resin, a silicone resin, a phenol resin, a polyimide resin, an imide resin, a polyvinyl chloride (PVC) resin, a polyvinyl butyral (PVB) resin, or an ethylene vinyl acetate (EVA) resin can be used. Alternatively, a two-component-mixture-type resin may be used. For example, an adhesive sheet or any of a variety of curable adhesives such as a reactive curable adhesive, a thermosetting adhesive, an anaerobic adhesive, and a photocurable adhesive such as an ultraviolet curable adhesive containing at least one of these resins may be used. The adhesives do not need to be cured in the case where, for example, the display panels are not fixed to each other.

The light-transmitting layer preferably has high self-attachability to an object. In addition, the light-transmitting layer preferably has high separability against an object. After the light-transmitting layer attached to the display panel is separated from the display panel, it is preferable that the light-transmitting layer be able to be attached to the display panel again.

It is preferable that the light-transmitting layer have no adhesiveness or low adhesiveness. In that case, attachment and separation of the light-transmitting layer to and from an object can be repeated without damaging or contaminating a surface of the object.

As the light-transmitting layer, a film having attachability or a film having adhesiveness can be used, for example. In the case where an attachment film having a stacked-layer structure of an attachment layer or an adhesive layer and a base material is used, the attachment layer or the adhesive layer may function as the light-transmitting layer of the display device, and the base material may function as a substrate included in the display panel. Note that the display device may have a substrate in addition to the base material in the attachment film. The attachment film may include an anchor layer between the attachment layer or the adhesive layer and the base material. The anchor layer has a function of enhancing the adhesiveness between the attachment layer or the adhesive layer and the base material. In addition, the anchor layer has a function of smoothing a surface of the base material coated with the attachment layer or the adhesive layer. In this manner, bubbles can be made hardly generated between the object and the light-transmitting layer. A film in which a polyester film and a silicone resin layer having attachability are stacked can be preferably used in the display device, for example.

The thickness of the light-transmitting layer is not particularly limited and may be greater than or equal to 1 μm and less than or equal to 50 μm, for example. The thickness of the light-transmitting layer can be greater than 50 μm; however, in the case of manufacturing a flexible display device, the thickness of the display device is preferably set such that the flexibility of the display device is not reduced. For example, the thickness of the light-transmitting layer is preferably greater than or equal to 10 μm and less than or equal to 30 μm. The thickness of the light-transmitting layer can be less than 1 μm.

The display region 101a overlaps with the region 110b that transmits visible light with the light-transmitting layer 103 provided therebetween. Thus, entry of air between the display region 101a and the region 110b that transmits visible light can be suppressed, so that interface reflection due to a difference in refractive index can be reduced.

Accordingly, a difference in luminance of the display region 101a between a portion overlapping with the region 110b that transmits visible light and a portion not overlapping with the region 110b that transmits visible light can be suppressed, so that a seam between the display panels can be less noticed by a user of the display device. In addition, display unevenness or luminance unevenness of the display device can be suppressed.

The region 120a that blocks visible light and an FPC 112a each overlap with the display region 101b. Thus, a sufficient area of a non-display region can be secured and a seamless display region can be increased in size, so that a highly reliable large display device can be fabricated.

<Example 1 of Method for Manufacturing Display Panel>

An example of a method for manufacturing the display panel illustrated in FIG. 1B is described with reference to FIGS. 3A to 3D and FIGS. 4A to 4C.

Figure 3A:
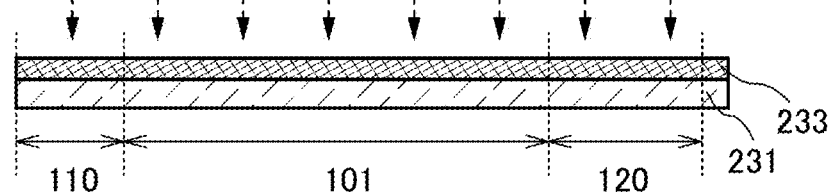
FIGS. 3A to 3D are cross-sectional views illustrating an example of a method for manufacturing a display panel.

First, as illustrated in FIG. 3A, a separation layer 233 is formed over a formation substrate 231. Then, plasma treatment is performed on a surface of the separation layer 233 (see the arrows indicated by dotted lines in FIG. 3A). Note that in this specification, a layer formed over a separation layer may be referred to as a layer to be separated.

As the formation substrate 231, a substrate having at least heat resistance high enough to withstand process temperature in a fabrication process is used. As the formation substrate 231, for example, a glass substrate, a quartz substrate, a sapphire substrate, a semiconductor substrate, a ceramic substrate, a metal substrate, or a plastic substrate can be used.

Note that it is preferable to use a large-sized glass substrate as the formation substrate 231 in terms of productivity. For example, a glass substrate having a size greater than or equal to the 3rd generation (550 mm×650 mm) and less than or equal to the 10th generation (2950 mm×3400 mm) or a glass substrate having a larger size than the 10th generation is preferably used.

In the case where a glass substrate is used as the formation substrate 231, a base film is preferably formed between the formation substrate 231 and the separation layer 233 because contamination from the glass substrate can be prevented. Examples of the base film include insulating films such as a silicon oxide film, a silicon oxynitride film, a silicon nitride film, and a silicon nitride oxide film.

As the separation layer 233, an inorganic material can be used. Examples of the inorganic material include a metal, an alloy, a compound, and the like that contain any of the following elements: tungsten, molybdenum, titanium, tantalum, niobium, nickel, cobalt, zirconium, zinc, ruthenium, rhodium, palladium, osmium, iridium, and silicon. A crystal structure of a layer containing silicon may be amorphous, microcrystal, or polycrystal. The separation layer 233 is preferably formed using a high-melting point metal material such as tungsten, titanium, or molybdenum, in which case the degree of freedom of the process for forming the layer to be separated can be increased.

In the case where the separation layer 233 has a single-layer structure, a tungsten layer, a molybdenum layer, or a layer containing a mixture of tungsten and molybdenum is preferably formed. Note that the mixture of tungsten and molybdenum corresponds to an alloy of tungsten and molybdenum, for example.

The separation layer 233 can be formed by, for example, a sputtering method, a chemical vapor deposition (CVD) method (e.g., a plasma CVD method, a thermal CVD method, or a metal organic CVD (MOCVD) method), an atomic layer deposition (ALD) method, a coating method (e.g., a spin coating method, a droplet discharge method, or a dispensing method), a printing method, or an evaporation method.

The thickness of the separation layer 233 is greater than or equal to 1 nm and less than or equal to 1000 nm, preferably greater than or equal to 1 nm and less than or equal to 200 nm, further preferably greater than or equal to 10 nm and less than or equal to 100 nm.

In the case where the separation layer 233 is formed to have a stacked-layer structure including a layer containing tungsten and a layer containing an oxide of tungsten, the layer containing an oxide of tungsten may be formed as follows: the layer containing tungsten is formed first and an insulating film formed of an oxide is formed thereover, so that the layer containing an oxide of tungsten is formed at the interface between the tungsten layer and the insulating film.

Alternatively, the layer containing an oxide of tungsten may be formed by performing thermal oxidation treatment, oxygen plasma treatment, nitrous oxide ($N_2O$) plasma treatment, treatment with a highly oxidizing solution such as ozone water, or the like on the surface of the layer containing tungsten. Plasma treatment or heat treatment can be performed in an atmosphere of oxygen, nitrogen, or nitrous oxide alone, or a mixed gas of any of these gasses and another gas.

Surface condition of the separation layer 233 is changed by the plasma treatment or heat treatment, whereby adhesion between the separation layer 233 and the insulating film formed later can be controlled. A case where plasma treatment is performed is described in this embodiment as an example.

Plasma treatment is preferably performed under an atmosphere containing nitrous oxide, further preferably under an atmosphere containing nitrous oxide and silane. Thus, an oxide layer of a material included in the separation layer 233 can be formed on the surface of the separation layer 233. In particular, when plasma treatment is performed under an atmosphere containing silane, an oxide layer with a very small thickness can be formed. The oxide layer with an extremely small thickness is not easily observed in a cross-sectional observation image.

The oxide layer contains an oxide of the material contained in the separation layer. In the case where a metal is included in the separation layer 233, the oxide layer contains an oxide of the metal contained in the separation layer 233. The oxide layer preferably contains tungsten oxide, titanium oxide, or molybdenum oxide.

Figure 3B:
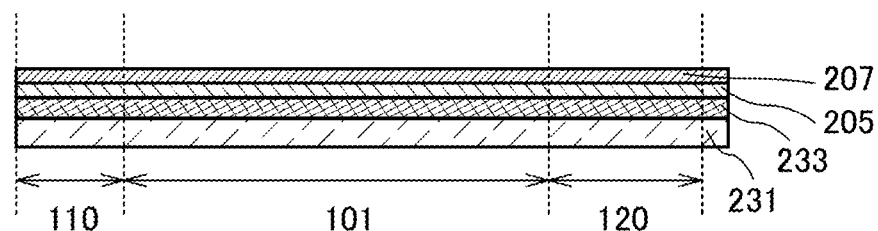

Next, as illustrated in FIG. 3B, the first insulating layer 205 is formed over the separation layer 233, and the second insulating layer 207 is formed over the first insulating layer 205.

Each of the first insulating layer 205 and the second insulating layer 207 can be a single layer or a multilayer using a silicon nitride film, a silicon oxynitride film, a silicon oxide film, a silicon nitride oxide film, or the like.

Note that in this specification, "silicon oxynitride" contains more oxygen than nitrogen. Moreover, in this specification, "silicon nitride oxide" contains more nitrogen than oxygen.

The first insulating layer 205 preferably contains oxygen and silicon. The first insulating layer 205 preferably has a single-layer structure of a silicon oxide film or a silicon oxynitride film.

It is preferable that the first insulating layer 205 further contain hydrogen. The first insulating layer 205 has a function of releasing hydrogen in a later heating step. Hydrogen is released from the first insulating layer 205 by heating, whereby hydrogen is supplied to the oxide layer. The first insulating layer 205 may further have a function of releasing hydrogen and nitrogen in the later heating step. When nitrogen is released from the first insulating layer 205 by heating, nitrogen is supplied to the oxide layer.

The first insulating layer 205 preferably includes a region in which the hydrogen concentration measured by secondary ion mass spectrometry (SIMS) is greater than or equal to $1.0 \times 10^{20}$ atoms/cm$^3$ and less than or equal to $1.0 \times 10^{22}$ atoms/cm$^3$, preferably greater than or equal to $5.0 \times 10^{20}$ atoms/cm$^3$ and less than or equal to $5.0 \times 10^{21}$ atoms/cm$^3$.

The first insulating layer 205 preferably includes a region in which the nitrogen concentration measured by SIMS is greater than or equal to $5.0 \times 10^{20}$ atoms/cm$^3$ and less than or equal to $1.0 \times 10^{23}$ atoms/cm$^3$, further preferably greater than or equal to $1.0 \times 10^{21}$ atoms/cm$^3$ and less than or equal to $5.0 \times 10^{22}$ atoms/cm$^3$.

In particular, for the first insulating layer 205, a silicon oxide film or a silicon oxynitride film is preferably formed by a plasma CVD method using a deposition gas containing a silane gas and a nitrous oxide gas, in which case a large amount of hydrogen and nitrogen can be contained in the film. In addition, the proportion of the silane gas in the deposition gas is preferably higher, in which case the amount of hydrogen released from the film in a later heating step is increased.

The second insulating layer 207 preferably contains nitrogen and silicon. The second insulating layer 207 preferably has a single-layer structure of a silicon nitride film or a silicon nitride oxide film or a stacked-layer structure including a silicon nitride film or a silicon nitride oxide film. In the case where the second insulating layer 207 has a stacked-layer structure, the second insulating layer 207 preferably further includes at least one of a silicon oxide film and a silicon oxynitride film.

The second insulating layer 207 has a function of blocking hydrogen released from the first insulating layer 205 in a later heating step. The second insulating layer 207 may be a film that can block hydrogen and nitrogen. The second insulating layer 207 can suppress supply of the hydrogen (and nitrogen) from the first insulating layer 205 to the element layer. In addition, the hydrogen (and nitrogen) can be supplied to the oxide layer efficiently. Another layer may be provided between the first insulating layer 205 and the second insulating layer 207.

A silicon nitride film included in the second insulating layer 207 is preferably formed by a plasma CVD method using a deposition gas containing a silane gas, a nitrogen gas, and an ammonia gas.

The first insulating layer 205 and the second insulating layer 207 can be formed by a sputtering method, a plasma CVD method, a coating method, a printing method, or the like. For example, each of the first insulating layer 205 and the second insulating layer 207 is formed at a temperature higher than or equal to 250° C. and lower than or equal to 400° C. by a plasma CVD method, whereby each of the first insulating layer 205 and the second insulating layer 207 can be a dense film having an excellent moisture-resistant property. Note that each of the first insulating layer 205 and the second insulating layer 207 is preferably formed to have a thickness of greater than or equal to 10 nm and less than or equal to 3000 nm, further preferably greater than or equal to 200 nm and less than or equal to 1500 nm.

Next, the separation layer 233, the first insulating layer 205, and the second insulating layer 207 are heated. Note that the heat treatment may be performed after at least part of the element layer 209 is formed. For example, the heat treatment may be performed after the transistor is formed and before the display element is formed. In the case where a heating step is included in the process for fabricating the element layer 209, the heating step may serve as the heat treatment.

By the heat treatment, hydrogen (and nitrogen) is released from the first insulating layer 205 to be supplied to the oxide layer. At this time, the second insulating layer 207 blocks the released hydrogen (and nitrogen); thus, hydrogen (and nitrogen) can be efficiently supplied to the oxide layer.

The oxide in the oxide layer is reduced by hydrogen supplied to the oxide layer, so that plural kinds of oxides with different proportions of oxygen are mixed in the oxide layer. For example, in the case where tungsten is included in the separation layer, $WO_3$ formed by plasma treatment is reduced to generate $WO_x$ ($2<x<3$) and $WO_2$ with proportion of oxygen lower than that of $WO_3$, leading to a state where $WO_3$ and the oxides with lower proportions of oxygen are mixed. The crystal structure of such a mixed metal oxide depends on the proportion of oxygen; thus, the mechanical strength of the oxide layer is reduced. As a result, the oxide layer is likely to be damaged inside; thus, the separability in a later separation step can be improved.

In addition, a compound containing nitrogen and a material in the separation layer is generated by supplying nitrogen to the oxide layer. Such a compound further reduces the mechanical strength of the oxide layer, so that the separability can be increased. In the case where a metal is included in the separation layer, a compound (a metal nitride) containing the metal and nitrogen is generated in the oxide layer. For example, in the case where tungsten is included in the separation layer, tungsten nitride is generated in the oxide layer.

As the amount of hydrogen supplied to the oxide layer is larger, $WO_3$ is more likely to be reduced, which facilitates the formation of the state where plural kinds of oxides with different proportions of oxygen are mixed in the oxide layer. Therefore, the force required for the separation can be reduced. As the amount of nitrogen supplied to the oxide layer is larger, the mechanical strength of the oxide layer can be reduced and the force required for the separation can be reduced. The thickness of the first insulating layer 205 is preferably large for increase in the amount of released hydrogen (and nitrogen). On the other hand, it is preferable that the first insulating layer 205 has a small thickness because the productivity is increased.

The heat treatment may be performed at a temperature higher than or equal to the temperature at which hydrogen (and nitrogen) is released from the first insulating layer 205 and lower than or equal to the temperature at which the formation substrate 231 is softened. The heating is preferably performed at a temperature greater than or equal to the temperature at which the reduction of the metal oxide in the oxide layer with hydrogen occurs. The higher the temperature of the heat treatment is, the more hydrogen (and nitrogen) is released from the first insulating layer 205; thus, the separability can be improved in later steps. Note that depending on heating time and heating temperature, the separability is unnecessarily increased so that separation occurs at an unintended timing. Thus, in the case where tungsten is used for the separation layer 233, the heating temperature is higher than or equal to 300° C. and less than 700° C., preferably higher than or equal to 400° C. and less than 650° C., further preferably higher than or equal to 400° C. and less than or equal to 500° C.

Although the atmosphere in which the heat treatment is performed is not particularly limited and may be an air atmosphere, it is preferably performed in an inert gas atmosphere such as a nitrogen atmosphere or a rare gas atmosphere.

Figure 3C:
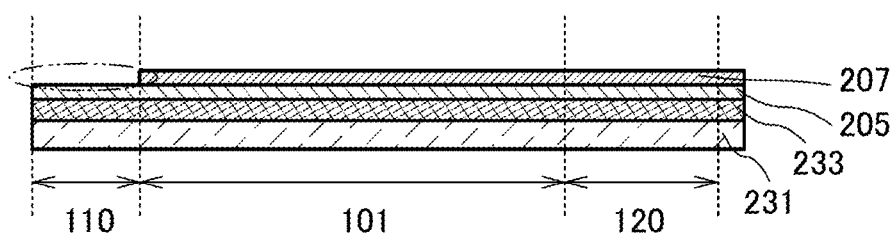

Next, as illustrated in FIG. 3C, the second insulating layer 207 in the region 110 that transmits visible light is removed. The second insulating layer 207 may be removed by a dry etching method, a wet etching method, or the like. Note that any of etching steps included in the fabrication processes of the element layer 209 and the insulating layer 208, or the like may serve as the removal step of the second insulating layer 207.

In one embodiment of the present invention, the second insulating layer 207 is provided over the entire surface of the separation layer 233 until the heat treatment is performed. After the heat treatment, the second insulating layer 207 in the region 110 that transmits visible light is removed. Accordingly, the separability in the region 110 that transmits visible light can be prevented from being lower than that in the other region. Thus, the separability of the entire display panel can be uniform. An influence of the structure of the region 110 that transmits visible light on the yield of the fabrication process of the display panel can be suppressed.

Figure 3D:
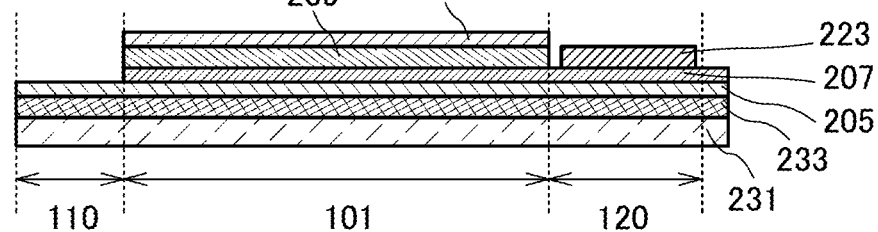

Next, as illustrated in FIG. 3D, the element layer 209, the insulating layer 208, and the connection terminal 223 are formed over the second insulating layer 207. The insulating layer 208 is formed to cover the display element included in the element layer 209. It is preferable that an insulating layer included in the element layer 209 and the insulating layer 208 not be included in the region 110 that transmits visible light.

Figure 4A:
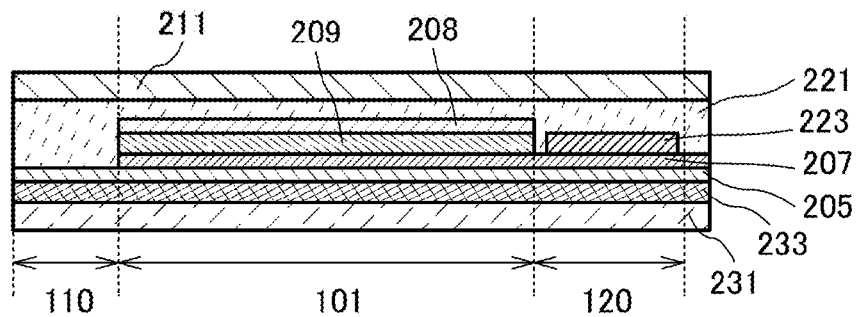
FIGS. 4A to 4C are cross-sectional views illustrating an example of a method for manufacturing a display panel.

Next, the formation substrate 231 and the substrate 211 are attached to each other by the bonding layer 221 (see FIG. 4A).

As the substrate 211, various substrates that can be used as the formation substrate 231 can be used. A flexible substrate may be used. Alternatively, as the substrate 211, a substrate provided with a functional element such as a semiconductor element (e.g., a transistor), a light-emitting element (e.g., an organic EL element), a liquid crystal element, or a sensor element, a color filter, and the like in advance may be used.

As the bonding layer 221, a variety of curable adhesives such as a photocurable adhesive (e.g., an ultraviolet curable adhesive), a reactive curable adhesive, a thermosetting adhesive, and an anaerobic adhesive can be used. Alternatively, as the bonding layer 221, an adhesive with which the substrate 211 and the first insulating layer 205 can be separated when necessary, such as a water-soluble resin, a resin soluble in an organic solvent, a resin that is capable of being plasticized upon irradiation with UV light, or the like may be used.

Figure 4B:
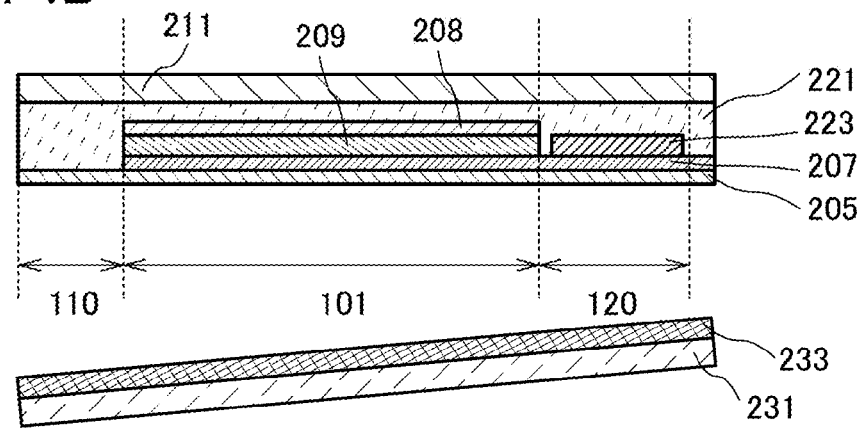

Then, the separation layer 233 is separated from the first insulating layer 205 (FIG. 4B).

For the separation, for example, the formation substrate 231 or the substrate 211 is fixed to a suction stage and a separation starting point is formed between the separation layer 233 and the first insulating layer 205. The separation starting point may be formed by, for example, inserting a sharp instrument such as a knife between the layers. Alternatively, the separation starting point may be formed by irradiating part of the separation layer 233 with laser light to melt the part of the separation layer 233. The separation starting point may be formed by dripping liquid (e.g., alcohol, water, or water containing carbon dioxide) onto an end portion of the separation layer 233 and the first insulating layer 205 so that the liquid penetrates into an interface between the separation layer 233 and the first insulating layer 205 by using capillary action.

Then, physical force (a separation process with a human hand or with a gripper, a separation process by rotation of a roller, or the like) is gently applied to the area where the separation starting point is formed in a direction substantially perpendicular to the bonded surfaces, so that separation can be caused without damage to the layer to be separated. For example, separation may be caused by attaching tape or the like to the formation substrate 231 or the substrate 211 and pulling the tape in the aforementioned direction, or separation may be caused by pulling an end portion of the formation substrate 231 or the substrate 211 with a hook-like member. Alternatively, separation may be caused by pulling an adhesive member or a member capable of vacuum suction attached to the back side of the formation substrate 231 or the substrate 211.

Here, if separation is performed in such a manner that liquid containing water such as water or an aqueous solution is added to the separation interface and the liquid penetrates into the separation interface, the separability can be improved. Furthermore, an adverse effect of static electricity caused at separation on the functional element included in the layer to be separated (e.g., damage to a semiconductor element from static electricity) can be suppressed.

By the above method, the layer to be separated can be separated from the formation substrate 231 with a high yield.

Figure 4C:
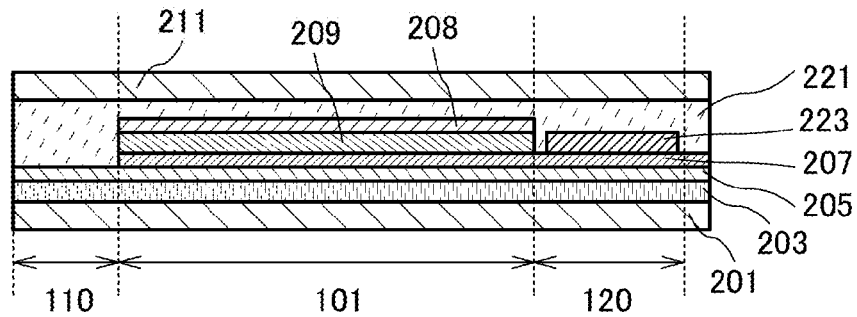

After that, the substrate 201 is attached to the first insulating layer 205 with the bonding layer 203 inserted between (FIG. 4C). The bonding layer 203 can be formed using a material for the bonding layer 221. The substrate 201 can be formed using a material for the substrate 211.

By using flexible substrates as the substrates 201 and 211, a flexible display panel can be fabricated. Note that in the case where the substrate 211 functions as a temporary supporting substrate, the substrate 211 and the layer to be separated are separated from each other, and the separated layer may be attached to another substrate (for example, a flexible substrate).

As described above, in the method for manufacturing a display panel of one embodiment of the present invention, the heat treatment is performed while the first insulating layer 205 and the second insulating layer 207 are formed over the entire surface of the separation layer 233; thus, the separability of the entire display panel can be uniformly increased. Furthermore, the second insulating layer 207 in the region 110 that transmits visible light is removed after the heat treatment, so that the reflectance in the region 110 that transmits visible light can be reduced.

Moreover, in the method for manufacturing a display panel of one embodiment of the present invention, a functional element is formed over a formation substrate, separated from the formation substrate, and then transferred to another substrate. Thus, there is almost no limitation on the temperature in formation steps of a functional element. Thus, a functional element with extremely high reliability that is manufactured through a high-temperature process can be manufactured over a flexible substrate with poor heat resistance with a high yield. Thus, a highly reliable flexible display panel can be obtained.

<Example 2 of Method for Manufacturing Display Panel>

An example of a method for manufacturing the display panel illustrated in FIG. 1C is described with reference to FIGS. 5A to 5F and FIGS. 6A to 6C. Note that a detailed description of portions similar to those in Example 1 of a method for manufacturing a display panel is omitted.

Figure 5A:
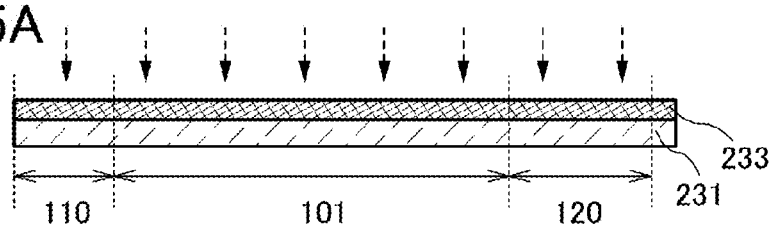
FIGS. 5A to 5F are cross-sectional views illustrating an example of a method for manufacturing a display panel.

First, as illustrated in FIG. 5A, the separation layer 233 is formed over the formation substrate 231. Then, plasma treatment is performed on a surface of the separation layer 233 (see the arrows indicated by dotted lines in FIG. 5A).

Figure 5B:
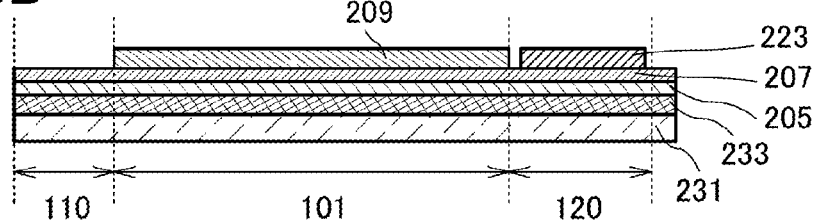

Next, as illustrated in FIG. 5B, the first insulating layer 205 is formed over the separation layer 233, the second insulating layer 207 is formed over the first insulating layer 205, and the element layer 209 and the connection terminal 223 are formed over the second insulating layer 207.

Note that heat treatment is performed after the second insulating layer 207 is formed and before part of the second insulating layer 207 is removed. The separation layer 233, the first insulating layer 205, and the second insulating layer 207 may be heated before the element layer 209 and the connection terminal 223 are formed. Alternatively, the heat treatment may be performed after at least part of the element layer 209 is formed. For example, the heat treatment may be performed after the transistor is formed and before the display element is formed. In the case where the process for fabricating the element layer 209 includes a heating step, the heating step may serve as the heat treatment.

By the heat treatment, the separability in a later separation step can be improved.

Figure 5C:
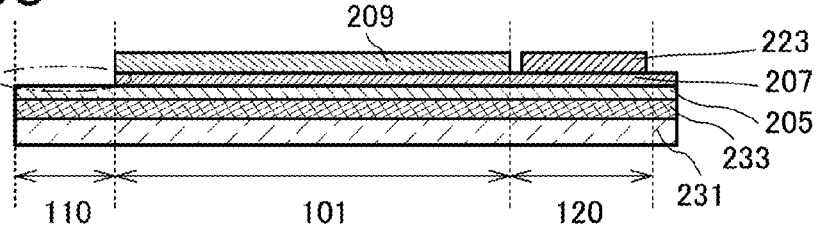

Next, as illustrated in FIG. 5C, the second insulating layer 207 in the region 110 that transmits visible light is removed. The second insulating layer 207 may be removed by a dry etching method, a wet etching, or the like. Note that any of etching steps included in the fabrication process of the element layer 209 may serve as the removal step of the second insulating layer 207.

In one embodiment of the present invention, the second insulating layer 207 is provided over the entire surface of the separation layer 233 until the heat treatment is performed. After the heat treatment, the second insulating layer 207 in the region 110 that transmits visible light is removed. Accordingly, the separability of the entire display panel can be uniform. An influence of the structure of the region 110 that transmits visible light on the yield of the fabrication process of the display panel can be suppressed.

Figure 5D:
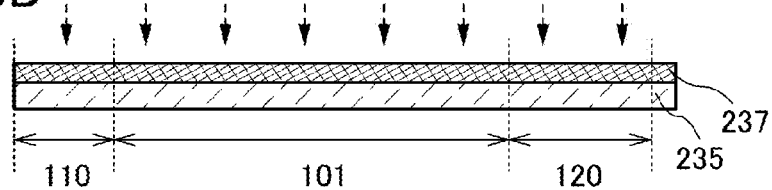

As illustrated in FIG. 5D, a separation layer 237 is formed over a formation substrate 235. Then, plasma treatment is performed on a surface of the separation layer 237 (see the arrows indicated by dotted lines in FIG. 5D).

Figure 5E:
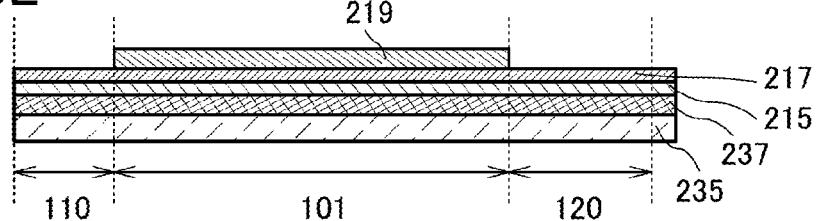

Next, as illustrated in FIG. 5E, the third insulating layer 215 is formed over the separation layer 237, the fourth insulating layer 217 is formed over the third insulating layer 215, and the functional layer 219 is formed over the fourth insulating layer 217.

Note that heat treatment is performed after the fourth insulating layer 217 is formed and before part of the fourth insulating layer 217 is removed. The separation layer 237, the third insulating layer 215, and the fourth insulating layer 217 may be heated before the functional layer 219 is formed. Alternatively, the heat treatment may be performed after at least part of the functional layer 219 is formed. In the case where the process for fabricating the functional layer 219 includes a heating step, the heating step may serve as the heat treatment.

By the heat treatment, the separability in a later separation step can be improved.

Figure 5F:
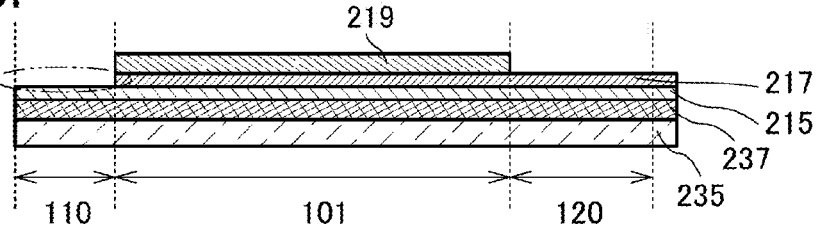

Next, as illustrated in FIG. 5F, the fourth insulating layer 217 in the region 110 that transmits visible light is removed. The fourth insulating layer 217 may be removed by a dry etching method, a wet etching, or the like. Note that any of etching steps included in the fabrication process of the functional layer 219 may serve as the removal step of the fourth insulating layer 217.

In one embodiment of the present invention, the fourth insulating layer 217 is provided over the entire surface of the separation layer 237 until the heat treatment is performed. After the heat treatment, the fourth insulating layer 217 in the region 110 that transmits visible light is removed. Accordingly, the separability of the entire display panel can be uniform. An influence of the structure of the region 110 that transmits visible light on the yield of the fabrication process of the display panel can be suppressed.

Figure 6A:
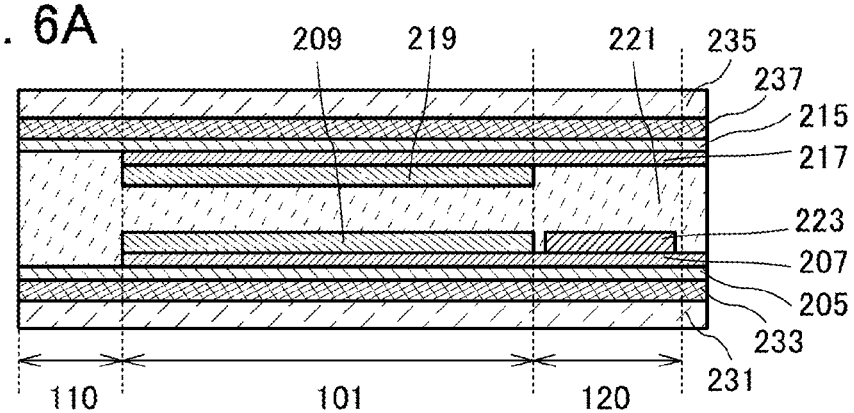
FIGS. 6A to 6C are cross-sectional views illustrating an example of a method for manufacturing a display panel.

Next, the formation substrate 231 and the formation substrate 235 are attached to each other by the bonding layer 221 (see FIG. 6A).

Figure 6B:
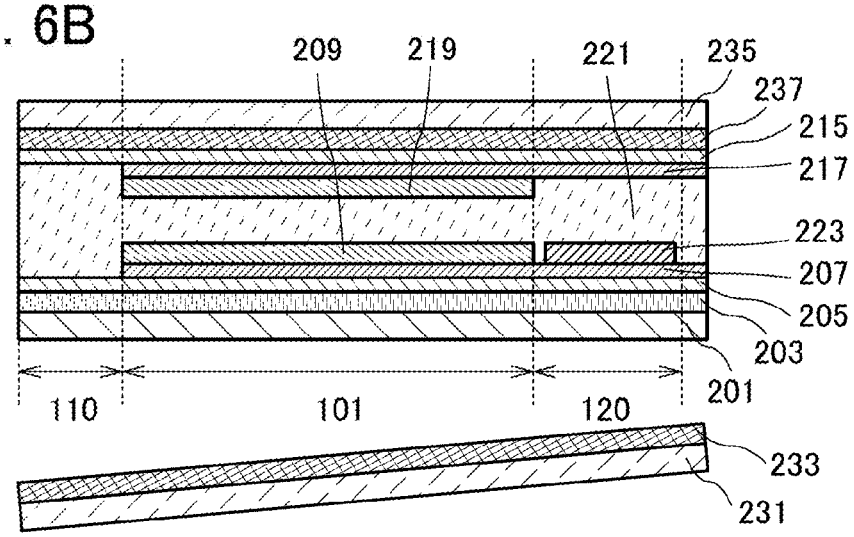

Then, the separation layer 233 and the first insulating layer 205 are separated. After that, the substrate 201 is attached to the first insulating layer 205 with the bonding layer 203 inserted between (FIG. 6B).

Figure 6C:
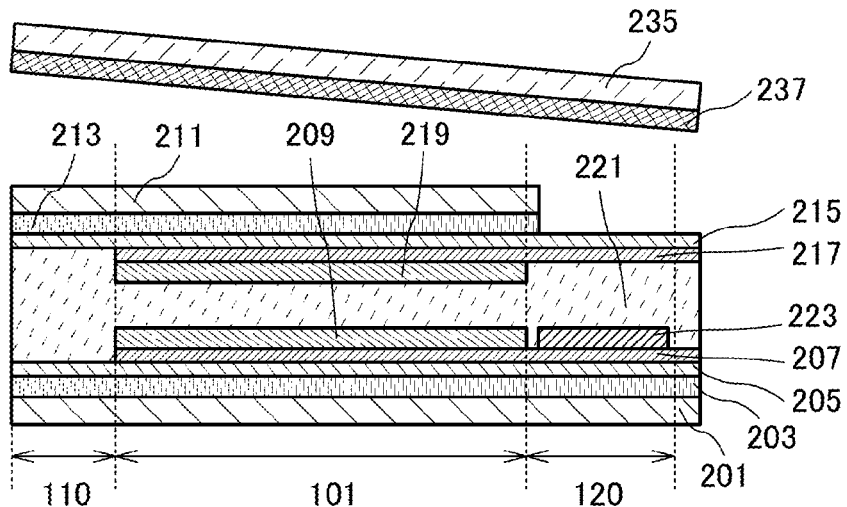

Similarly, the separation layer 237 and the third insulating layer 215 are separated. After that, the substrate 211 is attached to the third insulating layer 215 with the bonding layer 213 inserted between (FIG. 6C).

By using flexible substrates as the substrates 201 and 211, a flexible display panel can be fabricated.

Either the formation substrate 231 or the formation substrate 235 may be separated first.

Then, parts of the insulating layers and the bonding layer that overlap with the connection terminal 223, and the like are removed to expose the connection terminal 223, so that the display panel illustrated in FIG. 1C can be fabricated.

As described above, in the method for manufacturing a display panel of one embodiment of the present invention, the heat treatment is performed while the first insulating layer 205 and the second insulating layer 207 are formed over the entire surface of the separation layer 233. Similarly, the heat treatment is performed while the third insulating layer 215 and the fourth insulating layer 217 are formed over the entire surface of the separation layer 237. Thus, the separability of the entire display panel can be uniformly increased. Furthermore, the second insulating layer 207 and the fourth insulating layer 217 in the region 110 that transmits visible light are each removed after the heat treatment, so that the reflectance in the region 110 that transmits visible light can be reduced.

In one embodiment of the present invention, the display region and the region that transmits visible light have separation interfaces between the same components, so that the yield of the separation can be increased. Note that although this embodiment shows an example in which the separation is performed at the interface between the separation layer and the insulating layer that are formed using inorganic materials, one embodiment of the present invention is not limited thereto, and a variety of separation methods can be used. For example, the separation layer or the insulating layer may be formed using an organic material.

Furthermore, in the method for manufacturing a display panel of one embodiment of the present invention, each of the functional elements and the like included in the display panel is formed over the formation substrate; thus, even in the case where a high-resolution display panel is manufactured, high alignment accuracy of the substrate included in the display panel is not required. Thus, even when a flexible substrate is used for the display panel, the substrate can be attached easily. In addition, since the functional element and the like can be fabricated with high temperatures, a highly reliable display panel can be obtained.

<Structure Example 2 of Display Device>

Figure 7A:
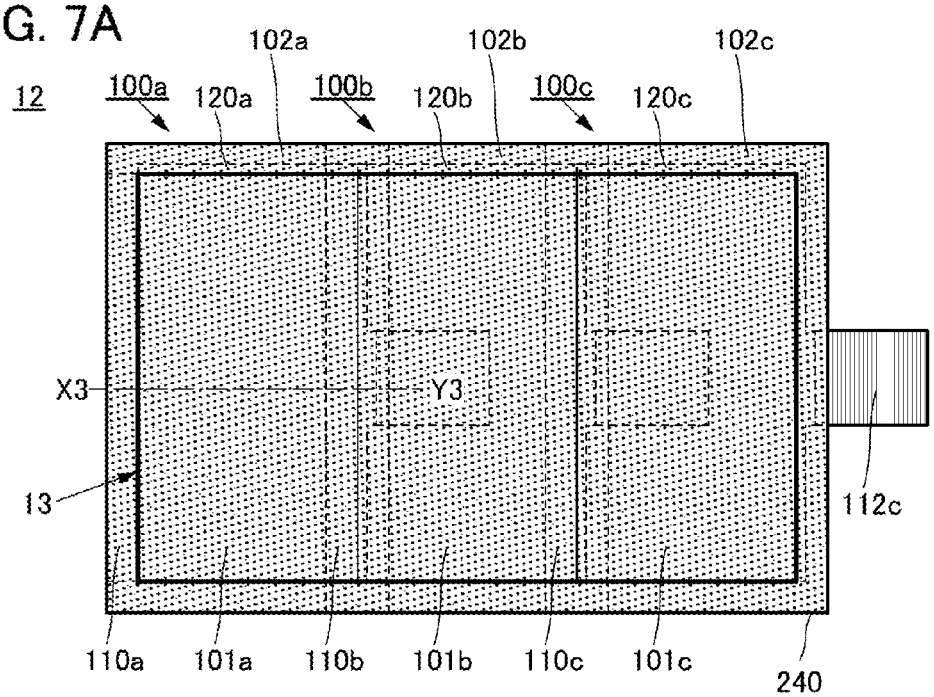
FIGS. 7A and 7B are a top view and a cross-sectional view illustrating an example of a display device.
Figure 7B:
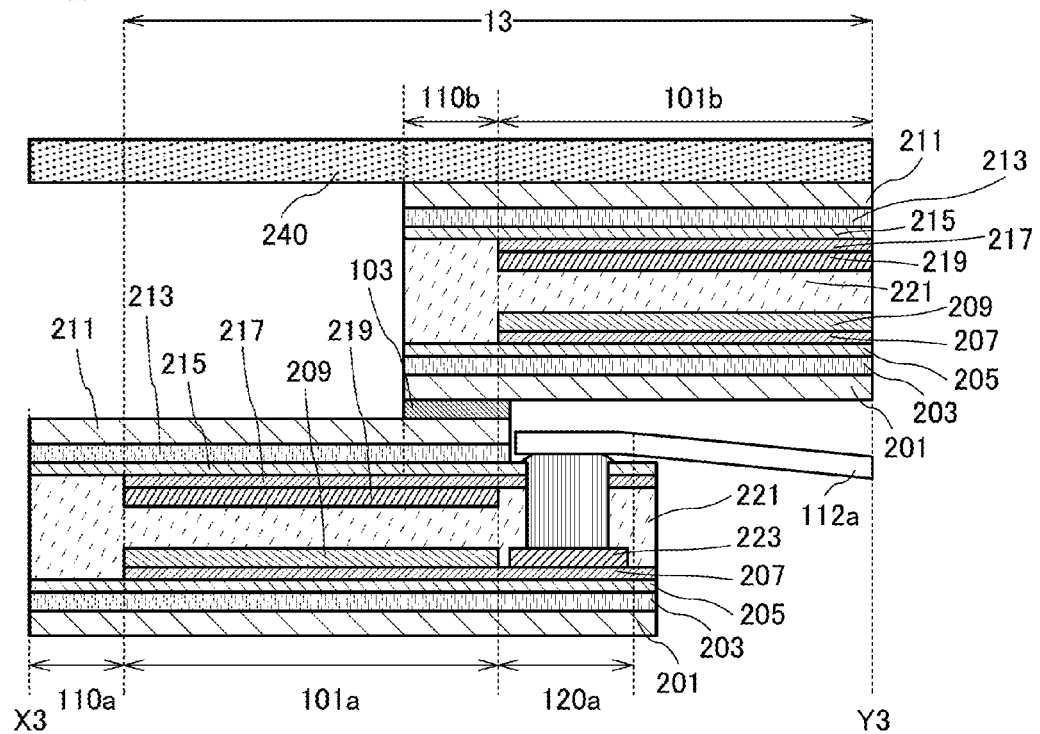

FIG. 7A is a top view of the display device 12. FIG. 7B is a cross-sectional view taken along dashed-dotted line X3-Y3 in FIG. 7A.

The display device 12 illustrated in FIGS. 7A and 7B has a structure in which an optical member 240 is placed on the outermost surface of the display device 12 illustrated in FIGS. 2A and 2B. Other components are similar to those in FIGS. 2A and 2B; thus, the detailed description thereof is omitted.

The optical member 240 is provided at least in the display region 13. FIG. 7A illustrates an example in which the optical member 240 overlaps with the entire areas of display panels. The optical member 240 and each of the display panels are preferably adhered closely. At least parts of the optical member 240 and each of the display panels may be fixed with an adhesive or the like, and the optical member 240 and each of the display panels are not necessarily fixed. For example, the optical member 240 and each of the display panels may be independently fixed to a housing included in the display device 12 or an electronic device.

As the optical member 240, one or more of a polarizing member, a retardation member, an anti-reflection member, and the like can be used. Moreover, hard coat treatment may be performed on the outermost surface of the optical member 240.

Examples of the polarizing member include a polarizing plate and a polarizing film.

Examples of the retardation member include a retardation plate and a retardation film.

Examples of the anti-reflection member include an anti-reflection (AR) film, a low-reflection (LR) film, and an anti-glare (AG) film (also referred to as a non-glare film). Furthermore, an anti-reflection plate and an anti-reflection film that each have the same function as that of any of these films are also examples of the anti-reflection member.

Examples of the structure of the optical member 240 are described with reference to FIGS. 8A to 8G.

Figure 8A:
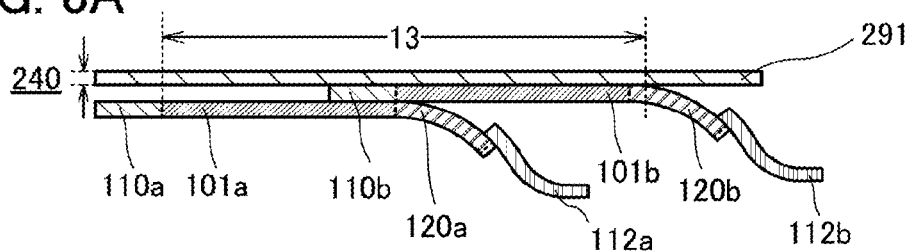
FIGS. 8A to 8G are cross-sectional views illustrating examples of a display device and examples of an optical member.

The optical member 240 illustrated in FIG. 8A includes an anti-reflection member 291.

Each of an AR film, an LR film, an AG film, and the like can be directly attached to the display panels.

When an AR film or an LR film is used for the anti-reflection member 291, the reflection of external light from a surface of the display device 12 can be suppressed.

When an AG film is used for the anti-reflection member 291, reflection of surroundings of the display device 12 on the surface of the display device can be suppressed by scattering external light.

Figure 8B:
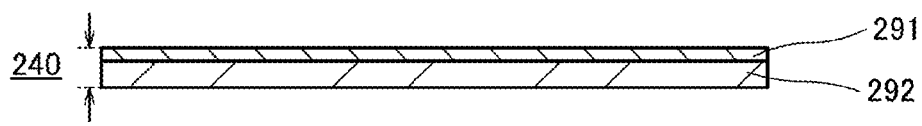

The optical member 240 illustrated in FIG. 8B includes the anti-reflection member 291 and a support member 292. The support member 292 is arranged closer to the display panel than the anti-reflection member 291 is.

The optical member 240 preferably has a structure in which at least one or more of a polarizing member, a retardation member, an anti-reflection member, and the like is/are attached to the support member 292 that transmits visible light.

Overlapping a plurality of display panels with each other causes a step between the display panels. Thus, in the case where one optical member 240 is attached to a plurality of display panels, air is likely to enter the interface between the optical member 240 and the display panels. Moreover, by attaching one optical member 240 to a plurality of display panels, the display panels cannot be detached in some cases. In the case where the optical members 240 are attached to the display panels one by one, effort is required, and thus manufacturing time might be increased.

The use of the support member 292 can increase the strength of the optical member 240, increase the thickness of the optical member 240, or facilitate the handling of the optical member 240, for example. Thus, the optical member 240 can be sufficiently closely attached to the display panels, and the amount of air at the interface between the optical member 240 and the display panel can be minimized. Steps between the plurality of display panels and creases of the display panels can be reduced by attaching the optical member 240 to the display panels sufficiently closely. The optical member 240 and the display panels are preferably fixed to be sufficiently closely attached to each other. The number of points for fixing the optical member 240 and the display panels is as small as possible; accordingly, the fabrication process of the display device can be simplified and the yield of the display device can be improved.

As the support member 292, for example, a plastic plate such as an acrylic plate or a polycarbonate plate, a glass plate, or the like can be used.

Figure 8C:
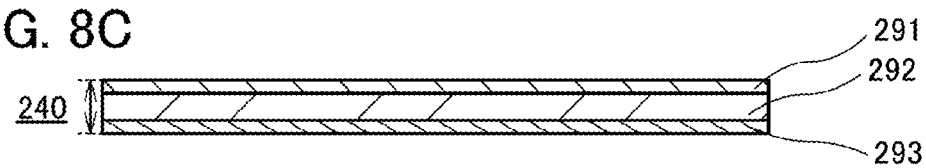

The optical member 240 illustrated in FIG. 8C includes the anti-reflection member 291, an anti-reflection member 293, and the support member 292. A layer that is positioned closest to the display panel is the anti-reflection member 293, and a layer that is positioned farthest from the display panel is the anti-reflection member 291.

When an AR film is used for the anti-reflection member 291, the reflection of external light from a surface of the display device can be reduced. Alternatively, when an AG film is used for the anti-reflection member 291, reflection of surroundings of the display device on the surface of the display device can be suppressed by scattering external light.

There is air between the optical member 240 and the display panels. When an AR film is used for the anti-reflection member 293, the reflection of light between the optical member 240 and the air can be suppressed.

Alternatively, when an AG film is used for the anti-reflection member 293, reflection of surroundings can be suppressed, and a user of the display device can see display easily.

Figure 8D:
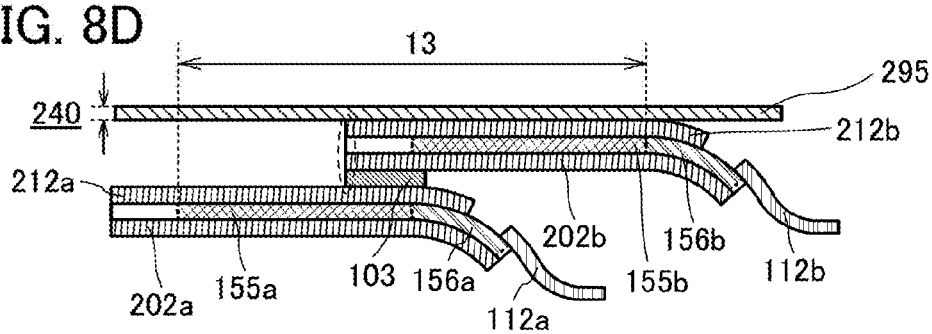

FIG. 8D illustrates an example in which a circular polarizer 295 is used as the optical member 240.

The circular polarizer 295 includes a linear polarizing plate and a retardation plate. The linear polarizing plate includes, for example, a linear polarizing layer between a pair of substrates. As an example of a retardation plate, a quarter-wave plate or the like can be given. The linear polarizing plate and the retardation plate are attached to each other by a bonding layer.

With the use of the circular polarizer, a user of the display device can be prevented from noticing an overlapping area because of the reflection of light from surfaces of the display panels and in the display panels.

As illustrated in FIG. 8D, the circular polarizer 295 preferably overlaps with a plurality of display panels. This structure can prevent a user of the display device from noticing a seam between display regions because of the reflection of light from a side surface of the display panel (see a portion surrounded by a dotted line in FIG. 8D).

When the circular polarizer is used as the optical member 240, a highly optically isotropic substrate can be used as substrates included in the display panels.

FIG. 8D illustrates an example in which a lower display panel includes a substrate 202a and a substrate 212a that are highly optically isotropic and an upper display panel includes a substrate 202b and a substrate 212b that are highly optically isotropic. A region 155a including a display element and a region 156a including a wiring electrically connected to the display element are provided between the substrates 202a and 212a. Similarly, a region 155b including a display element and a region 156b including a wiring electrically connected to the display element are provided between the substrates 202b and 212b.

A highly optically isotropic substrate has a low birefringence (in other words, a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of a highly optically isotropic film include a triacetyl cellulose (TAC, also referred to as cellulose triacetate) film, a cycloolefin polymer (COP) film, a cycloolefin copolymer (COC) film, and an acrylic film.

Figure 8E:
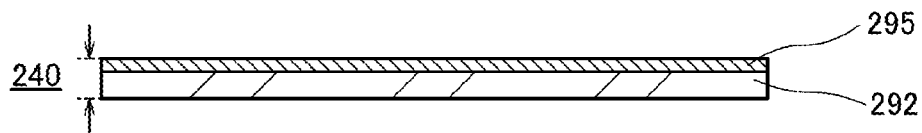

The optical member 240 illustrated in FIG. 8E includes the circular polarizer 295 and the support member 292. Either the support member 292 or the circular polarizer 295 may be closer to the display panel. When the support member 292 is arranged closer to the display panel than the circular polarizer 295 is, the support member 292 is preferably highly optically isotropic. When the circular polarizer 295 is arranged closer to the display panel than the support member 292 is, the support member 292 does not necessarily need to be optically isotropic; thus, the range of choices for the material that can be used for the support member 292 is widened.

Figure 8F:
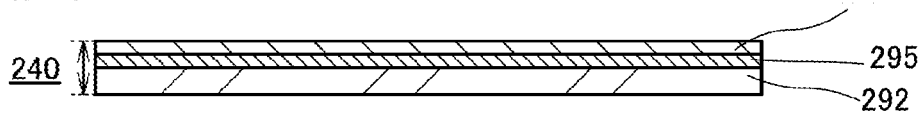
Figure 8G:
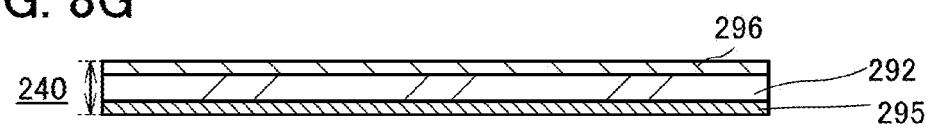

The optical member 240 illustrated in each of FIGS. 8F and 8G includes the circular polarizer 295, an anti-reflection member 296, and the support member 292. In the optical member 240 illustrated in FIG. 8F, a layer that is positioned closest to the display panel is the support member 292, and a layer that is positioned farthest from the display panel is the anti-reflection member 296. In the optical member 240 illustrated in FIG. 8G, a layer that is positioned closest to the display panel is the circular polarizer 295, and a layer that is positioned farthest from the display panel is the anti-reflection member 296.

An AR film is preferably used for the anti-reflection member 296. With this film, the reflection of external light from a surface of the display device can be reduced.

<Structural Example 2 of Display Panel>

Figure 9A:
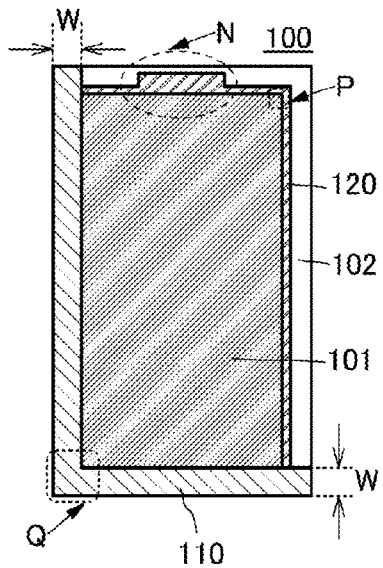
FIGS. 9A to 9E are top views illustrating examples of a display panel and perspective views illustrating an example of a display device.
Figure 9B:
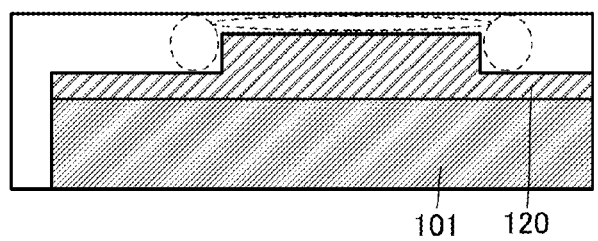

FIG. 9A is a top view of the display panel 100. FIG. 9B is an enlarged view of a region N surrounded by a dotted line in FIG. 9A.

The display panel 100 includes the display region 101 and the region 102. The region 102 includes the region 110 that transmits visible light and the region 120 that blocks visible light. The region 110 that transmits visible light and the region 120 that blocks visible light are each adjacent to the display region 101. In the display panel 100 in FIG. 9A, the region 110 that transmits visible light is provided along two sides of the display region 101. The width W of the region 110 that transmits visible light along one side of the display region 101 may be the same as or different from the width W of the region 110 that transmits visible light along the other side. FIG. 9A illustrates an example in which the widths are the same.

Figure 9C:
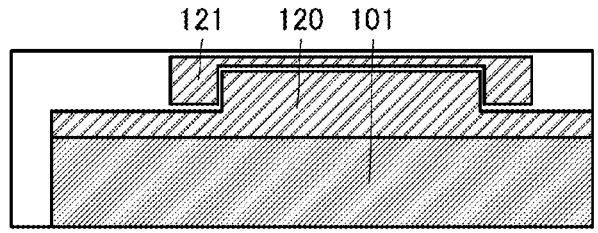

When the heat resistance of the substrate is low, the substrate may be deformed by heat in pressure bonding of an FPC. For example, a wiring is not provided in a portion surrounded by a dotted line in FIG. 9B, and thus when a pressure bond head is in contact with the portion, creases are likely to occur in the display panel. Therefore, as illustrated in FIG. 9C, a dummy wiring 121 is preferably formed near the region to which an FPC is bonded with pressure. By arranging the dummy wiring 121 in the region with which the pressure bond head is in contact, generation of creases on the display panel can be suppressed. The dummy wiring 121 is preferably formed using the same material and in the same step as those of the conductive layer included in the display panel. Thus, an increase in the number of fabrication steps due to the formation of the dummy wiring 121 can be prevented.

<Structure Example 3 of Display Device>

Figure 9D:
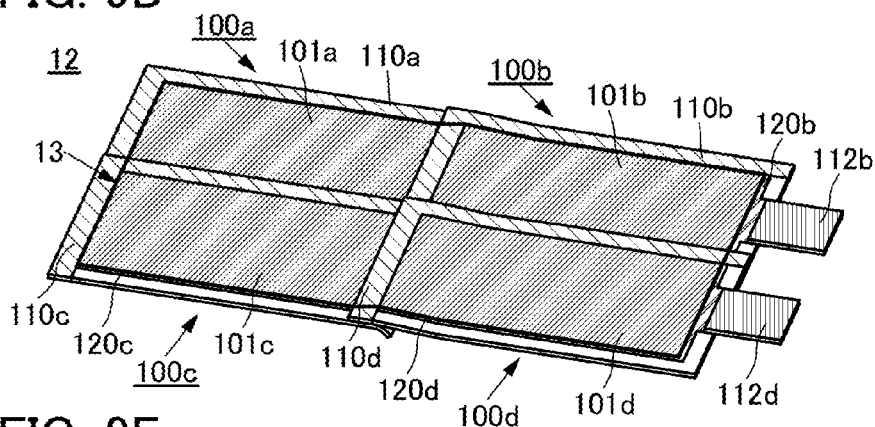
Figure 9E:
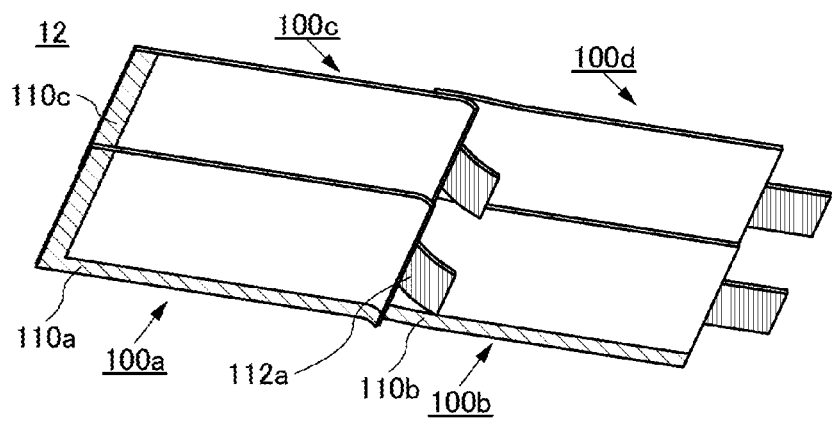

FIGS. 9D and 9E are perspective views of the display device 12 different from that in FIG. 2A. The display device 12 in FIGS. 9D and 9E includes four display panels 100 illustrated in FIG. 9A arranged in a 2×2 matrix (two display panels in the longitudinal direction and the lateral direction). FIG. 9D is a perspective view of the display device 12 on the display surface side. FIG. 9E is a perspective view of the display device 12 on the side opposite to the display surface side.

FIGS. 9D and 9E illustrate examples where each of the display panels is electrically connected to an FPC.

The display device 12 illustrated in FIGS. 9D and 9E includes the display panel 100a, the display panel 100b, the display panel 100c, and a display panel 100d.

In FIGS. 9D and 9E, short sides of the display panels 100a and 100b overlap with each other such that part of the display region 101a and part of the region 110b that transmits visible light overlap with each other. Furthermore, long sides of the display panels 100a and 100c overlap with each other such that part of the display region 101a and part of the region 110c that transmits visible light overlap with each other.

In FIGS. 9D and 9E, part of the display region 101b overlaps with part of the region 110c that transmits visible light and part of a region 110d that transmits visible light. In addition, part of the display region 101c overlaps with part of the region 110d that transmits visible light.

Thus, as illustrated in FIG. 9D, a region where the display region 101a, the display region 101b, the display region 101c, and a display region 101d are placed seamlessly can serve as the display region 13 of the display device 12.

In the center portion of the display device 12, the display panel 100b is stacked over the display panel 100a, the display panel 100c is stacked over the display panel 100b, and the display panel 100d is stacked over the display panel 100c.

Here, it is preferable that the display panel 100 have flexibility. For example, a pair of substrates included in the display panel 100 preferably has flexibility.

Thus, as illustrated in FIGS. 9D and 9E, a region near the FPC 112a of the display panel 100a can be bent so that part of the display panel 100a and part of the FPC 112a can be placed under the display region 101b of the display panel 100b adjacent to the FPC 112a. As a result, the FPC 112a can be placed without physical interference with the rear surface of the display panel 100b. Furthermore, when the display panel 100a and the display panel 100b overlap with each other and are fixed, it is not necessary to consider the thickness of the FPC 112a; thus, the top surface of the region 110b that transmits visible light and the top surface of the display panel 100a can be substantially leveled. This can make an end portion of the display panel 100b over the display region 101a less noticeable.

Moreover, each display panel 100 is made flexible, in which case the display panel 100b can be curved gently so that the top surface of the display region 101b of the display panel 100b and the top surface of the display region 101a of the display panel 100a are leveled. Thus, the display regions can be leveled except the vicinity of a region where the display panel 100a and the display panel 100b overlap with each other, so that the display quality of an image displayed on the display region 13 of the display device 12 can be improved.

Although the relation between the display panel 100a and the display panel 100b is taken as an example in the above description, the same can apply to the relation between any other two adjacent display panels.

Figure 10A:
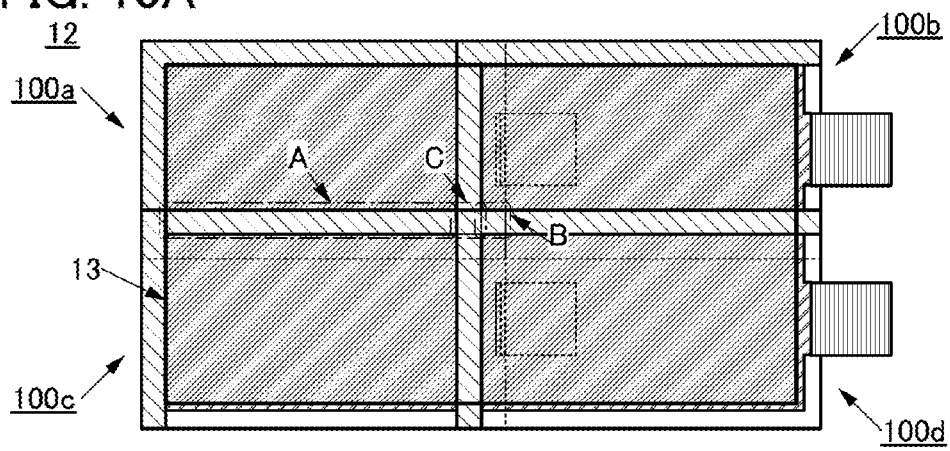
FIGS. 10A to 10C are top views illustrating an example of a display device.

FIG. 10A is a top view of the display device 12 in FIGS. 9D and 9E seen from the display surface side.

Depending on the number of the display panels 100 overlapping with the display region 101, the luminance (brightness) of a displayed image decreases. For example, in a region A in FIG. 10A, one display panel 100c is stacked over the display region 101a of the display panel 100a. In a region B, two display panels 100 (the display panels 100c and 100d) are stacked over the display region 101b of the display panel 100b. In a region C, three display panels 100 (the display panels 100b, 100c, and 100d) are stacked over the display region 101a of the display panel 100a.

In this case, it is preferable that image data to be displayed be corrected so that the gray scale of the pixels is locally increased depending on the number of display panels 100 overlapping with the display region 101. In this manner, a decrease in the display quality of the image displayed on the display region 13 of the display device 12 can be suppressed. Alternatively, the luminance of the pixels can be controlled by adjusting data voltage supplied from the driver circuit. In addition, the luminance of the pixels can be controlled also in a portion not overlapping with the display panels 100 of the display region 101. For example, the luminance may be corrected by being controlled so that the luminance is gradually decreased toward an overlapping area, whereby the overlapping area and the non-overlapping area have substantially the same luminance. Alternatively, in the display region 101, chromaticity may be gradually changed toward the overlapping area.

Alternatively, the position of an end portion of the display panel 100 placed on the upper side may be shifted from the position of an end portion of another display panel 100, whereby the number of display panels 100 overlapping with the display region 101 of the lower display panel 100 can be reduced.

Figure 10B:
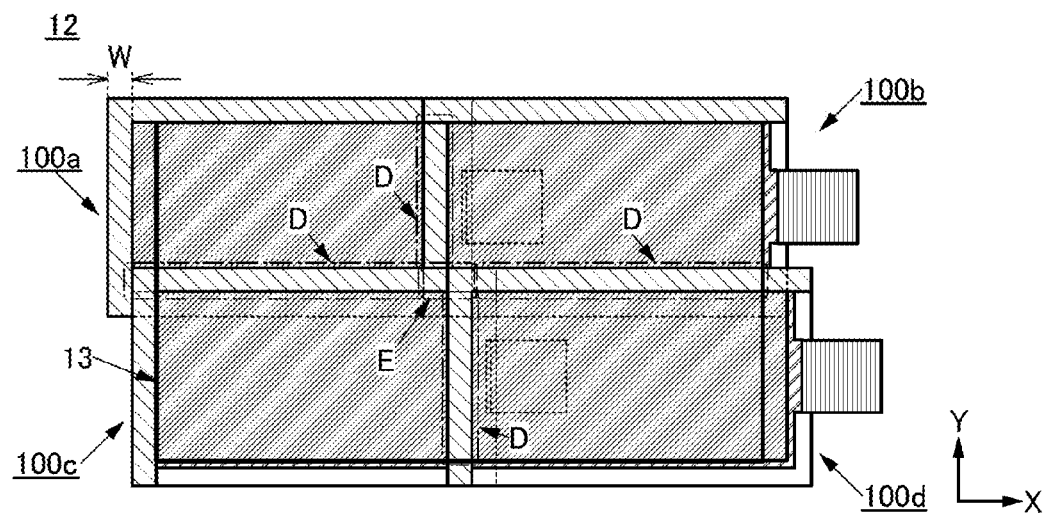

In FIG. 10B, the display panels 100c and 100d placed on the display panels 100a and 100b are shifted in one direction. Specifically, the display panels 100c and 100d are relatively shifted from the display panels 100a and 100b in the positive X direction by the width W of the region 110 that transmits visible light. At this time, there are two regions: a region D in which one display panel 100 overlaps with the display region 101, and a region E in which two display panels 100 overlap with the display region 101.

Figure 10C:
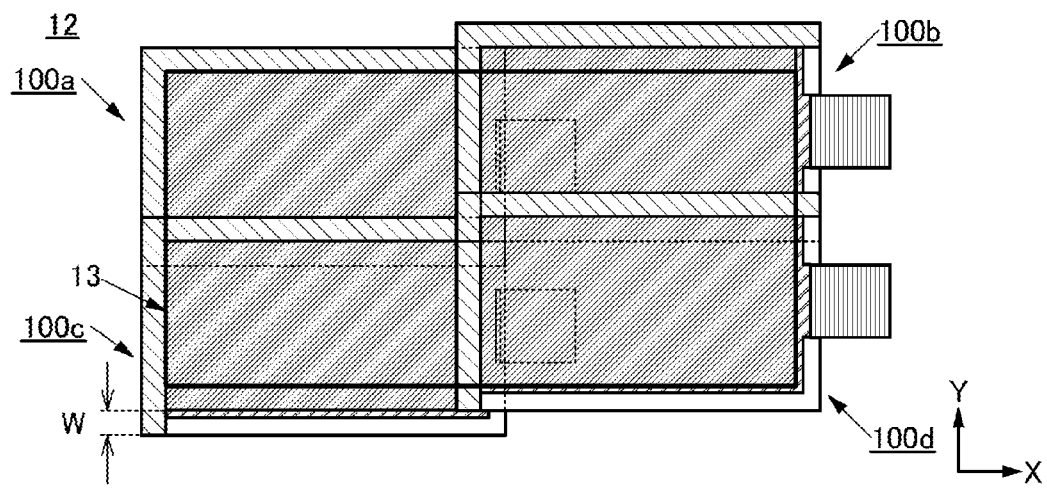

The display panel may be shifted in a direction perpendicular to the X direction (Y direction). In FIG. 10C, the display panels 100b and 100d are shifted from the display panels 100a and 100c in the positive Y direction by the width W of the region 110 that transmits visible light.

In the case where the display panel 100 placed on the upper side is shifted from the display panel 100 placed on the lower side, the shape of the contour of a region in which the display regions 101 of the display panels 100 are combined is different from a rectangular shape. Thus, to make the shape of the display region 13 of the display device 12 rectangular as illustrated in FIG. 10B or 10C, the display device 12 is preferably driven so that no image is displayed on regions, which are placed outside the display region 13, in the display regions 101 of the display panels 100. Considering the number of pixels in the region not displaying an image, the display region 101 of each display panel 100 preferably includes more pixels than the number obtained by dividing the number of all the pixels in the display region 13 by the number of the display panels 100.

Although the distance of a relative shift of the display panels 100 is set to an integral multiple of the width W of the region 110 that transmits visible light in the above description, the distance is not limited thereto and can be set as appropriate in consideration of the shapes of the display panels 100, the shape of the display region 13 of the display device 12, in which the display panels 100 are combined, or the like.

FIGS. 11A to 11E and FIGS. 12A to 12D are examples of cross sectional views of the two display panels attached to each other.

In FIGS. 11A to 11E, a lower display panel includes the display region 101a, a region 110a that transmits visible light, and the region 120a that blocks visible light. The lower display panel is electrically connected to the FPC 112a. An upper display panel (display panel on the display surface side) includes the display region 101b, the region 110b that transmits visible light, and the region 120b that blocks visible light. The upper display panel is electrically connected to an FPC 112b.

Figure 11A:
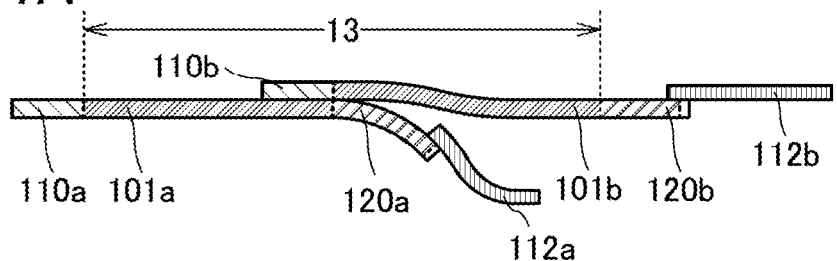
FIGS. 11A to 11E are cross-sectional views each illustrating an example of a display device.

In FIG. 11A, the FPC 112a and the FPC 112b are connected to the display surface side (front surface side) of the lower display panel and the display surface side of the upper display panel, respectively.

Figure 11B:
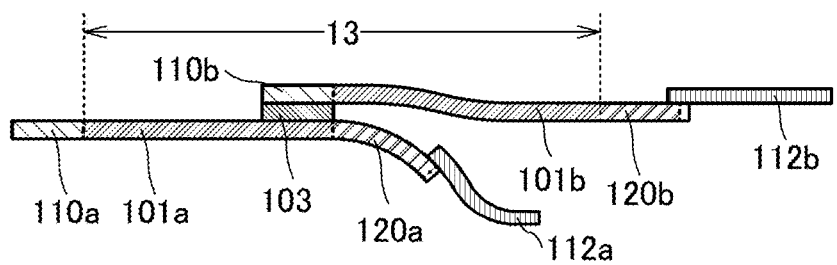

FIG. 11B illustrates an example in which two display panels are partly attached to each other with the above-described light-transmitting layer 103. FIG. 11B illustrates an example in which the width of the region 110b that transmits visible light is the same as that of the light-transmitting layer 103.

Figure 11C:
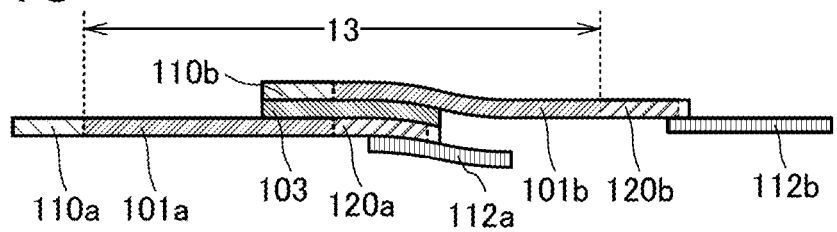

FIG. 11C illustrates an example in which the FPC 112a and the FPC 112b are connected to the side (rear surface side) opposite to the display surface of the lower display panel and the side (rear surface side) opposite to the display surface of the upper display panel, respectively.

In FIG. 11C, the light-transmitting layer 103 is provided between the region 120a that blocks visible light of the lower display panel and the display region 101b of the upper display panel.

When an FPC is connected to the rear surface side of a lower display panel, an end portion of the lower display panel can be attached to the rear surface of an upper display panel; thus, the attachment area can be increased and the mechanical strength of the attached portion can be increased.

Figure 11D:
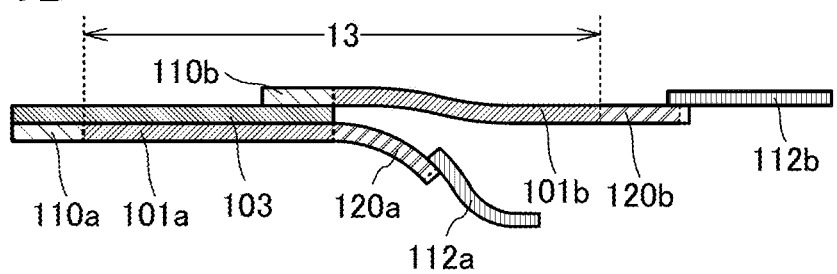

In FIG. 11D, the light-transmitting layer 103 overlaps with a region of the display region 101a not overlapping with the upper display panel. Furthermore, the region 110a that transmits visible light and the light-transmitting layer 103 overlap with each other.

Fine dirt such as dust in the air might be attached depending on a material of the light-transmitting layer. In such a case, it is preferable that the region of the display region 101a not overlapping with the upper display panel do not overlap with the light-transmitting layer 103. This makes it possible to suppress unclear display of the display device due to dirt or the like attached to the light-transmitting layer 103.

Figure 11E:
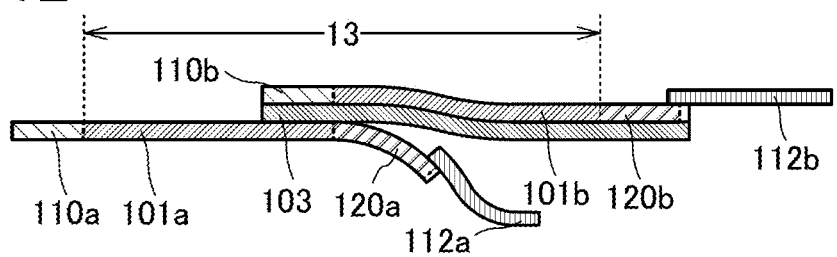

In FIG. 11E, the light-transmitting layer 103 overlaps with a region of the upper display panel not overlapping with the display region 101a.

In the structure illustrated in FIG. 11E, the light-transmitting layer is not provided on the outermost surface of the display surface of the display device; thus, unclear display of the display device due to dirt or the like attached to the light-transmitting layer 103 can be prevented. In addition, when a light-transmitting layer having attachability is provided on the rear surface of the display device, the display device can be detachably attached to a desired portion with the use of a surface of the light-transmitting layer that is not in contact with the display panel.

Figure 12A:
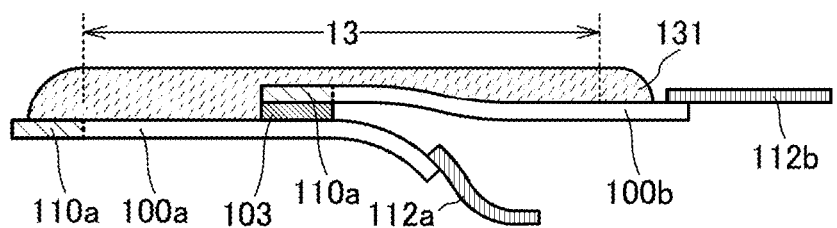
FIGS. 12A to 12D are cross-sectional views each illustrating an example of a display device.

In FIG. 12A, a resin layer 131 covers front surfaces of the display panel 100a and the display panel 100b. The resin layer 131 is preferably provided to cover the display regions of the display panels 100a and 100b and a region where the display panel 100a overlaps with the display panel 100b.

Providing the resin layer 131 over the plurality of display panels 100 can increase the mechanical strength of the display device 12. In addition, the resin layer 131 is formed to have a flat surface, whereby the display quality of an image displayed on the display region 13 can be increased. For example, when a coating apparatus such as a slit coater, a curtain coater, a gravure coater, a roll coater, or a spin coater is used, the resin layer 131 with high flatness can be formed.

The refractive index of the resin layer 131 is preferably 0.8 to 1.2 times, further preferably 0.9 to 1.1 times, and still further preferably 0.95 to 1.15 times as high as the refractive index of the substrate on the display surface side of the display panel 100. Light can be extracted outside more efficiently as the difference in refractive index between the display panel 100 and the resin layer 131 becomes smaller. In addition, the resin layer 131 with such a refractive index is provided to cover a step portion between the display panel 100a and the display panel 100b, whereby the step portion is not easily noticed, and the display quality of an image displayed on the display region 13 can be increased.

The resin layer 131 transmits visible light. For the resin layer 131, for example, an organic resin such as an epoxy resin, an aramid resin, an acrylic resin, a polyimide resin, a polyamide resin, or a polyamide-imide resin can be used.

Figure 12B:
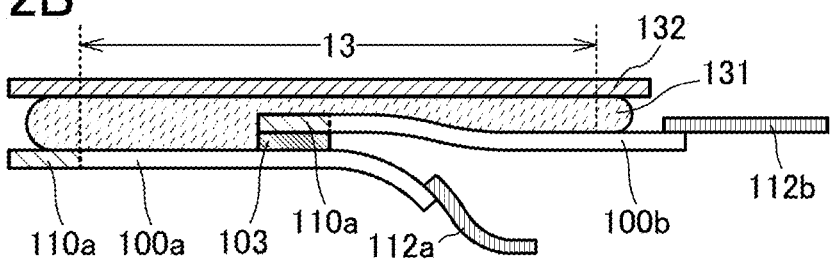

Alternatively, as illustrated in FIG. 12B, a protective substrate 132 is preferably provided over the display device 12 with the resin layer 131 provided therebetween. In that case, the resin layer 131 may serve as a bonding layer for bonding the protective substrate 132 to the display device 12.

With the protective substrate 132, the surface of the display device 12 can be protected, and moreover, the mechanical strength of the display device 12 can be increased. For the protective substrate 132, a light-transmitting material is used at least in a region overlapping with the display region 13. Furthermore, the protective substrate 132 may have a light-blocking property in a region other than the region overlapping with the display region 13 so as not to be noticed.

The protective substrate 132 may function as a touch panel. In the case where the display panel 100 is flexible and capable of being bent, the protective substrate 132 is also preferably flexible.

Furthermore, a difference in refractive index between the protective substrate 132 and the substrate on the display surface side of the display panel 100 or the resin layer 131 is preferably less than or equal to 20%, further preferably less than or equal to 10%, and still further preferably less than or equal to 5%.

As the protective substrate 132, a plastic substrate that is formed as a film can be used. For the plastic substrate, a polyester resin such as polyethylene terephthalate (PET) or polyethylene naphthalate (PEN), a polyacrylonitrile resin, a polyimide resin, a polymethyl methacrylate resin, a polycarbonate (PC) resin, a polyethersulfone (PES) resin, a polyamide resin (e.g., nylon or aramid), a polycycloolefin resin, a polystyrene resin, a polyamide imide resin, a polyvinyl chloride resin, a polyetheretherketone (PEEK) resin, a polysulfone (PSF) resin, a polyetherimide (PEI) resin, a polyarylate (PAR) resin, a polybutylene terephthalate (PBT) resin, a polytetrafluoroethylene (PTFE) resin, a silicone resin, or the like can be used. Alternatively, a substrate in which a fibrous body is impregnated with a resin (also referred to as prepreg) or a substrate whose coefficient of linear expansion is reduced by mixing an organic resin with an inorganic filler can be used. The protective substrate 132 is not limited to the resin film, and a transparent nonwoven fabric formed by processing pulp into a continuous sheet, a sheet including an artificial spider's thread fiber containing protein called fibroin, a complex in which the transparent nonwoven fabric or the sheet and a resin are mixed, a stack of a resin film and a nonwoven fabric containing a cellulose fiber whose fiber width is 4 nm or more and 100 nm or less, or a stack of a resin film and a sheet including an artificial spider's thread fiber may be used.

Note that the display device or the display panel of one embodiment of the present invention may be attached to an acrylic plate, a glass plate, a wooden plate, a metal plate, or the like. The display surface of the display device or that of the display panel or the surface opposite to the display surface thereof may be attached to these plates (in the case where the display surface is attached to any of these plates, a plate that transmits visible light is used). It is preferable that the display device or the display panel be detachably attached to any of these plates.

As the protective substrate 132, at least one of a polarizing plate, a circular polarizing plate, a retardation plate, an optical film, and the like can be used. The above-described optical member 240 can be used for the protective substrate 132.

It is preferable that not only the display panel but also a plate be hardly deformed by heat in the case where a state in which the display panel is attached to the plate is held. For example, the coefficient of thermal expansion of the plate is preferably lower than or equal to 60 ppm/° C., further preferably lower than or equal to 30 ppm/° C. For example, a metal plate such as an aluminum plate or a glass epoxy plate can be favorably used.

An example of results of a preservation test performed on an assumption of air transportation is described. The display panel of one embodiment of the present invention was attached to each of an aluminum plate, a glass epoxy plate, and an acrylic plate, held at 40° C. for 12 hours, and held at 0° C. for 12 hours. Then, the temperature was returned to room temperature. It is found after the preservation test that creases were not generated on the display panels attached to the aluminum plate and the glass epoxy plate. In contrast, it is found after the preservation test that creases were generated on the display panel attached to the acrylic plate.

Furthermore, it is found that generation of creases on the display panel in the preservation test can be suppressed more in the case where the display panel is fixed on the entire area of the plate than in the case where the display panel is fixed on only four sides of the plate. It is suggested that the display panel is easily deformed by a temperature change when the center portion of the display panel is not fixed to the plate.

Figure 12C:
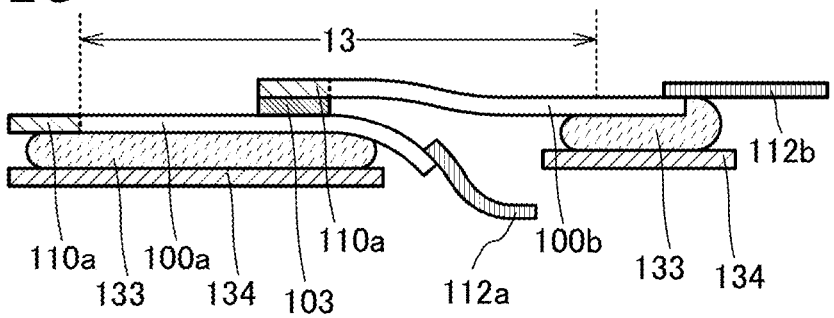

As illustrated in FIG. 12C, a resin layer 133 and a protective substrate 134 can be provided on surfaces opposite to the display surfaces of the display panels 100a and 100b. Providing a substrate supporting the display panels on the rear surfaces of the display panels can suppress unintended warping or bending of the display panels, whereby the display surfaces can be kept smooth. Thus, the display quality of an image displayed on the display region 13 can be improved.

Note that the resin layer 133 and the protective substrate 134, which are provided on the sides opposite to the display surfaces, do not necessarily have light transmittance, and a material that absorbs or reflects visible light may be used.

Figure 12D:
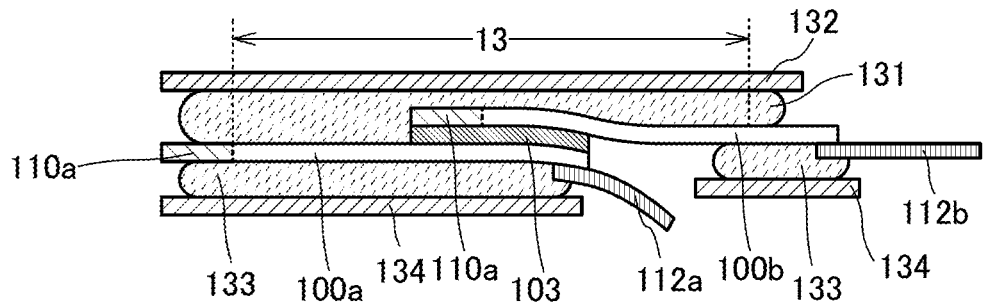

As illustrated in FIG. 12D, the resin layer 131 and the protective substrate 132 can be provided on the front surfaces of the display panels, and the resin layer 133 and the protective substrate 134 may be provided on the rear surfaces thereof. In this manner, the display panels 100a and 100b are sandwiched between the two protective substrates, whereby the mechanical strength of the display device 12 can be further increased.

It is preferable that the total thickness of the resin layer 131 and the protective substrate 132 be approximately the same as that of the resin layer 133 and the protective substrate 134. For example, it is preferable that the thicknesses of the resin layers 131 and 133 be made substantially equal to each other, and materials having the same thickness be used for the protective substrates 132 and 134. In that case, the plurality of display panels 100 can be located at the center of the stack in the thickness direction. For example, when the stack including the display panels 100 at the center in the thickness direction is bent, stress in the lateral direction applied to the display panels 100 by bending can be relieved, which prevents the display panels 100 from being damaged.

In the case where the thicknesses of the resin layer and the protective substrate differ between an end portion and a center portion of the display device, for example, the total thickness of the resin layer 131 and the protective substrate 132 and that of the resin layer 133 and the protective substrate 134 are preferably compared under the same condition that is appropriately selected from conditions such as the average thickness, the largest thickness, the smallest thickness, and the like.

In FIG. 12D, the same material is preferably used for the resin layers 131 and 133 because the manufacturing cost can be reduced. Similarly, the same material is preferably used for the protective substrates 132 and 134 because the manufacturing cost can be reduced.

As illustrated in FIGS. 12C and 12D, an opening for leading the FPC 112a is preferably provided in the resin layer 133 and the protective substrate 134, which are located on the rear surface sides of the display panels 100a and 100b. In particular, when the resin layer 133 is provided to cover part of the FPC 112a as illustrated in FIG. 12D, the mechanical strength at a connection portion between the display panel 100a and the FPC 112a can be increased, and defects such as separation of the FPC 112a can be suppressed. Similarly, the resin layer 133 is preferably provided to cover part of the FPC 112b.

Figure 13A:
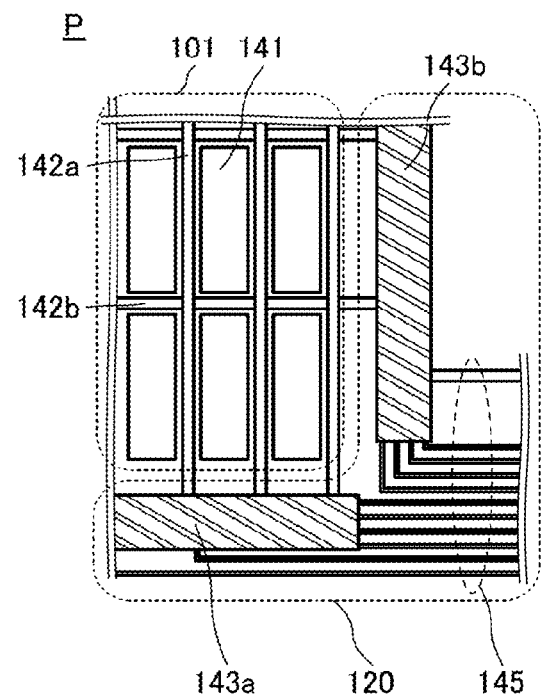
FIGS. 13A to 13C are top views and a cross-sectional view illustrating an example of a display panel.
Figure 13B:
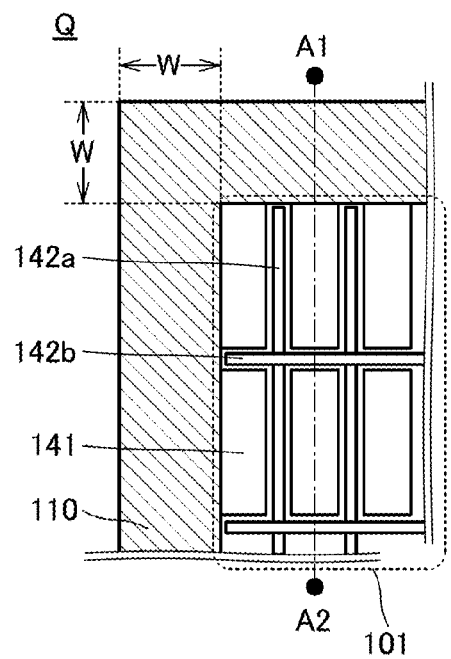

Next, a structure example of the display panel 100 is described. FIG. 13A is an example of a top view in which a region P in FIG. 9A is enlarged, and FIG. 13B is an example of a top view in which a region Q in FIG. 9A is enlarged.

As illustrated in FIG. 13A, in the display region 101, a plurality of pixels 141 are arranged in matrix. In the case where the display panel 100 capable of full color display with three colors of red, blue, and green is formed, each of the pixels 141 corresponds to a sub-pixel capable of displaying any of the three colors. A sub-pixel capable of displaying white or yellow may be provided in addition to the sub-pixels capable of displaying any of the three colors. A region including the pixels 141 corresponds to the display region 101.

A wiring 142a and a wiring 142b are electrically connected to each pixel 141. The plurality of wirings 142a each intersects with the wiring 142b, and is electrically connected to a circuit 143a. The plurality of wirings 142b are electrically connected to a circuit 143b. One of the circuits 143a and 143b can function as a scan line driver circuit, and the other can function as a signal line driver circuit. One or both of the circuits 143a and 143b are not necessarily provided.

In FIG. 13A, a plurality of wirings 145 electrically connected to the circuit 143a or the circuit 143b is provided. The wiring 145 is electrically connected to an FPC 123 in an unillustrated region and has a function of supplying a signal from the outside to the circuits 143a and 143b.

In FIG. 13A, a region including the circuit 143a, the circuit 143b, the plurality of wirings 145, and the like corresponds to the region 120 that blocks visible light.

In FIG. 13B, a region outside the pixel 141 provided closest to the end corresponds to the region 110 that transmits visible light. The region 110 that transmits visible light does not include members that blocks visible light, such as the pixel 141, the wiring 142a, and the wiring 142b. Note that in the case where part of the pixel 141, the wiring 142a, or the wiring 142b transmits visible light, the part of the pixel 141, the wiring 142a, or the wiring 142b may be provided to extend to the region 110 that transmits visible light.

In the case where the width of the region 110 that transmits visible light varies depending on the display panel, or in the case where the width varies depending on the positions of the same display panel, the shortest length can be referred to as the width W. In FIG. 13B, the distance between the pixel 141 and the end portion of the substrate (that is, the width W of the region 110 that transmits visible light) in the vertical direction is the same as that in the horizontal direction, but one embodiment of the present invention is not limited thereto.

Figure 13C:
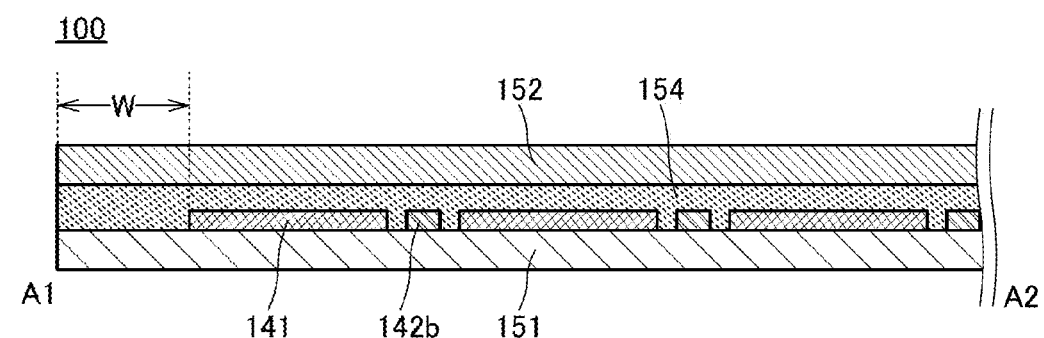

FIG. 13C is a cross-sectional view taken along line A1-A2 in FIG. 13B. The display panel 100 includes a pair of substrates (a substrate 151 and a substrate 152) that transmits visible light. The substrate 151 and the substrate 152 are bonded to each other with a bonding layer 154. Here, the substrate on which the pixel 141, the wiring 142b, and the like are formed is referred to as the substrate 151.

As illustrated in FIGS. 13B and 13C, in the case where the pixel 141 is positioned closest to the end of the display region 101, the width of the region 110 that transmits visible light is the distance between the end portion of the substrate 151 or the substrate 152 and the end portion of the pixel 141.

Note that the end portion of the pixel 141 refers to the end portion of the member that is positioned closest to the end and blocks visible light in the pixel 141. Alternatively, in the case where a light-emitting element including a layer containing a light-emitting organic compound between a pair of electrodes (also referred to as an organic EL element) is used as the pixel 141, the end portion of the pixel 141 may be any of the end portion of the lower electrode, the end portion of the layer containing a light-emitting organic compound, and the end portion of the upper electrode.

Figure 14A:
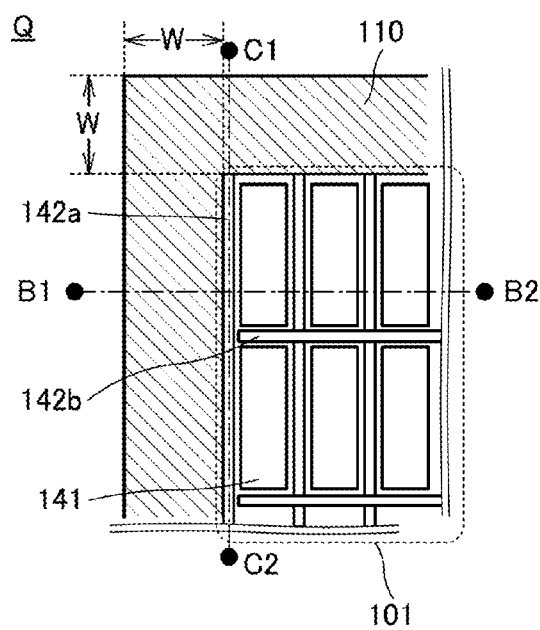
FIGS. 14A to 14C are a top view and cross-sectional views illustrating an example of a display panel.
Figure 14B:
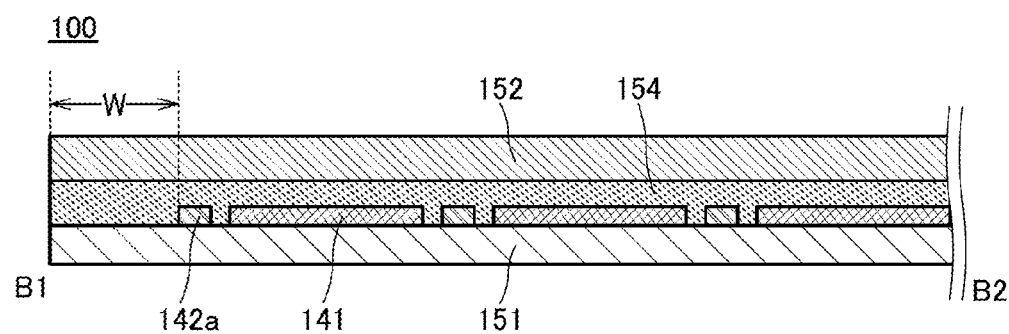

FIG. 14A is an example of a top view in which the region Q is enlarged; the position of the wiring 142a is different from that in FIG. 13B. FIG. 14B is a cross-sectional view taken along line B1-B2 in FIG. 14A, and FIG. 14C is a cross sectional view taken along line C1-C2 in FIG. 14A.

Figure 14C:
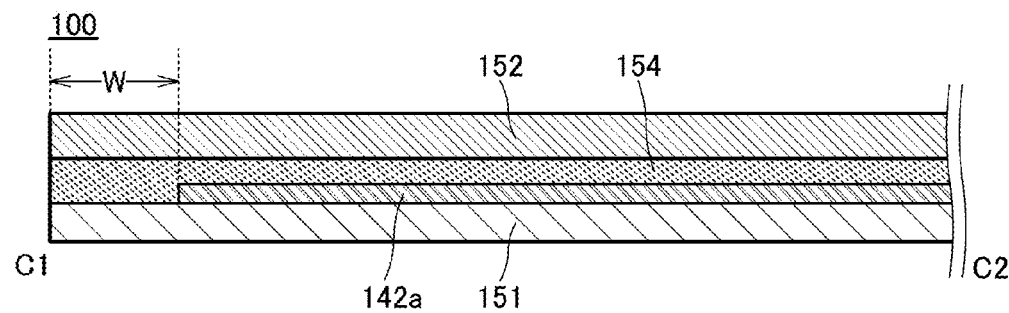

As illustrated in FIGS. 14A to 14C, in the case where the wiring 142a is positioned closest to the end of the display region 101, the width W of the region 110 that transmits visible light is the distance between the end portion of the substrate 151 or the substrate 152 and the end portion of the wiring 142a. In the case where the wiring 142a transmits visible light, the region 110 that transmits visible light may include a region where the wiring 142a is provided.

Here, in the case where the density of pixels provided in the display region 101 of the display panel 100 is high, misalignment may occur when two display panels 100 are attached.

Figure 15A:
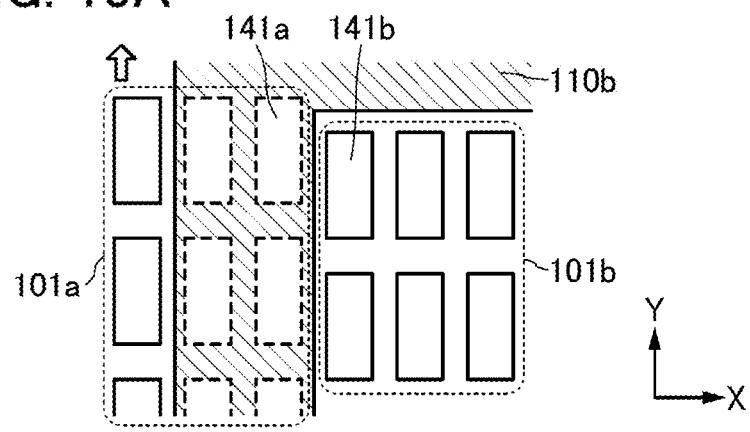
FIGS. 15A to 15C are top views each illustrating an example of a display device.
Figure 15B:
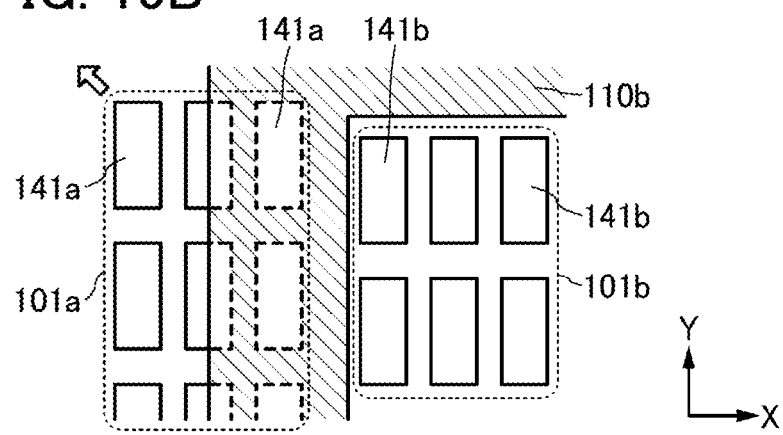
Figure 15C:
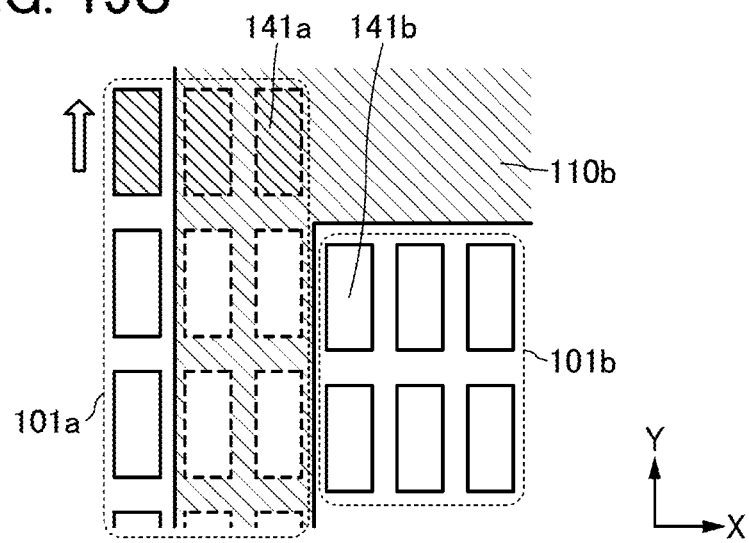

FIGS. 15A to 15C each illustrate a positional relation between the display region 101a of the display panel 100a provided on the lower side and the display region 101b of the display panel 100b provided on the upper side, seen from the display surface side. FIGS. 15A to 15C each illustrate the vicinities of the corner portions of the display regions 101a and 101b. Part of the display region 101a is covered with the region 110b that transmits visible light.

FIG. 15A shows an example in which adjacent pixels 141a and 141b are relatively deviated in one direction (Y direction). The arrow in the drawing denotes a direction in which the display panel 100a is deviated from the display panel 100b.

FIG. 15B shows an example in which the adjacent pixels 141a and 141b are relatively deviated in a longitudinal direction and a lateral direction (X direction and Y direction).

In the examples illustrated in FIGS. 15A and 15B, the deviation in the lateral direction or the longitudinal direction is smaller than the width of one pixel. In such a case, image data corresponding to an image to be displayed on at least one of the display region 101a and the display region 101b is corrected on the basis of the deviation, whereby the display quality can be maintained. Specifically, when the deviation makes the distance between pixels smaller, the correction is preferably made such that the gray scale (luminance) of the pixels is decreased. In contrast, when the deviation makes the distance between pixels larger, the correction is preferably made such that the gray scale (luminance) of the pixels is increased. In the case where the display region 101b is over the display region 101a and overlaps with the display region 101a by more than the width of one pixel, image data is preferably corrected to shift by one column such that the pixel 141a positioned under the pixel 141b is not driven.

FIG. 15C illustrates an example in which the pixels 141a and 141b, which should be adjacent to each other, are relatively deviated in one direction (Y direction) by a length of more than one pixel. When the deviation of more than one pixel occurs, the pixels are preferably driven so that projecting pixels (pixels that are hatched) are not displayed. Note that the same applies to the case where the deviation direction is the X direction.

When the plurality of display panels 100 are attached, in order to suppress misalignment, each of the display panels 100 is preferably provided with an alignment marker or the like. Alternatively, a projection and a depression may be formed on the surfaces of the display panels 100, and the projection and the depression may fit together in a region where two display panels 100 overlap with each other.

Furthermore, in consideration of alignment accuracy, it is preferable that pixels more than the pixels to be used be placed in advance in the display region 101 of the display panel 100. For example, it is preferable that one or more, preferably three or more, further preferably five or more extra pixel columns along either one or both of a scan line and a signal line be provided in addition to the pixel columns used for display.

As described, the reflection of external light in the region that transmits visible light is suppressed in a display device of one embodiment of the present invention; thus, it is possible that the overlapping area is less likely to be noticed by a user of the display device can be provided. Thus, a wide display region in which a seam is less likely to be noticed can be provided. Furthermore, the light transmittance in the region that transmits visible light is high and the luminance (brightness) of display of the display panel on the lower side is high; thus, it is possible to suppress display unevenness or luminance unevenness of the display device.

This embodiment can be combined with any of other embodiments as appropriate.

(Embodiment 2)

In this embodiment, a display panel that can be used for the display device of one embodiment of the present invention is described with reference to the drawings.

In this embodiment, a display panel that uses an EL element as a display element is described as an example.

The display panel can have a structure in which sub-pixels of three colors of red (R), green (G), and blue (B) express one color, a structure in which sub-pixels of four colors of R, G, B, and white (W) express one color, a structure in which sub-pixels of four colors of R, G, B, and yellow (Y) express one color, or the like. There is no particular limitation on the color element and colors other than R, G, B, W, and Y (e.g., cyan or magenta) may be used.

<Structure Example 1>

FIGS. 16A and 16B show top views of a display panel 370.

The display panels 370 illustrated in FIGS. 16A and 16B each include the region 110 that transmits visible light, a display portion 381, and a driver circuit portion 382. In the example illustrated in FIG. 16A, the region 110 that transmits visible light is adjacent to the display portion 381 and provided along two sides of the display portion 381. In the example illustrated in FIG. 16B, the region 110 that transmits visible light is adjacent to the display portion 381 and provided along three sides of the display portion 381.

FIG. 16C is a cross-sectional view of the display panel 370 employing a color filter method and having a top-emission structure. FIG. 16C corresponds to cross-sectional views along dashed-dotted lines A1-A2 and A3-A4 in each of FIGS. 16A and 16B.

The display panel 370 includes the substrate 201, the bonding layer 203, the first insulating layer 205, the second insulating layer 207, a plurality of transistors, a capacitor 305, a conductive layer 307, an insulating layer 312, an insulating layer 313, an insulating layer 314, an insulating layer 315, a light-emitting element 304, a conductive layer 355, a spacer 316, a bonding layer 317, a coloring layer 325, a light-blocking layer 326, the substrate 211, the bonding layer 213, the third insulating layer 215, and the fourth insulating layer 217. The layers included in the region 110 that transmits visible light transmit visible light.

The driver circuit portion 382 includes a transistor 301. The display portion 381 includes a transistor 302 and a transistor 303.

Each transistor includes a gate, a gate insulating layer 311, a semiconductor layer, a source, and a drain. The gate and the semiconductor layer overlap with each other with the gate insulating layer 311 provided therebetween. Part of the gate insulating layer 311 functions as a dielectric of the capacitor 305. The conductive layer functioning as the source or the drain of the transistor 302 serves as one electrode of the capacitor 305.

In FIG. 16C, a bottom-gate transistor is illustrated. The structure of the transistor may be different between the driver circuit portion 382 and the display portion 381. The driver circuit portion 382 and the display portion 381 may each include a plurality of kinds of transistors.

The capacitor 305 includes a pair of electrodes and the dielectric therebetween. The capacitor 305 includes a conductive layer that is formed using the same material and the same step as the gate of the transistor and a conductive layer that is formed using the same material and the same step as the source and the drain of the transistor.

The insulating layer 312, the insulating layer 313, and the insulating layer 314 are each provided to cover the transistors and the like. The number of the insulating layers covering the transistors and the like is not particularly limited. The insulating layer 314 functions as a planarization layer. It is preferable that at least one of the insulating layer 312, the insulating layer 313, and the insulating layer 314 be formed using a material inhibiting diffusion of impurities such as water and hydrogen. Diffusion of impurities from the outside into the transistors can be effectively suppressed, leading to improved reliability of the display panel.

The display panel 370 has a structure in which the reflection of light in the region 110 that transmits visible light is suppressed. The region 110 that transmits visible light includes the substrate 201, the bonding layer 203, the first insulating layer 205, the bonding layer 317, the third insulating layer 215, the bonding layer 213, and the substrate 211 that are stacked in this order.

The second insulating layer 207, the fourth insulating layer 217, the gate insulating layer 311, the insulating layer 312, the insulating layer 313, the insulating layer 314, and the insulating layer 315 are provided in the display portion 381 and not provided in the region 110 that transmits visible light. The end portions of these insulating layers are preferably positioned in part of the display portion 381 that is near the boundary between the display portion 381 and the region 110 that transmits visible light (see FIG. 18A). In addition, the end portions of these insulating layers preferably overlap with the light-blocking layer 326. Thus, variation in reflectance and transmittance can be small on the plane of the region 110 that transmits visible light.

The first insulating layer 205 and the substrate 201 are attached to each other with the bonding layer 203. The third insulating layer 215 and the substrate 211 are attached to each other with the bonding layer 213. In the method for manufacturing a display panel of one embodiment of the present invention, the first insulating layer 205 and the third insulating layer 215 are positioned in the separation interfaces with the respective formation substrates and provided over the entire area of the display panel 370. Thus, the display panel 370 can be manufactured with high yield.

In the display portion 381, the light-emitting element 304 is positioned between the second insulating layer 207 and the fourth insulating layer 217. Entry of impurities into the light-emitting element 304 from the thickness direction of the display panel 370 is suppressed. Similarly, a plurality of insulating layers covering the transistors are provided in the display portion 381, and thus entry of impurities into the transistors is suppressed.

The light-emitting element 304, the transistors, and the like are preferably provided between a pair of insulating films that are highly resistant to moisture, in which case entry of impurities such as water from entering these elements can be suppressed, leading to higher reliability of the display panel.

Examples of the insulating film highly resistant to moisture include a film containing nitrogen and silicon (e.g., a silicon nitride film and a silicon nitride oxide film) and a film containing nitrogen and aluminum (e.g., an aluminum nitride film). Alternatively, a silicon oxide film, a silicon oxynitride film, an aluminum oxide film, or the like may be used.

For example, the moisture vapor transmission rate of the insulating film highly resistant to moisture is lower than or equal to $1 \times 10^{-5}$ [g/(m$^2$·day)], preferably lower than or equal to $1 \times 10^{-6}$ [g/(m$^2$·day)], further preferably lower than or equal to $1 \times 10^{-7}$ [g/(m$^2$·day)], still further preferably lower than or equal to $1 \times 10^{-8}$ [g/(m$^2$·day)].

In the case where the insulating layer 314 is formed using an organic material, impurities such as moisture might enter the light-emitting element 304 and the like from the outside of the display panel through the insulating layer 314 exposed at an end portion of the display panel. Deterioration of the light-emitting element 304 due to the entry of an impurity leads to deterioration of the display panel. Thus, as illustrated in a portion near a connection portion 306 in FIG.

16C, it is preferable that an opening that reaches an inorganic film (here, the insulating layer 313) be formed in the insulating layer 314 so that an impurity such as moisture entering from the outside of the display panel does not easily reach the light-emitting element 304.

Figures 18A, 18B:
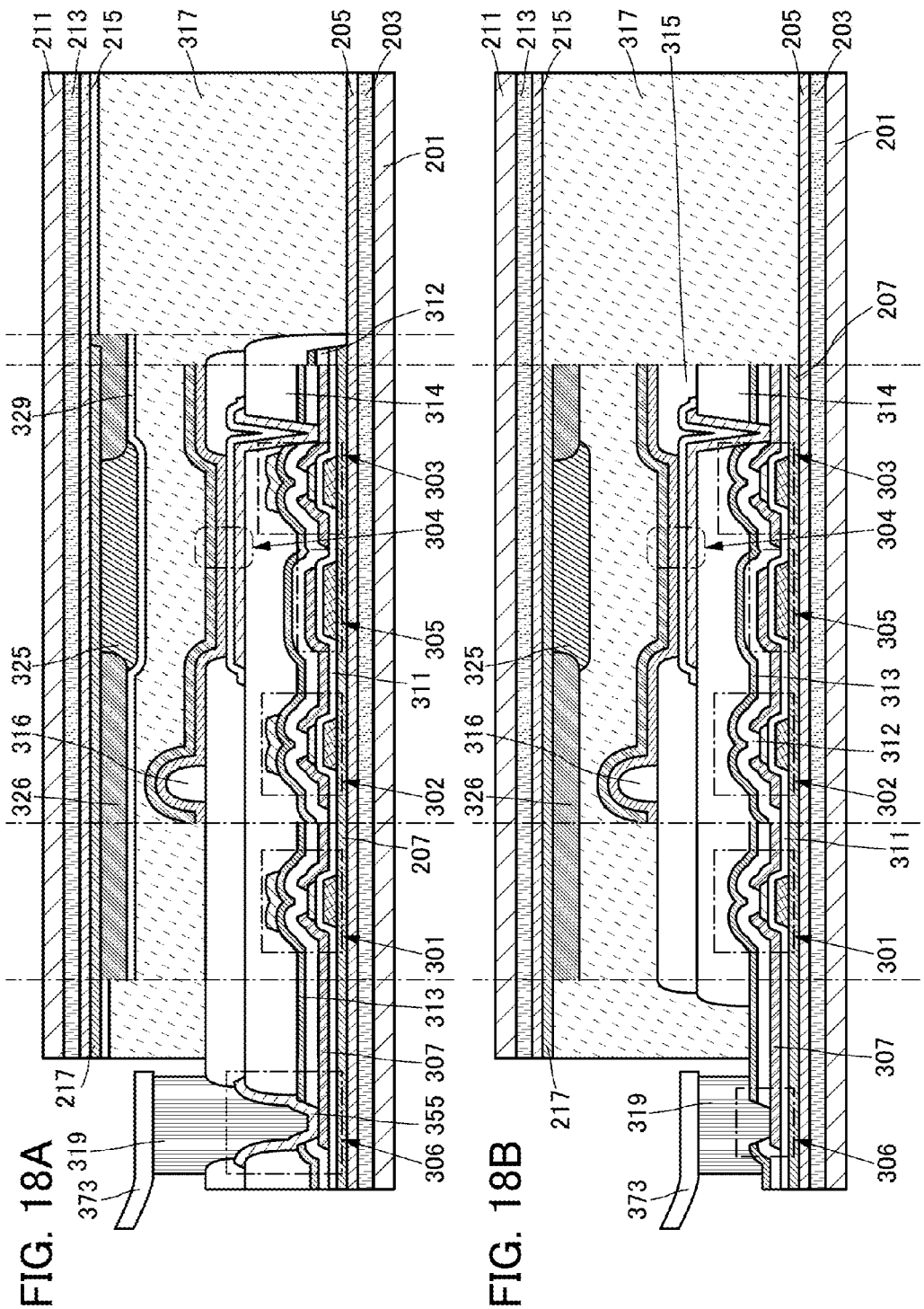
FIGS. 18A and 18B are cross-sectional views each illustrating an example of a display panel.

FIG. 18A illustrates a case where the opening is not provided in the insulating layer 314 near the connection portion 306. The insulating layer 314 is preferably provided in the entire area of the display panel as illustrated in FIG. 18A, in which case the yield of the separation step described below can be increased.

As illustrated in a portion near the connection portion 306 in FIG. 18B, the case where the insulating layer 314 is not positioned at the end portion of the display panel is illustrated. Since an insulating layer formed using an organic material is not positioned at the end portion of the display panel in the structure of FIG. 18B, entry of impurities into the light-emitting element 304 can be suppressed.

The light-emitting element 304 includes an electrode 321, an EL layer 322, and an electrode 323. The light-emitting element 304 may include an optical adjustment layer 324. The light-emitting element 304 emits light to the coloring layer 325 side.

The transistor, the capacitor, the wiring, and the like are provided to overlap with a light-emitting region of the light-emitting element 304, whereby an aperture ratio of the display portion 381 can be increased.

One of the electrode 321 and the electrode 323 functions as an anode and the other functions as a cathode. When a voltage higher than the threshold voltage of the light-emitting element 304 is applied between the electrode 321 and the electrode 323, holes are injected to the EL layer 322 from the anode side and electrons are injected to the EL layer 322 from the cathode side. The injected electrons and holes are recombined in the EL layer 322 and a light-emitting substance contained in the EL layer 322 emits light.

The electrode 321 is electrically connected to the source or the drain of the transistor 303, directly or through another conductive layer. The electrode 321 functions as a pixel electrode and is provided for each light-emitting element 304. Two adjacent electrodes 321 are electrically insulated from each other by the insulating layer 315.

The EL layer 322 is a layer containing a light-emitting material. As the light-emitting element 304, an organic EL element including an organic compound as a light-emitting material can be favorably used.

The EL layer 322 includes at least one light-emitting layer.

As a light-emitting material, a quantum dot can be used. A quantum dot is a semiconductor nanocrystal with a size of several nanometers and contains approximately $1\times10^3$ to $1\times10^6$ atoms. Since energy shift of quantum dots depends on their size, quantum dots made of the same substance emit light with different wavelengths depending on their size; thus, emission wavelengths can be easily adjusted by changing the size of quantum dots.

A quantum dot has an emission spectrum with a narrow peak, leading to emission with high color purity. In addition, a quantum dot is said to have a theoretical internal quantum efficiency of approximately 100%, and a quantum dot can be used as a light-emitting material to obtain a light-emitting element having high light emission efficiency. Furthermore, since a quantum dot that is an inorganic compound has high inherent stability, a light-emitting element that is favorable also in terms of lifetime can be obtained.

Examples of a material of a quantum dot include a Group 14 element in the periodic table, a Group 15 element in the periodic table, a Group 16 element in the periodic table, a compound of a plurality of Group 14 elements in the periodic table, a compound of an element belonging to any of Groups 4 to 14 in the periodic table and a Group 16 element in the periodic table, a compound of a Group 2 element in the periodic table and a Group 16 element in the periodic table, a compound of a Group 13 element in the periodic table and a Group 15 element in the periodic table, a compound of a Group 13 element in the periodic table and a Group 17 element in the periodic table, a compound of a Group 14 element in the periodic table and a Group 15 element in the periodic table, a compound of a Group 11 element in the periodic table and a Group 17 element in the periodic table, iron oxides, titanium oxides, spinel chalcogenides, and semiconductor clusters.

As examples of a material included in a quantum dot, cadmium selenide, cadmium sulfide, cadmium telluride, zinc sulfide, indium phosphide, lead selenide, lead sulfide, a compound of selenium, zinc, and cadmium, a compound of cadmium, selenium, and sulfur, and the like can be given. What is called an alloyed quantum dot, whose composition is represented by a given ratio, may be used. For example, an alloyed quantum dot of cadmium, selenium, and sulfur is a means effective in obtaining blue light because the emission wavelength can be changed by changing the content ratio of elements.

As the quantum dot, any of a core-type quantum dot, a core-shell quantum dot, a core-multishell quantum dot, and the like can be used. It is preferable to use a core-shell or core-multishell quantum dot because the quantum efficiency of light emission can be significantly improved. Examples of the material of a shell include zinc sulfide and zinc oxide.

Quantum dots have a high proportion of surface atoms and thus have high reactivity and easily cohere together. For this reason, it is preferable that a protective agent be attached to, or a protective group be provided at the surfaces of quantum dots. In this manner, cohesion of quantum dots can be prevented and solubility in a solvent can be increased. It can also reduce reactivity and improve electrical stability.

The range of size (diameter) of quantum dots that is usually used is greater than or equal to 0.5 nm and less than or equal to 20 nm, preferably greater than or equal to 1 nm and less than or equal to 10 nm. The emission spectra are narrowed as the size distribution of the quantum dots gets smaller, and thus light can be obtained with high color purity. The shape of the quantum dots is not particularly limited and may be a spherical shape, a rod shape, a circular shape, or the like.

Even when a light-emitting layer is composed of quantum dots and made without a host material, the quantum dots enable light emission efficiency to be ensured; thus, a light-emitting element that is favorable in terms of a lifetime can be obtained. In the case where the light-emitting layer is composed of quantum dots, the quantum dots preferably have core-shell structures (including core-multishell structures).

The electrode 323 functions as a common electrode and is provided for a plurality of light-emitting elements 304. A fixed potential is supplied to the electrode 323.

The light-emitting element 304 overlaps with the coloring layer 325 with the bonding layer 317 provided therebetween. The spacer 316 overlaps with the light-blocking layer 326 with the bonding layer 317 provided therebetween. Although FIG. 16C illustrates the case where a space is provided between the light-emitting element 304 and the light-blocking layer 326, the light-emitting element 304 and the light-blocking layer 326 may be in contact with each other. Although the spacer 316 is provided on the substrate 201 side in the structure illustrated in FIG. 16C, the spacer 316 may be provided on the substrate 211 side (e.g., in a position closer to the substrate 201 than that of the light-blocking layer 326).

Owing to the combination of a color filter (the coloring layer 325) and a microcavity structure (the optical adjustment layer 324), light with high color purity can be extracted from the display panel. The thickness of the optical adjustment layer 324 is varied depending on the color of the pixel.

The coloring layer is a colored layer that transmits light in a specific wavelength range. For example, a color filter that transmits light in a specific wavelength range, such as red, green, blue, or yellow light, can be used. Examples of materials that can be used for the coloring layer include a metal material, a resin material, and a resin material containing a pigment or dye.

Note that one embodiment of the present invention is not limited to a color filter method, and a separate coloring method, a color conversion method, a quantum dot method, and the like may be employed.

The light-blocking layer is provided between the adjacent coloring layers. The light-blocking layer blocks light emitted from an adjacent light-emitting element to inhibit color mixture between adjacent light-emitting elements. Here, the coloring layer is provided such that its end portion overlaps with the light-blocking layer, whereby light leakage can be reduced. For the light-blocking layer, a material that blocks light from the light-emitting element can be used; for example, a black matrix can be formed using a metal material or a resin material containing pigment or dye. Note that it is preferable to provide the light-blocking layer in a region other than a pixel portion, such as a driver circuit, in which case undesired leakage of guided light or the like can be suppressed.

The connection portion 306 includes the conductive layer 307 and the conductive layer 355. The conductive layer 307 and the conductive layer 355 are electrically connected to each other. The conductive layer 307 can be formed using the same material and the same step as those of the source and the drain of the transistor. The conductive layer 355 is electrically connected to an external input terminal through which a signal or a potential from the outside is transmitted to the driver circuit portion 382. Here, an example in which an FPC 373 is provided as an external input terminal is shown. The FPC 373 and the conductive layer 355 are electrically connected to each other through a connector 319.

As the connector 319, any of various anisotropic conductive films (ACF), anisotropic conductive pastes (ACP), and the like can be used.

The transistors 301, 302, and 303 illustrated in FIG. 18A each include two gates, the gate insulating layer 311, a semiconductor layer, a source, and a drain. FIG. 18A illustrates an example where each transistor has a structure in which the semiconductor layer is sandwiched between the two gates. Such transistors can have higher field-effect mobility and thus have higher on-state current than other transistors. Consequently, a circuit capable of high-speed operation can be obtained. Furthermore, the area occupied by a circuit can be reduced. The use of the transistor having high on-state current can reduce signal delay in wirings and can reduce display luminance variation even in a display panel in which the number of wirings is increased because of increase in size or resolution. In the example illustrated in FIG. 18A, one of the gates is formed between the insulating layer 313 and the insulating layer 314.

As illustrated in FIG. 18A, a display panel preferably includes an overcoat 329. The overcoat 329 can prevent impurities and the like contained in the coloring layer 325 from being diffused into the light-emitting element 304. The overcoat 329 is formed using a material that transmits light emitted from the light-emitting element 304. For example, it is possible to use an inorganic insulating film such as a silicon nitride film or a silicon oxide film, an organic insulating film such as an acrylic film or a polyimide film, or a stacked layer of an organic insulating film and an inorganic insulating film. FIG. 18A illustrates a structure in which the overcoat 329 is positioned over the entire area of the display panel. The overcoat 329 is not necessarily provided in the region 110 that transmits visible light.

In the case where upper surfaces of the coloring layer 325 and the light-blocking layer 326 are coated with a material of the bonding layer 317, a material that has high wettability with respect to the material of the bonding layer 317 is preferably used as the material of the overcoat 329. For example, an oxide conductive film such as an indium tin oxide (ITO) film or a metal film such as an Ag film that is thin enough to transmit light is preferably used as the overcoat 329.

When the overcoat 329 is formed using a material that has high wettability with respect to the material for the bonding layer 317, the material for the bonding layer 317 can be uniformly applied. Thus, entry of bubbles in the step of attaching the pair of substrates to each other can be suppressed, and thus defective display can be suppressed.

A flexible substrate is preferably used as each of the substrates 201 and 211. For example, a material such as glass, quartz, a resin, a metal, an alloy, or a semiconductor thin enough to have flexibility can be used. The substrate through which light is extracted from the light-emitting element is formed using a material that transmits the light. For example, the thickness of the flexible substrate is preferably greater than or equal to 1 µm and less than or equal to 200 µm, further preferably greater than or equal to 1 µm and less than or equal to 100 µm, still further preferably greater than or equal to 10 µm and less than or equal to 50 µm, and particularly preferably greater than or equal to 10 µm and less than or equal to 25 µm. The thickness and hardness of the flexible substrate are set in the range where mechanical strength and flexibility can be balanced against each other. The flexible substrate may have a single-layer structure or a stacked-layer structure.

A resin, that has a specific gravity smaller than that of glass, is preferably used for the flexible substrate, in which case the display panel can be lightweight as compared with the case where glass is used.

The substrate is preferably formed using a material with high toughness. In that case, a display panel with high impact resistance that is less likely to be broken can be provided. For example, when a resin substrate or a thin metal or alloy substrate is used, the display panel can be lightweight and unlikely to be broken as compared with the case where a glass substrate is used.

A metal material and an alloy material, which have high thermal conductivity, are preferable because they can easily conduct heat to the whole substrate and accordingly can suppress a local temperature rise in the display panel. The thickness of a substrate using a metal material or an alloy material is preferably greater than or equal to 10 µm and less than or equal to 200 µm, further preferably greater than or equal to 20 µm and less than or equal to 50 µm.

There is no particular limitation on a material of the metal substrate or the alloy substrate, but it is preferable to use, for example, aluminum, copper, nickel, or a metal alloy such as an aluminum alloy or stainless steel. Examples of a material for a semiconductor substrate include silicon and the like.

Furthermore, when a material with high thermal emissivity is used for the substrate, increase of the surface temperature of the display panel can be suppressed, and breakage or a decrease in reliability of the display panel can be suppressed. For example, the substrate may have a stacked-layer structure of a metal substrate and a layer with high thermal emissivity (the layer can be formed using a metal oxide or a ceramic material, for example).

Examples of materials having flexibility and a light-transmitting property include polyester resins such as PET and PEN, a polyacrylonitrile resin, an acrylic resin, a polyimide resin, a polymethyl methacrylate resin, a PC resin, a PES resin, polyamide resins (such as nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a PTFE resin, and an ABS resin. In particular, a material with a low coefficient of linear expansion is preferred, and for example, a polyamide imide resin, a polyimide resin, a polyamide resin, or PET can be suitably used. A substrate in which a fibrous body is impregnated with a resin, a substrate whose linear thermal expansion coefficient is reduced by mixing an inorganic filler with a resin, or the like can also be used.

The flexible substrate may have a stacked-layer structure in which at least one of a hard coat layer (e.g., a silicon nitride layer) by which a surface of the device is protected from damage, a layer for dispersing pressure (e.g., an aramid resin layer), and the like is stacked over a layer of any of the above-mentioned materials. A substrate that can be used as the protective substrate 132 may be used.

When a glass layer is used for the flexible substrate, a barrier property against water and oxygen can be improved and thus a highly reliable display panel can be provided.

For the bonding layer, various curable adhesives such as a photocurable adhesive (e.g., an ultraviolet curable adhesive), a reactive curable adhesive, a thermosetting adhesive, and an anaerobic adhesive can be used. Alternatively, an adhesive sheet or the like may be used.

Furthermore, the bonding layer may include a drying agent. For example, it is possible to use a substance that adsorbs moisture by chemical adsorption, such as oxide of an alkaline earth metal (e.g., calcium oxide or barium oxide). Alternatively, it is possible to use a substance that adsorbs moisture by physical adsorption, such as zeolite or silica gel. The drying agent is preferably included because entry of impurities such as moisture into the functional element can be suppressed, thereby improving the reliability of the display panel.

When a filler with a high refractive index or a light scattering member is contained in the bonding layer, the efficiency of light extraction from the light-emitting element can be improved. For example, titanium oxide, barium oxide, zeolite, or zirconium can be used.

As the light-emitting element, a self-luminous element can be used, and an element whose luminance is controlled by current or voltage is included in the category of the light-emitting element. For example, a light-emitting diode (LED), an organic EL element, an inorganic EL element, or the like can be used. Any of a variety of display elements can be used in the display panel of one embodiment of the present invention. For example, a liquid crystal element, an electrophoretic element, a display element using MEMS, or the like may be used.

The light-emitting element may be a top-emission, bottom-emission, or dual-emission light-emitting element. A conductive film that transmits visible light is used as the electrode through which light is extracted. A conductive film that reflects visible light is preferably used as the electrode through which light is not extracted.

The conductive film that transmits visible light can be formed using, for example, indium oxide, ITO, indium zinc oxide, zinc oxide (ZnO), or ZnO to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be formed thin so as to have a light-transmitting property. Alternatively, a stacked film of any of the above materials can be used as the conductive film. For example, a stacked film of ITO and an alloy of silver and magnesium is preferably used, in which case conductivity can be increased. Further alternatively, graphene or the like may be used.

For the conductive film that reflects visible light, for example, a metal material such as aluminum, gold, platinum, silver, nickel, tungsten, chromium, molybdenum, iron, cobalt, copper, or palladium or an alloy containing any of these metal materials can be used. Furthermore, lanthanum, neodymium, germanium, or the like may be added to the metal material or the alloy. Furthermore, an alloy containing aluminum (an aluminum alloy) such as an alloy of aluminum and titanium, an alloy of aluminum and nickel, an alloy of aluminum and neodymium, or an alloy of aluminum, nickel, and lanthanum (Al—Ni—La); or an alloy containing silver such as an alloy of silver and copper, an alloy of silver, palladium, and copper (also referred to as Ag—Pd—Cu or APC), or an alloy of silver and magnesium may be used. An alloy containing silver and copper is preferable because of its high heat resistance. Furthermore, when a metal film or a metal oxide film is stacked on and in contact with an aluminum alloy film, oxidation of the aluminum alloy film can be suppressed. Examples of materials for the metal film or the metal oxide film include titanium and titanium oxide. Alternatively, the above conductive film that transmits visible light and a film containing a metal material may be stacked. For example, a stacked film of silver and ITO or a stacked film of an alloy of silver and magnesium and ITO can be used.

Each of the electrodes can be formed by an evaporation method or a sputtering method. Alternatively, a discharging method such as an inkjet method, a printing method such as a screen printing method, or a plating method may be used.

The EL layer 322 includes at least one light-emitting layer. The EL layer 322 may include a plurality of light-emitting layers. In addition to the light-emitting layer, the EL layer 322 can further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer 322, either a low molecular compound or a high molecular compound can be used, and an inorganic compound may also be used. Each of the layers included in the EL layer 322 can be formed by any of the following methods: an evaporation method (including a vacuum evaporation method), a transfer method, a printing method, an inkjet method, a coating method, and the like.

The light-emitting element 304 may contain two or more kinds of light-emitting substances. Thus, for example, a light-emitting element that emits white light can be achieved. For example, light-emitting substances are selected so that two or more kinds of light-emitting substances emit complementary colors to obtain white light emission. A light-emitting substance that emits red (R) light, green (G) light, blue (B) light, yellow (Y) light, or orange (O) light or a light-emitting substance that emits light containing spectral components of two or more of R light, G light, and B light can be used, for example.

Moreover, the light-emitting element 304 may be a single element including one EL layer or a tandem element in which EL layers are stacked with a charge generation layer provided therebetween.

The structure of the transistors in the display panel is not particularly limited. For example, a planar transistor, a forward staggered transistor, or an inverted staggered transistor may be used. A top-gate transistor or a bottom-gate transistor may be used. Gate electrodes may be provided above and below a channel.

There is no particular limitation on the crystallinity of a semiconductor material used for the transistors, and an amorphous semiconductor or a semiconductor having crystallinity (a microcrystalline semiconductor, a polycrystalline semiconductor, a single crystal semiconductor, or a semiconductor partly including crystal regions) may be used. It is preferable that a semiconductor having crystallinity be used, in which case deterioration of the transistor characteristics can be suppressed.

A semiconductor material used for the semiconductor layer of the transistor is not particularly limited, and for example, a Group 14 element, a compound semiconductor, or an oxide semiconductor can be used. Typically, a semiconductor containing silicon, a semiconductor containing gallium arsenide, an oxide semiconductor containing indium, or the like can be used.

An oxide semiconductor is preferably used as a semiconductor where a channel of the transistor is formed. In particular, an oxide semiconductor having a wider band gap than silicon is preferably used. A semiconductor material having a wider band gap and a lower carrier density than silicon is preferably used because off-state current of the transistor can be reduced.

For example, the oxide semiconductor preferably contains at least indium (In) or zinc (Zn). Further preferably, the oxide semiconductor contains an oxide represented by an In-M-Zn oxide (M is a metal such as Al, Ti, Ga, Ge, Y, Zr, Sn, La, Ce, Hf, or Nd).

A c-axis aligned crystalline oxide semiconductor (CAAC-OS) is preferably used as a semiconductor material for the transistors. Unlike an amorphous semiconductor, the CAAC-OS has few defect states, so that the reliability of the transistor can be improved. Moreover, since no grain boundary is observed in the CAAC-OS, a stable and uniform film can be formed over a large area, and stress that is caused by bending a flexible display device does not easily make a crack in a CAAC-OS film.

The CAAC-OS is a crystalline oxide semiconductor in which c-axes of crystals are oriented in a direction substantially perpendicular to the film surface. It has been found that oxide semiconductors have a variety of crystal structures other than a single-crystal structure. An example of such structures is a nano-crystal (nc) structure, which is an aggregate of nanoscale microcrystals. The crystallinity of a CAAC-OS structure is lower than that of a single-crystal structure and higher than that of an nc structure.

The CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

An organic insulating material or an inorganic insulating material can be used for the insulating layers included in the display panel. Examples of resins include an acrylic resin, an epoxy resin, a polyimide resin, a polyamide resin, a polyimide-amide resin, a siloxane resin, a benzocyclobutene-based resin, and a phenol resin. Examples of inorganic insulating films include a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film.

The conductive layers included in the display panel can each have a single-layer structure or a stacked-layer structure including any of metals such as aluminum, titanium, chromium, nickel, copper, yttrium, zirconium, molybdenum, silver, tantalum, and tungsten or an alloy containing any of these metals as its main component. Alternatively, a light-transmitting conductive material such as indium oxide, ITO, indium oxide containing tungsten, indium zinc oxide containing tungsten, indium oxide containing titanium, ITO containing titanium, indium zinc oxide, ZnO, ZnO to which gallium is added, or indium tin oxide containing silicon may be used. Alternatively, a semiconductor such as an oxide semiconductor or polycrystalline silicon whose resistance is lowered by containing an impurity element or the like, or silicide such as nickel silicide may be used. A film including graphene may be used as well. The film including graphene can be formed, for example, by reducing a film containing graphene oxide. A semiconductor such as an oxide semiconductor containing an impurity element may be used. Alternatively, the conductive layers may be formed using a conductive paste of silver, carbon, copper, or the like or a conductive polymer such as a polythiophene. A conductive paste is preferable because it is inexpensive. A conductive polymer is preferable because it is easily applied.

Figure 17:
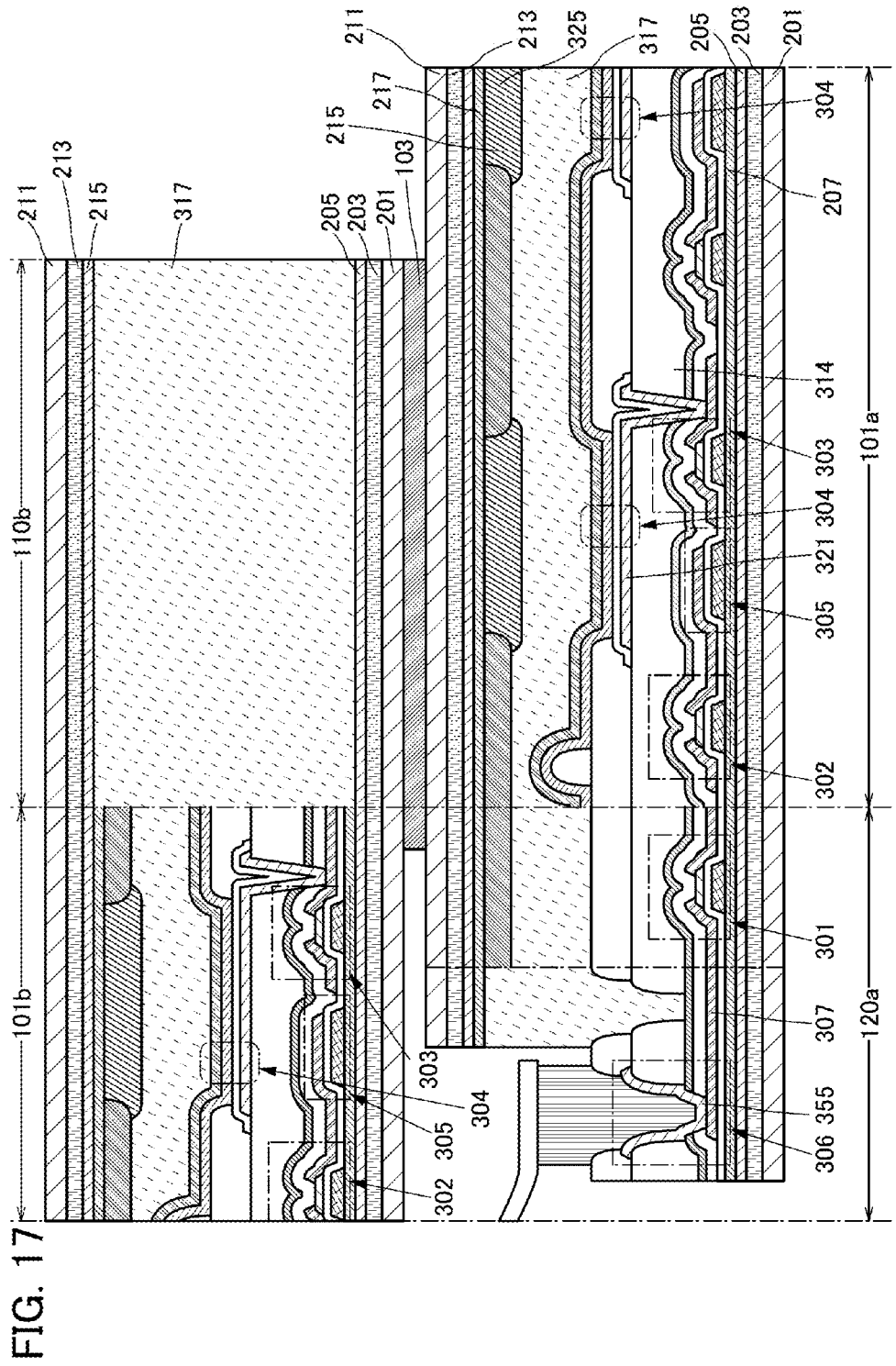
FIG. 17 is a cross-sectional view illustrating an example of a display device.

FIG. 17 is an example of a cross-sectional view of a display device including two display panels 370 illustrated in FIG. 16C that overlap with each other.

FIG. 17 illustrates the display region 101*a* (corresponding to the display portion 381 in FIG. 16C) and the region 120*a* that blocks visible light (corresponding to the driver circuit portion 382 and the like in FIG. 16C) of a lower display panel, and the display region 101*b* (corresponding to the display portion 381 in FIG. 16C) and the region 110*b* that transmits visible light (corresponding to the region 110 that transmits visible light in FIG. 16C) of an upper display panel.

In the display device illustrated in FIG. 17, the display panel positioned on the display surface side (upper side) includes the region 110*b* that transmits visible light adjacent to the display region 101*b*. The display region 101*a* of the lower display panel and the region 110*b* that transmits visible light of the upper display panel overlap with each other. Thus, a non-display region that appears between the display regions of the two display panels overlapping with each other can be reduced or even removed. Accordingly, a large display device in which a seam between display panels is less likely to be noticed by a user can be obtained.

The display device illustrated in FIG. 17 includes the light-transmitting layer 103 having a refractive index higher than that of air and transmitting visible light between the display region 101a and the region 110b that transmits visible light. In that case, air can be prevented from entering between the display region 101a and the region 110b that transmits visible light, so that the interface reflection due to a difference in refractive index can be reduced. In addition, display unevenness or luminance unevenness of the display device can be suppressed.

The light-transmitting layer 103 may overlap with the entire surface of the substrate 211 of the lower display panel or that of the substrate 201 of the upper display panel, or may overlap with only the display region 101a and the region 110b that transmits visible light. In addition, the light-transmitting layer 103 may overlap with the region 120a that blocks visible light.

For example, an attachment film in which attachment layers are provided on both surfaces of a base material can be used as the light-transmitting layer 103.

The reflection of light in the region 110b that transmits visible light is suppressed. Thus, an area in which the two display panels overlap with each other (an overlapping area) is less likely to be seen by a user of the display device. Moreover, in the display in the display region 101a, a difference in luminance between a portion seen through the region 110b that transmits visible light and a portion seen not through the region can be small.

<Structure Example 2>

FIG. 19A shows a cross-sectional view of a display panel employing a color filter method. Note that in the following structure examples, components similar to those in the above structure example are not described in detail.

The display panel in FIG. 19A includes the substrate 201, the bonding layer 203, the first insulating layer 205, the second insulating layer 207, a plurality of transistors, the conductive layer 307, the insulating layer 312, the insulating layer 313, the insulating layer 314, the insulating layer 315, the light-emitting element 304, the insulating layer 208, the conductive layer 355, the bonding layer 317, the coloring layer 325, and the substrate 211.

The driver circuit portion 382 includes the transistor 301. The display portion 381 includes the transistor 303.

Each transistor includes two gates, the gate insulating layer 311, a semiconductor layer, a source, and a drain. FIG. 19A illustrates an example in which one of the gates is formed using the same material and the same step as the electrode 321.

The light-emitting element 304 emits light to the coloring layer 325 side. The light-emitting element 304 overlaps with the coloring layer 325 with the insulating layer 314 provided therebetween. The coloring layer 325 is provided between the light-emitting element 304 and the substrate 201. FIG. 19A illustrates an example in which the coloring layer 325 is provided over the insulating layer 313. In the example illustrated in FIG. 19A, a light-blocking layer and a spacer are not provided.

The insulating layer 208 serves as a sealing layer for the light-emitting element 304. As the insulating layer 208, an insulating film with high resistance to moisture is preferable used.

In the display portion 381, the light-emitting element 304 is positioned between the second insulating layer 207 and the insulating layer 208. Entry of impurities into the light-emitting element 304 from the thickness direction of the display panel 370 is suppressed. Similarly, a plurality of insulating layers covering the transistors are provided in the display portion 381, and thus entry of impurities into the transistors is suppressed.

The display panel illustrated in FIG. 19A has a structure in which the reflection of light in the region 110 that transmits visible light is suppressed. The region 110 that transmits visible light includes the substrate 201, the bonding layer 203, the first insulating layer 205, the bonding layer 317, and the substrate 211 that are stacked in this order.

The second insulating layer 207, the insulating layer 208, the gate insulating layer 311, the insulating layer 312, the insulating layer 313, the insulating layer 314, and the insulating layer 315 are provided in the display portion 381 and not provided in the region 110 that transmits visible light.

The first insulating layer 205 and the substrate 201 are attached to each other with the bonding layer 203. In the method for manufacturing a display panel of one embodiment of the present invention, the first insulating layer 205 is positioned in the separation interface with the formation substrate and provided over the entire area of the display panel 370. Thus, the display panel 370 can be manufactured with high yield.

<Structure Example 3>

FIG. 19B shows a cross-sectional view of a display panel employing a separate coloring method.

The display panel in FIG. 19B includes the substrate 201, the bonding layer 203, the first insulating layer 205, the second insulating layer 207, a plurality of transistors, the conductive layer 307, the insulating layer 312, the insulating layer 313, the insulating layer 314, the insulating layer 315, the spacer 316, the light-emitting element 304, the insulating layer 208, the bonding layer 317, and the substrate 211.

The driver circuit portion 382 includes the transistor 301. The display portion 381 includes the transistor 302, the transistor 303, and the capacitor 305.

Each transistor includes two gates, the gate insulating layer 311, a semiconductor layer, a source, and a drain. FIG. 19B illustrates an example where each transistor has a structure in which the semiconductor layer is sandwiched between the two gates. In the example illustrated in FIG. 19B, one of the gates is formed between the insulating layer 313 and the insulating layer 314.

The light-emitting element 304 emits light to the substrate 211 side. In the example illustrated in FIG. 19B, the light-emitting element 304 does not include an optical adjustment layer.

The display panel illustrated in FIG. 19B has a structure in which the reflection of light in the region 110 that transmits visible light is suppressed. Specifically, the second insulating layer 207, the insulating layer 208, the gate insulating layer 311, the insulating layer 312, and the insulating layer 313 are provided in the display portion 381 and not provided in the region 110 that transmits visible light. Furthermore, FIG. 19B illustrates an example in which the end portions of the insulating layer 314 and the insulating layer 315 are positioned in the region 110 that transmits visible light. Similarly, the end portions of the second insulating layer 207, the insulating layer 208, the gate insulating layer 311, the insulating layer 312, and the insulating layer 313 are also positioned in the region 110 that transmits visible light in some cases. That is, each of the insulating layers is provided in the display portion 381 and not provided in at least part of the region 110 that transmits visible light.

The connection portion 306 includes the conductive layer 307. The conductive layer 307 is electrically connected to the FPC 373 through the connector 319.

<Touch Panel>

In one embodiment of the present invention, a display panel provided with a touch sensor (also referred to as an input/output unit or a touch panel) can be manufactured.

There is no particular limitation on a sensor element included in the touch panel of one embodiment of the present invention. Note that a variety of sensors that can sense proximity or touch of a sensing target such as a finger or a stylus can be used as the sensor element.

For example, a variety of types such as a capacitive type, a resistive type, a surface acoustic wave type, an infrared type, an optical type, and a pressure-sensitive type can be used for the sensor.

In this embodiment, a touch panel including a capacitive sensor element is described as an example.

Examples of the capacitive sensor element include a surface capacitive sensor element and a projected capacitive sensor element. Examples of the projected capacitive sensor element include a self-capacitive sensor element and a mutual capacitive sensor element. The use of a mutual capacitive sensor element is preferable because multiple points can be sensed simultaneously.

The touch panel of one embodiment of the present invention can have any of a variety of structures, including a structure in which a display panel and a sensor element that are separately formed are attached to each other and a structure in which an electrode and the like included in a sensor element are provided on one or both of a substrate supporting a display element and a counter substrate.

<Structure Example 4>

Figure 20A:
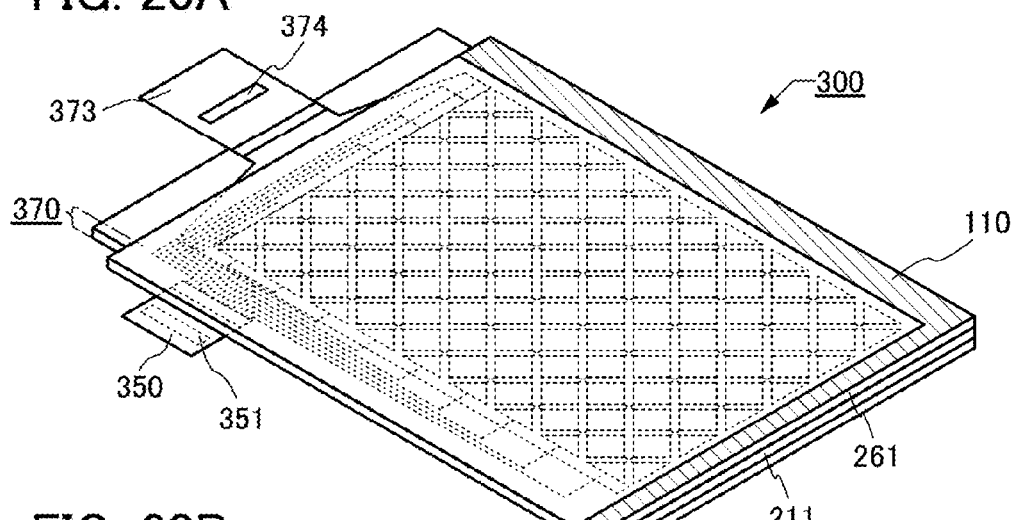
FIGS. 20A and 20B are perspective views illustrating an example of a touch panel.
Figure 20B:
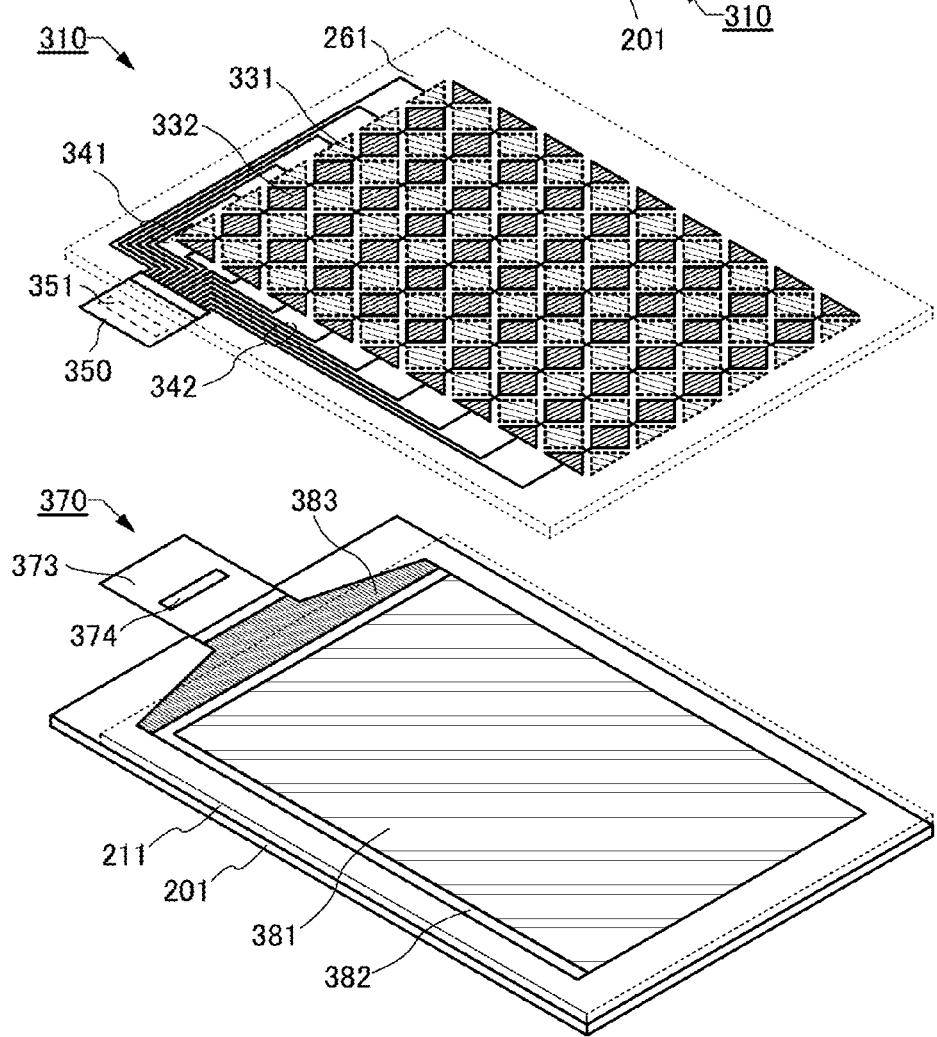

FIG. 20A is a schematic perspective view of a touch panel 300. FIG. 20B is a developed view of the schematic perspective view of FIG. 20A. Note that only typical components are illustrated for simplicity. In FIG. 20B, some components (such as a substrate 261 and the substrate 211) are illustrated only in dashed outline.

The touch panel 300 includes an input device 310 and the display panel 370, which are provided to overlap with each other. The touch panel 300 includes the region 110 that transmits visible light. The region 110 that transmits visible light is adjacent to the display portion 381 and provided along two sides of the display portion 381.

The input device 310 includes the substrate 261, an electrode 331, an electrode 332, a plurality of wirings 341, and a plurality of wirings 342. An FPC 350 is electrically connected to each of the plurality of wirings 341 and the plurality of wirings 342. The FPC 350 is provided with an IC 351.

The display panel 370 includes the substrate 201 and the substrate 211 that are provided so as to face each other. The display panel 370 includes the display portion 381 and the driver circuit portion 382. A wiring 383 and the like are provided over the substrate 201. The FPC 373 is electrically connected to the wiring 383. The FPC 373 is provided with an IC 374.

The wiring 383 has a function of supplying a signal and power to the display portion 381 and the driver circuit portion 382. The signal and power are each input to the wiring 383 from the outside or the IC 374 through the FPC 373.

Figure 21:
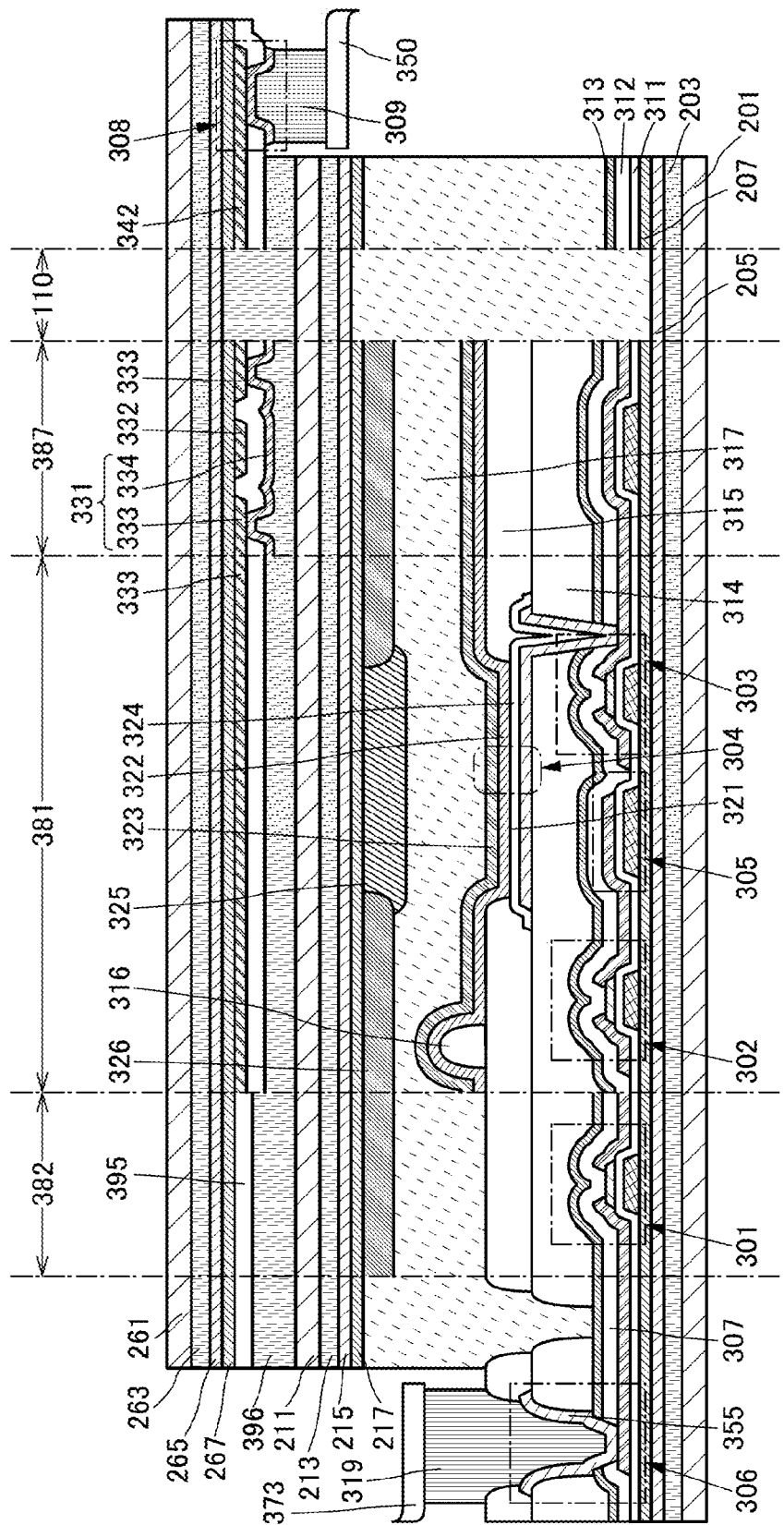
FIG. 21 is a cross-sectional view illustrating an example of a touch panel.

FIG. 21 illustrates an example of a cross-sectional view of the touch panel 300. FIG. 21 shows cross-sectional structures of the display portion 381, the driver circuit portion 382, the region 110 that transmits visible light, the region including the FPC 373, the region including the FPC 350, and the like. Furthermore, FIG. 21 illustrates a cross-sectional structure of a crossing portion 387 where a wiring formed by processing a conductive layer used for forming the gate of the transistor and a wiring formed by processing a conductive layer used for forming the source and the drain of the transistor cross each other.

The substrate 201 and the substrate 211 are attached to each other with the bonding layer 317. The substrate 211 and the substrate 261 are attached to each other with a bonding layer 396. Here, the layers from the substrate 201 to the substrate 211 correspond to the display panel 370. Furthermore, the layers from the substrate 261 to an electrode 334 correspond to the input device 310. In other words, the bonding layer 396 attaches the display panel 370 and the input device 310 to each other.

Alternatively, the layers from the substrate 201 to the third insulating layer 215 correspond to the display panel 370. Furthermore, the layers from the substrate 261 to the substrate 211 correspond to the input device 310. In other words, the bonding layer 213 attaches the display panel 370 and the input device 310 to each other.

The structure of the display panel 370 shown in FIG. 21 is similar to that of the display panel shown in FIGS. 16A to 16C and is thus not described in detail.

<Input Device 310>

On the substrate 211 side of the substrate 261, the electrode 331 and the electrode 332 are provided. An example where the electrode 331 includes an electrode 333 and the electrode 334 is described here. As illustrated in the crossing portion 387 in FIG. 21, the electrodes 332 and 333 are formed on the same plane. An insulating layer 395 is provided to cover the electrode 332 and the electrode 333. The electrode 334 electrically connects two electrodes 333, between which the electrode 332 is provided, through openings formed in the insulating layer 395.

In a region near the end portion of the substrate 261, a connection portion 308 is provided. The connection portion 308 has a stack of a wiring 342 and a conductive layer formed by processing a conductive layer used for forming the electrode 334. The connection portion 308 is electrically connected to the FPC 350 through a connector 309.

The input device 310 has a structure in which the reflection of light in the region 110 that transmits visible light is suppressed. A sixth insulating layer 267 and the insulating layer 395 are provided in the display portion 381 and are not provided in the region 110 that transmits visible light.

The region 110 that transmits visible light of the touch panel 300 includes the substrate 201, the bonding layer 203, the first insulating layer 205, the bonding layer 317, the third insulating layer 215, the bonding layer 213, the substrate 211, the bonding layer 396, a fifth insulating layer 265, a bonding layer 263, and the substrate 261 that are stacked in this order.

Even in the case where two or more touch panels 300 overlap with each other, an area in which a plurality of touch panels 300 overlap with each other (overlapping area) is less likely to be noticed by a user of the touch panel. In addition, the difference in the luminance of display on the display portion 381 between a portion seen through the region 110 that transmits visible light and a portion seen not through the region can be small.

The substrate 261 is attached to the fifth insulating layer 265 with the bonding layer 263. As in the manufacturing method for the display panel 370, the input device 310 can also be manufactured by forming elements over a formation substrate, separating the formation substrate, and then transferring the elements to the substrate 261. In the method for manufacturing an input device of one embodiment of the present invention, the fifth insulating layer 265 is positioned in the separation interface with the formation substrate and provided over the entire area of the input device 310. Thus, the input device 310 can be manufactured with high yield.

Figure 22:
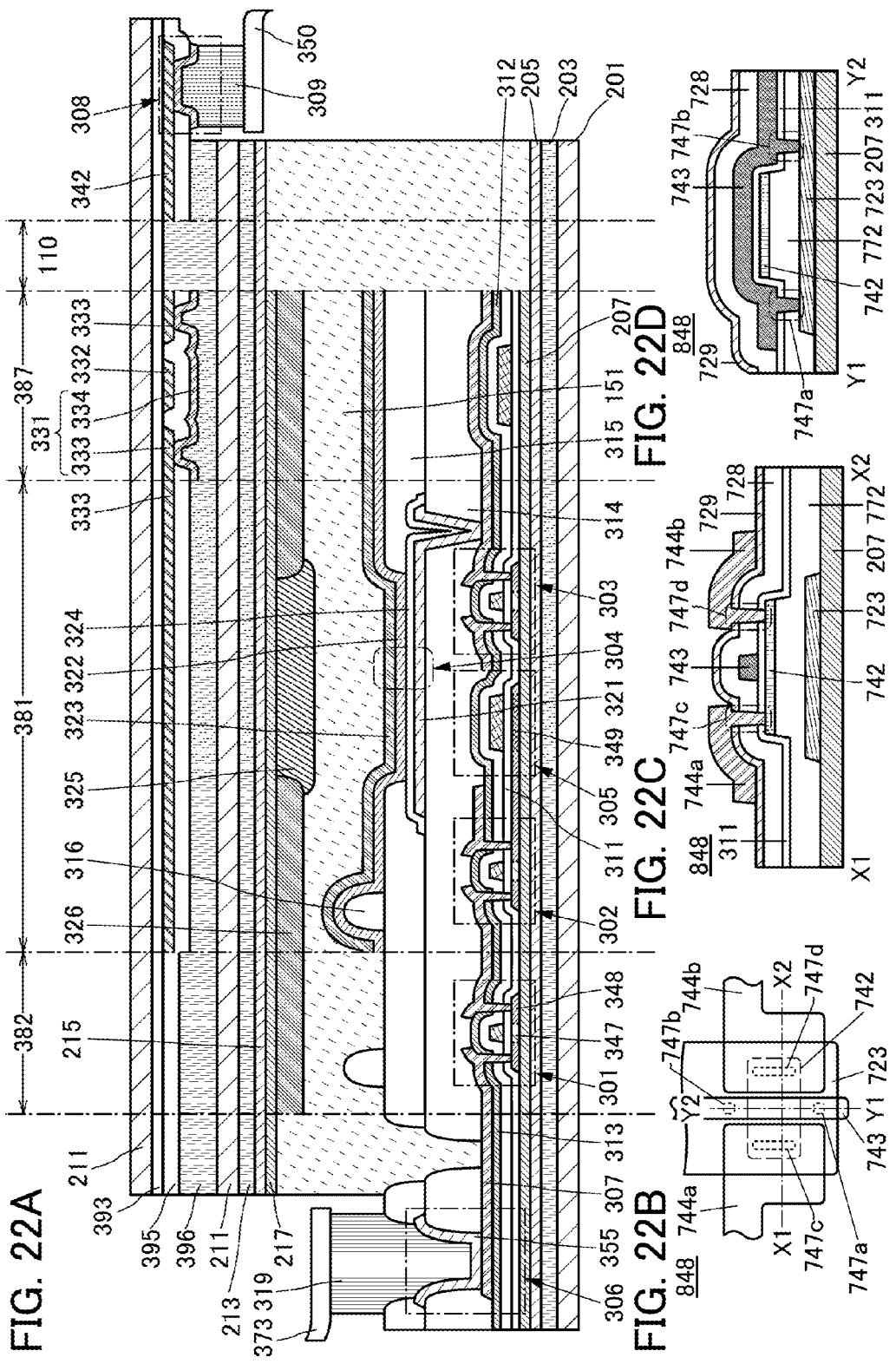
FIG. 22A is a cross-sectional view illustrating an example of a touch panel and FIGS. 22B to 22D are a top view and cross-sectional views of a transistor.

Alternatively, the insulating layer, the elements, and the like may be directly formed on the substrate 261 (see FIG. 22A).

<Structure Example 5>

The touch panel shown in FIG. 22A is different from the touch panel in FIG. 21 in the structures of the transistors 301, 302, and 303 and the capacitor 305 and in that the bonding layer 263, the fifth insulating layer 265, and the sixth insulating layer 267 are not included and an insulating layer 393 is included.

FIG. 22A illustrates an example of using a top-gate transistor in the touch panel.

Each transistor includes a gate, the gate insulating layer 311, a semiconductor layer, a source, and a drain. The gate and the semiconductor layer overlap with each other with the gate insulating layer 311 provided therebetween. The semiconductor layer may include low-resistance regions 348. The low-resistance regions 348 function as the source and drain of the transistor.

The conductive layer over the insulating layer 313 functions as a lead wiring. The conductive layer is electrically connected to the region 348 through an opening provided in the insulating layer 313, the insulating layer 312, and the gate insulating layer 311.

In FIG. 22A, the capacitor 305 has a stacked-layer structure that includes a layer formed by processing a semiconductor layer used for forming the above-described semiconductor layer, the gate insulating layer 311, and a layer formed by processing a conductive layer used for forming the gate. Here, part of the semiconductor layer of the capacitor 305 preferably has a region 349 having a higher conductivity than a region 347 where the channel of the transistor is formed.

The region 348 and the region 349 each can be a region containing more impurities than the region 347 where the channel of the transistor is formed, a region with a high carrier concentration, a region with low crystallinity, or the like.

A transistor 848 illustrated in FIGS. 22B to 22D can be used in the display panel of one embodiment of the present invention.

FIG. 22B is a top view of the transistor 848. FIG. 22C is a cross-sectional view in the channel length direction of the transistor 848 in the display panel of one embodiment of the present invention. The cross section of the transistor 848 illustrated in FIG. 22C is taken along the dashed-dotted line X1-X2 in FIG. 22B. FIG. 22D is a cross-sectional view in the channel width direction of the transistor 848 in the display panel of one embodiment of the present invention. The cross section of the transistor 848 illustrated in FIG. 22D is taken along the dashed-dotted line Y1-Y2 in FIG. 22B.

The transistor 848 is a type of top-gate transistor including a back gate.

In the transistor 848, a semiconductor layer 742 is formed over a projection of an insulating layer 772. When the semiconductor layer 742 is provided over the projection of the insulating layer 772, the side surface of the semiconductor layer 742 can also be covered with a gate 743. Thus, the transistor 848 has a structure in which the semiconductor layer 742 can be electrically surrounded by an electric field of the gate 743. Such a structure of a transistor in which a semiconductor film in which a channel is formed is electrically surrounded by an electric field of a conductive film is called a surrounded channel (s-channel) structure. A transistor with an s-channel structure is referred to as an s-channel transistor.

In the s-channel structure, a channel can be formed in the whole (bulk) of the semiconductor layer 742. In the s-channel structure, the drain current of the transistor can be increased, so that a larger amount of on-state current can be obtained. Furthermore, the entire channel formation region of the semiconductor layer 742 can be depleted by the electric field of the gate 743. Accordingly, the off-state current of the transistor with the s-channel structure can further be reduced.

A back gate 723 is provided over the second insulating layer 207.

A conductive layer 744a provided over an insulating layer 729 is electrically connected to the semiconductor layer 742 through an opening 747c formed in the gate insulating layer 311, an insulating layer 728, and the insulating layer 729. A conductive layer 744b provided over the insulating layer 729 is electrically connected to the semiconductor layer 742 through an opening 747d formed in the gate insulating layer 311 and the insulating layers 728 and 729.

The gate 743 provided over the gate insulating layer 311 is electrically connected to the back gate 723 through an opening 747a and an opening 747b formed in the gate insulating layer 311 and the insulating layer 772. Accordingly, the same potential is supplied to the gate 743 and the back gate 723. Furthermore, either or both of the openings 747a and 747b may be omitted. In the case where both the openings 747a and 747b are omitted, different potentials can be supplied to the back gate 723 and the gate 743.

As a semiconductor in the transistor having the s-channel structure, an oxide semiconductor, silicon such as polycrystalline silicon or single crystal silicon that is transferred from a single crystal silicon substrate, or the like is used.

The input device 310 has a structure in which the reflection of light in the region 110 that transmits visible light is suppressed. Specifically, the insulating layer 395 is provided in the display portion 381 and are not provided in the region 110 that transmits visible light. Furthermore, the region 110 that transmits visible light does not have to include the insulating layer 393.

<Structure Example 6>

Figure 23:
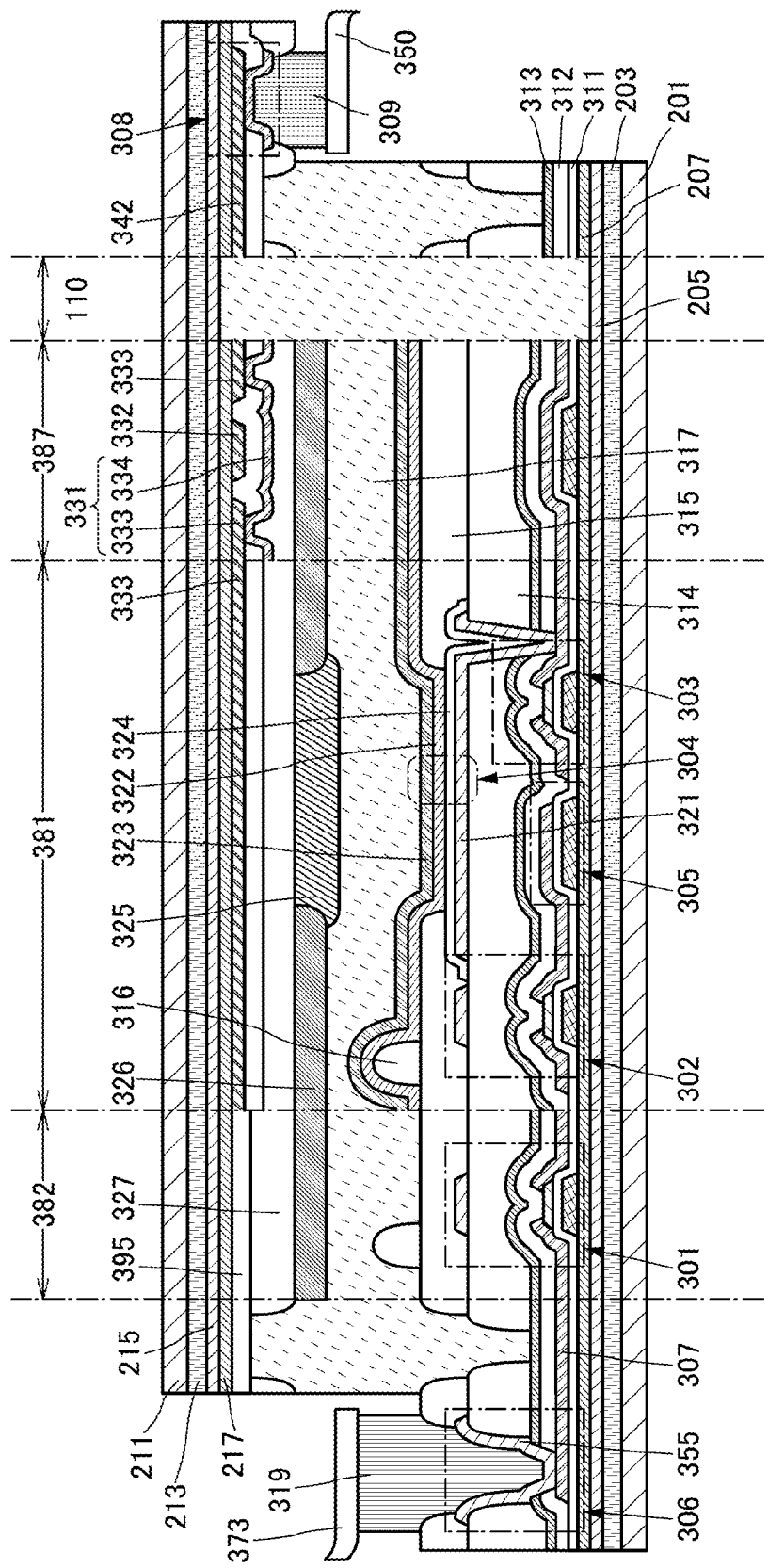
FIG. 23 is a cross-sectional view illustrating an example of a touch panel.

FIG. 23 shows an example in which a touch sensor and the light-emitting element 304 are provided between a pair of flexible substrates (the substrate 201 and the substrate 211). When two flexible substrates are used, the touch panel can be thin, lightweight, and flexible.

The structure in FIG. 23 can be fabricated by changing the structure of the layer to be separated that is formed over the formation substrate in the method for manufacturing a display panel.

The structure of FIG. 16C can be fabricated by forming the third insulating layer 215, the fourth insulating layer 217, the coloring layer 325, and the light-blocking layer 326 as layers to be separated over formation substrate.

In contrast, in the case where the structure illustrated in FIG. 23 is fabricated, the third insulating layer 215 and the fourth insulating layer 217 are formed, and then the electrode 332, the electrode 333, and the wiring 342 are formed over the fourth insulating layer 217. Then, the insulating layer 395 covering these electrodes is formed. Next, the electrode 334 is formed over the insulating layer 395. Then, an insulating layer 327 covering the electrode 334 is formed.

After that, the coloring layer 325 and the light-blocking layer 326 are formed over the insulating layer 327. Then, attachment to the formation substrate 231 is performed, the formation substrates are separated, and the flexible substrate is attached; thus, the touch panel having the structure in FIG. 23 can be fabricated.

The touch panel illustrated in FIG. 23 has a structure in which the reflection of light in the region 110 that transmits visible light is suppressed. Specifically, the second insulating layer 207, the fourth insulating layer 217, the gate insulating layer 311, the insulating layer 312, the insulating layer 313, the insulating layer 314, the insulating layer 315, the insulating layer 395, and the insulating layer 327 are provided in the display portion 381 and not provided in the region 110 that transmits visible light.

<Structure Example 7>

Figure 24A:
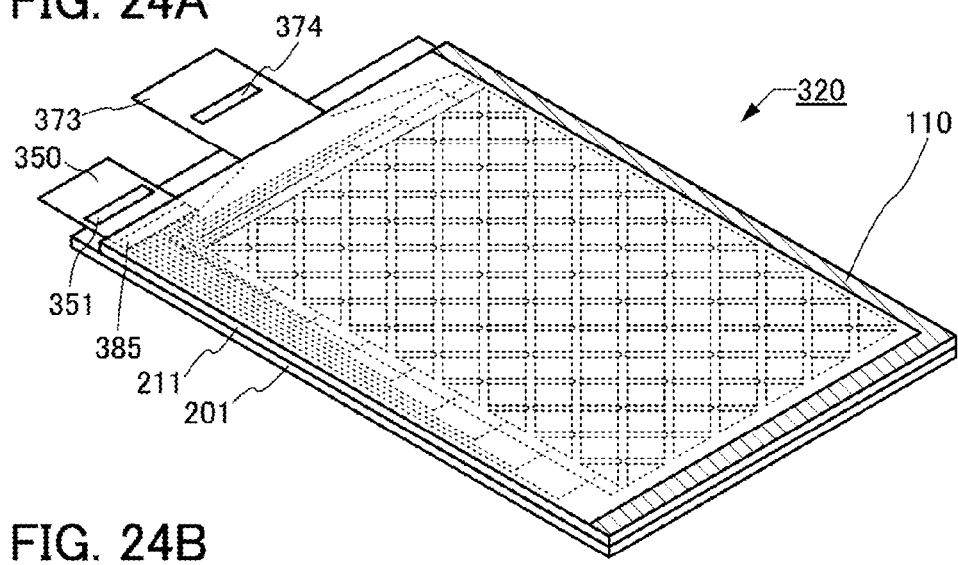
FIGS. 24A and 24B are perspective views illustrating an example of a touch panel.
Figure 24B:
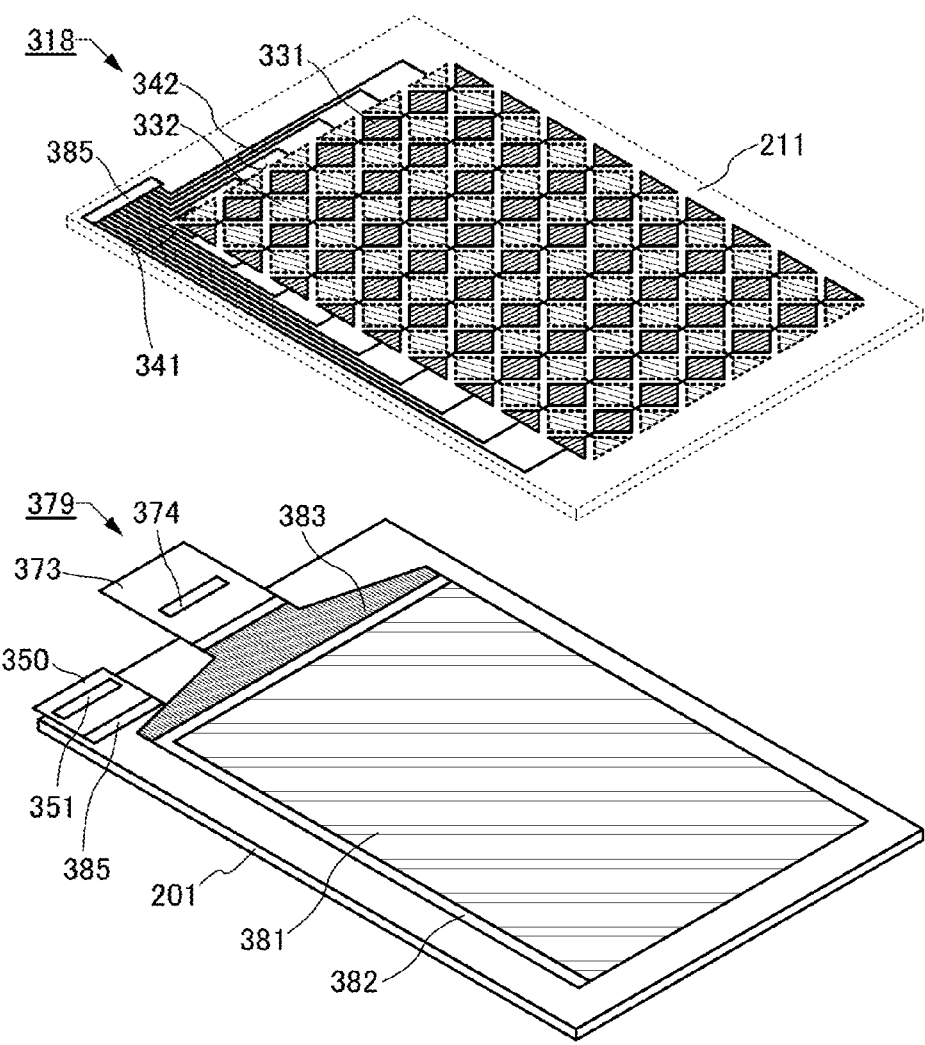

FIGS. 24A and 24B are schematic perspective views of a touch panel 320.

The touch panel 320 includes the region 110 that transmits visible light. The region 110 that transmits visible light is adjacent to the display portion 381 and provided along two sides of the display portion 381.

In FIGS. 24A and 24B, the substrate 211 of a display panel 379 is provided with an input device 318. The wiring 341, the wiring 342, and the like of the input device 318 are electrically connected to the FPC 350 provided for the display panel 379.

With the above structure, the FPC connected to the touch panel 320 can be provided only on one substrate side (on the substrate 201 side in this embodiment). FIGS. 24A and 24B illustrate the structure in which the touch panel 320 is provided with two FPCs. The touch panel 320 is not necessarily provided with a plurality of FPCs. When the touch panel 320 is provided with one FPC and signals are supplied to both the display panel 379 and the input device 318, the structure can be simplified.

The IC 374 has a function of driving the display panel 379. The IC 351 has a function of driving the input device 318.

Figure 25:
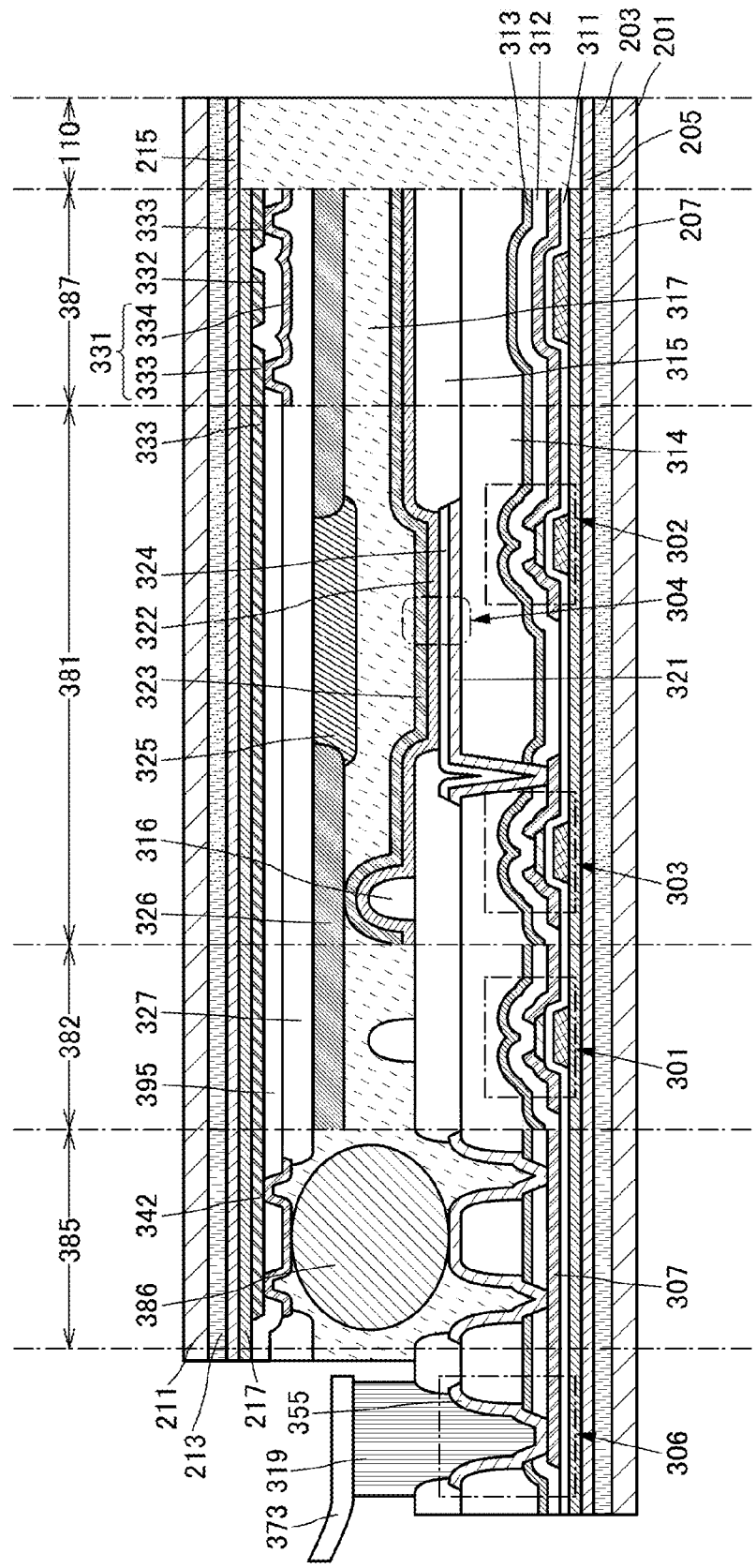
FIG. 25 is a cross-sectional view illustrating an example of a touch panel.

FIG. 25 illustrates an example of a cross-sectional view of the touch panel 320. FIG. 25 illustrates a cross-sectional structure of the display portion 381, the driver circuit portion 382, a connection portion 385, the region 110 that transmits visible light, the region including the FPC 373, and the like. Furthermore, FIG. 25 illustrates a cross-sectional structure of the crossing portion 387 where a wiring formed by processing a conductive layer used for forming the gate of the transistor and a wiring formed by processing a conductive layer used for forming the source and the drain of the transistor cross each other.

In the connection portion 385, one of the wirings 342 (or the wirings 341) and one of the conductive layers 307 are electrically connected to each other through a connector 386.

As the connector 386, a conductive particle can be used, for example. As the conductive particle, a particle of an organic resin, silica, or the like coated with a metal material can be used. It is preferable to use nickel or gold as the metal material because contact resistance can be decreased. It is also preferable to use a particle coated with layers of two or more kinds of metal materials, such as a particle coated with nickel and further with gold. As the connector 386, a material capable of elastic deformation or plastic deformation is preferably used. As illustrated in FIG. 25, the conductive particle has a shape that is vertically crushed in some cases. With the crushed shape, the contact area between the connector 386 and a conductive layer electrically connected to the connector 386 can be increased, thereby reducing contact resistance and suppressing the generation of problems such as disconnection.

The connector 386 is preferably provided so as to be covered with the bonding layer 317. For example, the connector 386 is dispersed in the bonding layer 317 before curing of the bonding layer 317. A structure in which the connection portion 385 is provided in a portion where the bonding layer 317 is provided can be similarly applied not only to a structure in which the bonding layer 317 is also provided over the light-emitting element 304 as illustrated in FIG. 25 (also referred to as a solid sealing structure) but also to, for example, a hollow sealing structure in which the bonding layer 317 is provided in the periphery of a light-emitting panel, a liquid crystal display panel, or the like.

FIG. 25 illustrates an example in which the optical adjustment layer 324 does not cover an end portion of the electrode 321. In the example in FIG. 25, the spacer 316 is also provided in the driver circuit portion 382.

The touch panel illustrated in FIG. 25 has a structure in which the reflection of light in the region 110 that transmits visible light is suppressed. Specifically, the second insulating layer 207, the fourth insulating layer 217, the gate insulating layer 311, the insulating layer 312, the insulating layer 313, the insulating layer 314, the insulating layer 315, the insulating layer 395, and the insulating layer 327 are provided in the display portion 381 and not provided in the region 110 that transmits visible light.

<Structure Example 8>

In a touch panel illustrated in FIG. 26A, the light-blocking layer 326 is provided between the electrodes and the like in the touch sensor and the substrate 211. Specifically, the light-blocking layer 326 is provided between the fourth insulating layer 217 and an insulating layer 328. When seen from the substrate 211 side, conductive layers such as the electrode 332, the electrode 333, and the wiring 342, the insulating layer 395 covering these components, the electrode 334 over the insulating layer 395, and the like are formed over the insulating layer 328. Furthermore, the insulating layer 327 is provided over the electrode 334 and the insulating layer 395, and the coloring layer 325 is provided over the insulating layer 327.

The insulating layers 327 and 328 have a function as a planarization film. Note that the insulating layers 327 and 328 are not necessarily provided when not needed.

With such a structure, the light-blocking layer 326 provided in a position closer to the substrate 211 than the electrodes and the like of the touch sensor can prevent the electrodes and the like from being seen by a user. Thus, a touch panel with not only a small thickness but also improved display quality can be achieved.

As illustrated in FIG. 26B, the touch panel may include a light-blocking layer 326a between the fourth insulating layer 217 and the insulating layer 328 and may include a light-blocking layer 326b between the insulating layer 327 and the bonding layer 317. Providing the light-blocking layer 326b can suppress light leakage more surely.

As described above, the display panel of this embodiment has a structure in which the number of interfaces having a large difference in refractive index that are included in the region that transmits visible light is small. Thus, the reflection of external light in the region that transmits visible light can be suppressed. Furthermore, the light transmittance in the region that transmits visible light can be increased. Thus, by using this structure for a display device of one embodiment of the present invention, a display device including a wide display region in which a seam is less likely to be noticed can be provided. In addition, display unevenness or luminance unevenness of the display device can be suppressed.

This embodiment can be combined with any of other embodiments as appropriate.

(Embodiment 3)

In this embodiment, a display panel that can be used for the display device of one embodiment of the present invention is described with reference to the drawings.

Note that detailed description of portions that are similar to those in Embodiment 2 is omitted.

Examples of cross-sectional structures of the boundary between the display portion 381 and the region 110 that transmits visible light of the display panel of one embodiment of the present invention are described with reference to FIGS. 27A, 27B and 28.

Figure 27A:
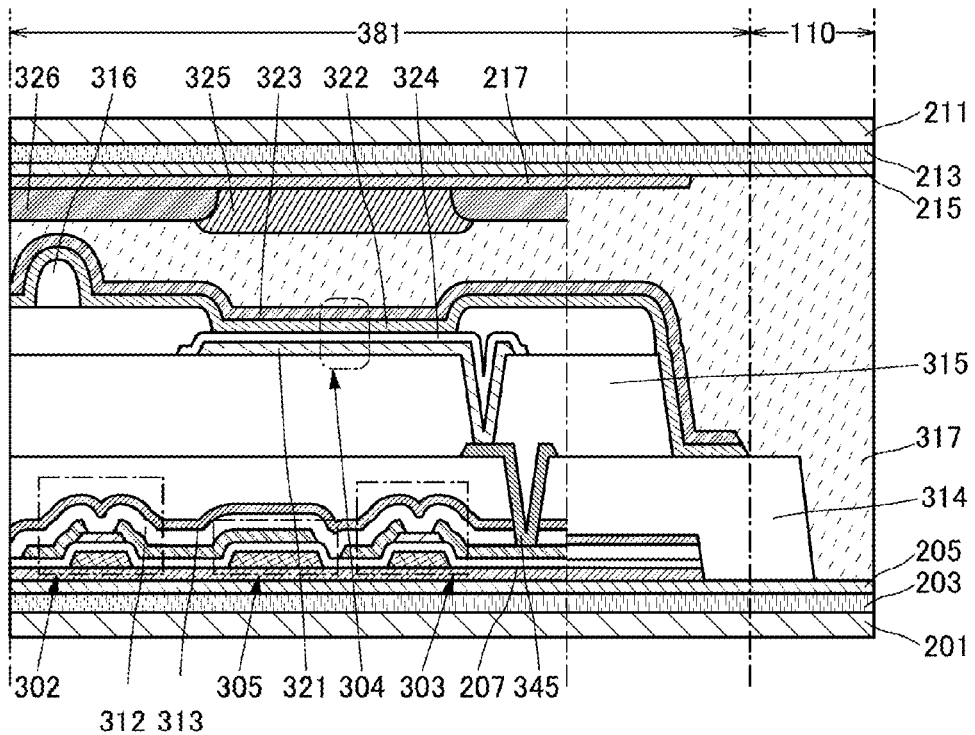
FIGS. 27A and 27B are cross-sectional views each illustrating an example of a display panel.
Figure 27B:
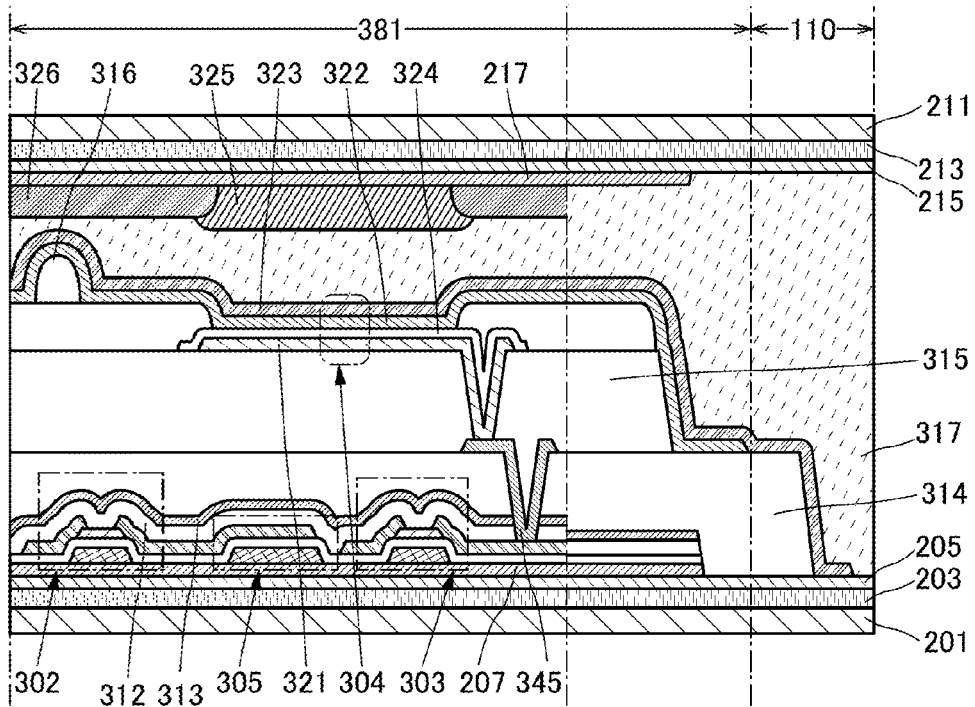
Figure 28:
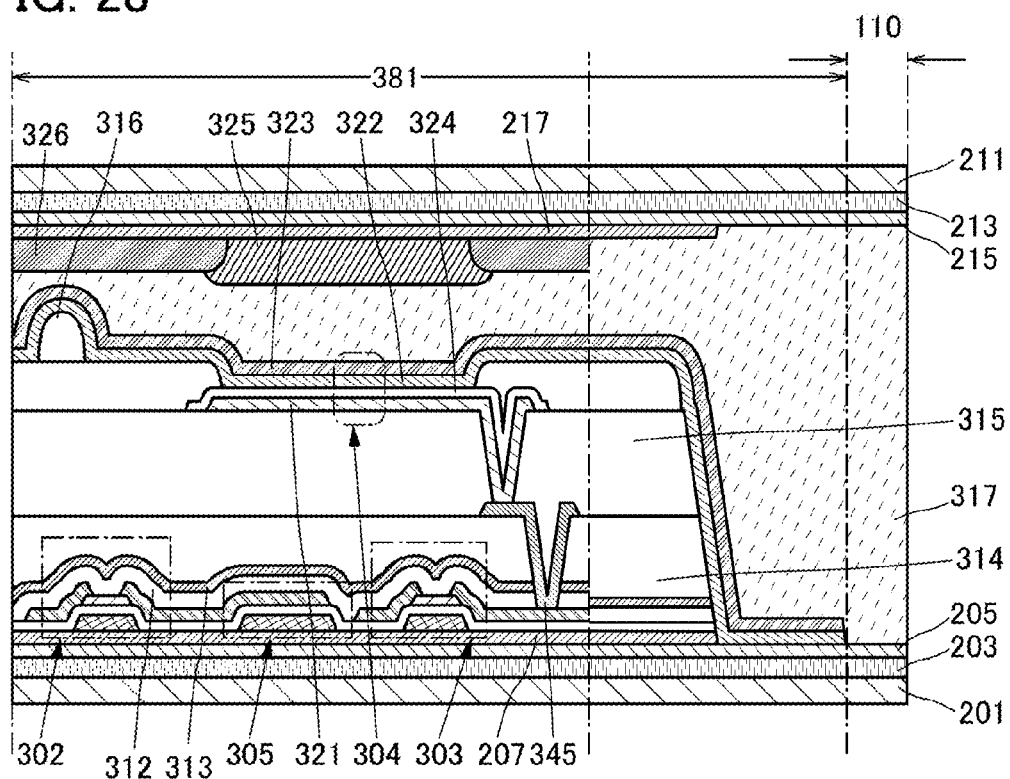
FIG. 28 is a cross-sectional view illustrating an example of a display panel.

Left side portions of FIGS. 27A, 27B and 28, i.e., the display portions 381 are common.

The display portion 381 includes the substrate 201, the bonding layer 203, the first insulating layer 205, the second insulating layer 207, the transistor 302, the transistor 303, the capacitor 305, a conductive layer 345, the insulating layer 312, the insulating layer 313, the insulating layer 314, the insulating layer 315, the light-emitting element 304, the spacer 316, the bonding layer 317, the coloring layer 325, the light-blocking layer 326, the substrate 211, the bonding layer 213, the third insulating layer 215, and the fourth insulating layer 217.

The light-emitting element 304 includes the electrode 321, the optical adjustment layer 324, the EL layer 322, and the electrode 323.

In FIGS. 27A and 27B, the insulating layer 314 covers an end portion of the second insulating layer 207, an end portion of a gate insulating layer of the transistor, an end portion of the insulating layer 312, and an end portion of the insulating layer 313. Moreover, an end portion of the insulating layer 315 is positioned inward from an end portion of the insulating layer 314 and is positioned over the insulating layer 314. An end portion of the EL layer 322 is in contact with the insulating layer 314.

In contrast, in FIG. 28, the end portion of the second insulating layer 207, the end portion of a gate insulating layer of the transistor, the end portion of the insulating layer 312, the end portion of the insulating layer 313, the end portion of the insulating layer 314, and the end portion of the insulating layer 315 are all aligned. The end portion of the EL layer 322 is in contact with the first insulating layer 205.

Since the end portion of the insulating layer 314 is outward from the end portion of the insulating layer 315 in the structures of FIGS. 27A and 27B, as compared to the structure in FIG. 28, a step is small, so that coverage with the EL layer 322 and the electrode 323 can be increased.

Here, the first insulating layer 205 is preferably an inorganic insulating film, and the insulating layer 314 is preferably an organic insulating film. In this case, in the structure of FIG. 28, the organic film is in contact with the inorganic films at two interfaces, which are an interface between the first insulating layer 205 and the EL layer 322 and an interface between the EL layer 322 and the electrode 323. In contrast, in the structures of FIGS. 27A and 27B, since the EL layer 322 is not in contact with the first insulating layer 205 but in contact with the insulating layer 314, the number of interfaces at which an organic film is in contact with inorganic films can be reduced. The interface between an organic film and an inorganic film has poorer adhesion than the interface between organic films. In the structures of FIGS. 27A and 27B, as compared to the structure of FIG. 28, the number of interfaces having poor adhesion is small and a decrease in yield of the fabrication process of the display panel can be suppressed.

FIG. 27A illustrates an example in which the end portion of the EL layer 322 and an end portion of the electrode 323 are aligned. FIG. 27B illustrates an example in which the electrode 323 covers the end portion of the EL layer 322 and the end portion of the insulating layer 314, and the end portion of the electrode 323 is in contact with the first insulating layer 205. By covering the end portion of the insulating layer 314 with the electrode 323, the reliability of the display panel can be increased. In the case where the electrode 323 is a conductive layer that transmits visible light, the electrode 323 may be included in the region 110 that transmits visible light as illustrated in FIG. 27B.

This embodiment can be combined with any of other embodiments as appropriate.

<Embodiment 4>

In this embodiment, electronic devices and lighting devices of embodiments of the present invention are described with reference to drawings.

Examples of electronic devices include a television set, a monitor of a computer or the like, a digital camera, a digital video camera, a digital photo frame, a mobile phone (also referred to as a mobile phone device), a portable game machine, a portable information terminal, an audio reproducing device, a large game machine such as a pinball machine, and the like.

The electronic device or the lighting device of one embodiment of the present invention has flexibility and therefore can be incorporated along a curved inside/outside wall surface of a house or a building or a curved interior/exterior surface of a car.

Furthermore, the electronic device of one embodiment of the present invention may include a secondary battery. It is preferable that the secondary battery be capable of being charged by non-contact power transmission.

Examples of the secondary battery include a lithium ion secondary battery such as a lithium polymer battery using a gel electrolyte (lithium ion polymer battery), a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, the electronic device can display an image, data, or the like on a display portion. When the electronic device includes the antenna and a secondary battery, the antenna may be used for contactless power transmission.

In the display device of one embodiment of the present invention, the area of the display region can be increased unlimitedly by increasing the number of display panels. Thus, the display device of one embodiment of the present invention can be favorably used for digital signage, a PID, or the like. Furthermore, the shape of the display region of the display device of one embodiment of the present invention can be changed variously when the arrangement of the display panels is changed.

Figure 29A:
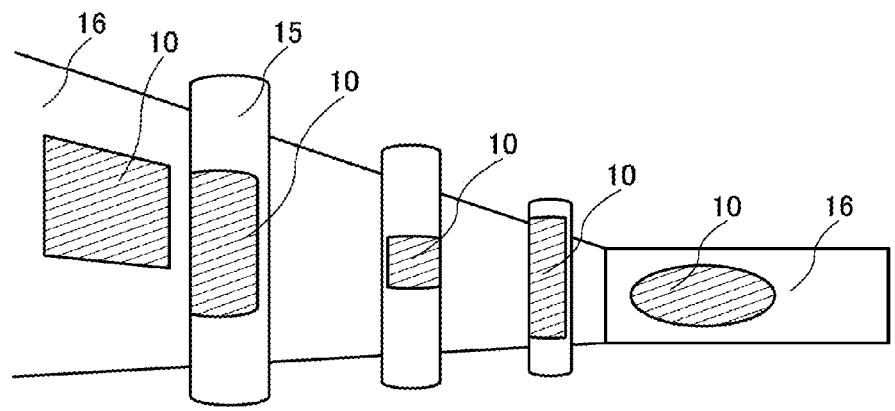
FIGS. 29A to 29F illustrate examples of electronic appliances and lighting devices.

FIG. 29A illustrates an example in which a display device 10 of one embodiment of the present invention is provided for each of pillars 15 and walls 16. A flexible display panel is used as a display panel included in the display device 10, whereby the display device 10 can be placed along a curved surface.

Here, in particular, in the case where the display device of one embodiment of the present invention is used in digital signage or a PID, it is preferable to use a touch panel in a display panel because a device with such a structure does not just display a still or moving image on a display region, but can be operated by viewers intuitively. Alternatively, in the case where the display device of one embodiment of the present invention is used for providing information such as route information or traffic information, usability can be enhanced by intuitive operation. In the case of providing the display device on the walls of buildings, public facilities, or the like, a touch panel does not need to be used in the display panel.

FIGS. 29B to 29E illustrate examples of an electronic device including a display portion 7000 with a curved surface. The display surface of the display portion 7000 is bent, and images can be displayed on the bent display surface. The display portion 7000 may be flexible.

The display portion 7000 of each of the electronic devices illustrated in FIGS. 29B to 29E can be formed using the display device of one embodiment of the present invention.

Figure 29B:
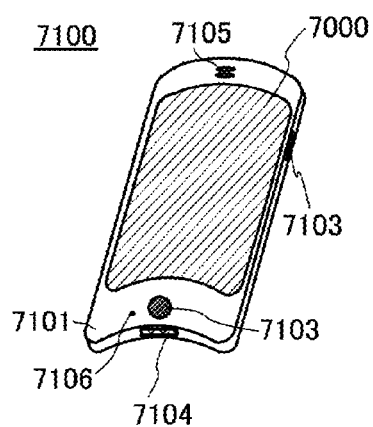

FIG. 29B illustrates an example of a mobile phone. A mobile phone 7100 includes a housing 7101, the display portion 7000, operation buttons 7103, an external connection port 7104, a speaker 7105, a microphone 7106, and the like.

The mobile phone 7100 illustrated in FIG. 29B includes a touch sensor in the display portion 7000. Moreover, operations such as making a call and inputting a letter can be performed by touch on the display portion 7000 with a finger, a stylus, or the like.

With the operation buttons 7103, the power can be turned on or off. In addition, types of images displayed on the display portion 7000 can be switched; for example, switching images from a mail creation screen to a main menu screen is performed with the operation button 7103.

Figure 29C:
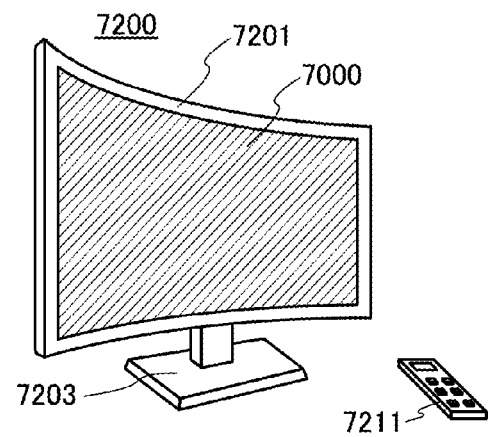

FIG. 29C illustrates an example of a television set. In a television set 7200, the display portion 7000 is incorporated into a housing 7201. Here, the housing 7201 is supported by a stand 7203.

The television set 7200 illustrated in FIG. 29C can be operated with an operation switch of the housing 7201 or a separate remote controller 7211. Furthermore, the display portion 7000 may include a touch sensor, and can be operated by touch on the display portion 7000 with a finger or the like. Furthermore, the remote controller 7211 may be provided with a display portion for displaying data output from the remote controller 7211. With operation keys or a touch panel of the remote controller 7211, channels and volume can be controlled and images displayed on the display portion 7000 can be controlled.

Note that the television set 7200 is provided with a receiver, a modem, or the like. A general television broadcast can be received with the receiver. Furthermore, when the television set is connected to a communication network with or without wires via modem, one-way (from a transmitter to a receiver) or two-way (between a transmitter and a receiver or between receivers) data communication can be performed.

Figure 29D:
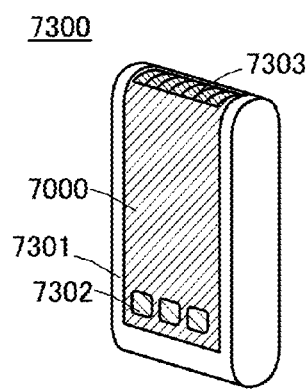

FIG. 29D illustrates an example of a portable information terminal. A portable information terminal 7300 includes a housing 7301 and the display portion 7000. The portable information terminal may also include an operation button, an external connection port, a speaker, a microphone, an antenna, a battery, or the like. The display portion 7000 is provided with a touch sensor. An operation of the portable information terminal 7300 can be performed by touching the display portion 7000 with a finger, a stylus, or the like.

Figure 29E:
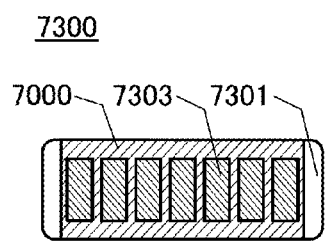

FIG. 29D is a perspective view of the portable information terminal 7300. FIG. 29E is a top view of the portable information terminal 7300.

Each of the portable information terminals illustrated in this embodiment functions as, for example, one or more of a telephone set, a notebook, and an information browsing system. Specifically, each of the portable information terminals can be used as a smartphone. Each of the portable information terminals illustrated in this embodiment is capable of executing a variety of applications such as mobile phone calls, e-mailing, reading and editing texts, music reproduction, Internet communication, and a computer game, for example.

The portable information terminal 7300 can display letters or an image on its plurality of surfaces. For example, as illustrated in FIG. 29D, three operation buttons 7302 can be displayed on one surface, and information 7303 indicated by a rectangle can be displayed on another surface. FIGS. 29D and 29E illustrate an example in which information is displayed at the top of the portable information terminal. Alternatively, information may be displayed on the side of the portable information terminal. Information may also be displayed on three or more surfaces of the portable information terminal.

Examples of the information include notification from a social networking service (SNS), display indicating reception of an e-mail or an incoming call, the title of an e-mail or the like, the sender of an e-mail or the like, the date, the time, remaining battery, and the reception strength of an antenna. Alternatively, the operation button, an icon, or the like may be displayed in place of the information.

For example, a user of the portable information terminal 7300 can see the display (here, the information 7303) with the portable information terminal 7300 put in a breast pocket of his/her clothes.

Specifically, a caller's phone number, name, or the like of an incoming call is displayed in a position that can be seen from above the portable information terminal 7300. Thus, the user can see the display without taking out the portable information terminal 7300 from the pocket and decide whether to answer the call.

Figure 29F:
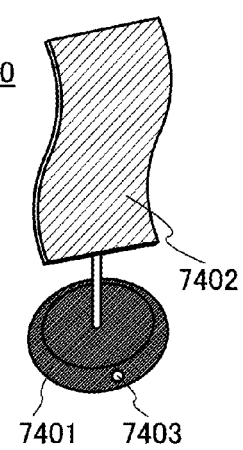

FIG. 29F illustrates an example of a lighting device having a curved light-emitting portion.

The light-emitting portion included in the lighting device illustrated in FIG. 29F can be manufactured using the display device of one embodiment of the present invention.

A lighting device 7400 illustrated in FIG. 29F includes a light-emitting portion 7402 having a wave-shaped light-emitting surface, which is a good-design lighting device.

The light-emitting portion included in the lighting device 7400 may be flexible. The light-emitting portion may be fixed on a plastic member, a movable frame, or the like so that a light-emitting surface of the light-emitting portion can be bent freely depending on the intended use.

The lighting device 7400 includes a stage 7401 provided with an operation switch 7403 and a light-emitting portion supported by the stage 7401.

Note that although the lighting device in which the light-emitting portion is supported by the stage is described as an example here, a housing provided with a light-emitting portion can be fixed on a ceiling or suspended from a ceiling. Since the light-emitting surface can be curved, the light-emitting surface is curved to have a depressed shape, whereby a particular region can be brightly illuminated, or the light-emitting surface is curved to have a projecting shape, whereby a whole room can be brightly illuminated.

FIGS. 30A1, 30A2, and 30B to 30I each illustrate an example of a portable information terminal including a display portion 7001 having flexibility.

The display portion 7001 is manufactured using the display device of one embodiment of the present invention. For example, a display device including a display panel that can be bent with a radius of curvature of greater than or equal to 0.01 mm and less than or equal to 150 mm can be used. The display portion 7001 may include a touch sensor so that the portable information terminal can be operated by touching the display portion 7001 with a finger or the like.

FIGS. 30A1 and 30A2 are a perspective view and a side view, respectively, illustrating an example of the portable information terminal. A portable information terminal 7500 includes a housing 7501, the display portion 7001, a display portion tab 7502, operation buttons 7503, and the like.

The portable information terminal 7500 includes a rolled flexible display portion 7001 in the housing 7501.

The portable information terminal 7500 can receive a video signal with a control portion incorporated therein and can display the received video on the display portion 7001. The portable information terminal 7500 incorporates a battery. A terminal portion for connecting a connector may be included in the housing 7501 so that a video signal or power can be directly supplied from the outside with a wiring.

By pressing the operation buttons 7503, power on/off, switching of displayed images, and the like can be performed. Although FIGS. 30A1, 30A2, and 30B illustrate an example where the operation buttons 7503 are positioned on a side surface of the portable information terminal 7500, one embodiment of the present invention is not limited thereto. The operation buttons 7503 may be placed on a display surface (a front surface) or a rear surface of the portable information terminal 7500.

FIG. 30B illustrates the portable information terminal 7500 in a state where the display portion 7001 is pulled out. Images can be displayed on the display portion 7001 in this state. The display portion 7001 can be extracted by the display portion tab 7502. In addition, the portable information terminal 7500 may perform different displays in the state where part of the display portion 7001 is rolled as illustrated in FIG. 30A1 and in the state where the display portion 7001 is pulled out as illustrated in FIG. 30B. For example, in the state illustrated in FIG. 30A1, the rolled portion of the display portion 7001 is put in a non-display state, which results in a reduction in power consumption of the portable information terminal 7500.

Note that a reinforcement frame may be provided for a side portion of the display portion 7001 so that the display portion 7001 has a flat display surface when pulled out.

Note that in addition to this structure, a speaker may be provided for the housing so that sound is output with an audio signal received together with a video signal.

FIGS. 30C to 30E illustrate an example of a foldable portable information terminal. FIG. 30C illustrates a portable information terminal 7600 that is opened. FIG. 30D illustrates the portable information terminal 7600 that is being opened or being folded. FIG. 30E illustrates the portable information terminal 7600 that is folded. The portable information terminal 7600 is highly portable when folded, and is highly browsable when opened because of a seamless large display area.

A display portion 7001 is supported by three housings 7601 joined together by hinges 7602. By folding the portable information terminal 7600 at a connection portion between two housings 7601 with the hinges 7602, the portable information terminal 7600 can be reversibly changed in shape from an opened state to a folded state.

FIGS. 30F and 30G illustrate an example of a foldable portable information terminal. FIG. 30F illustrates a portable information terminal 7650 that is folded so that the display portion 7001 is on the inside. FIG. 30G illustrates the portable information terminal 7650 that is folded so that the display portion 7001 is on the outside. The portable information terminal 7650 includes the display portion 7001 and a non-display portion 7651. When the portable information terminal 7650 is not used, the portable information terminal 7650 is folded so that the display portion 7001 is on the inside, whereby contamination of or damage to the display portion 7001 can be suppressed.

FIG. 30H illustrates an example of a flexible portable information terminal. A portable information terminal 7700 includes a housing 7701 and the display portion 7001. In addition, the portable information terminal 7700 may include buttons 7703a and 7703b that serve as input means, speakers 7704a and 7704b that serve as sound output means, an external connection port 7705, a microphone 7706, or the like. A flexible battery 7709 can be mounted on the portable information terminal 7700. The battery 7709 may be arranged to overlap with the display portion 7001, for example.

The housing 7701, the display portion 7001, and the battery 7709 are flexible. Thus, it is easy to curve the portable information terminal 7700 into a desired shape or to twist the portable information terminal 7700. For example, the portable information terminal 7700 can be curved so that the display portion 7001 is on the inside or in the outside. The portable information terminal 7700 can be used in a rolled state. Since the housing 7701 and the display portion 7001 can be transformed freely in this manner, the portable information terminal 7700 is less likely to be broken even when the portable information terminal 7700 falls down or external stress is applied to the portable information terminal 7700.

The portable information terminal 7700 can be used effectively in various situations because the portable information terminal 7700 is lightweight. For example, the portable information terminal 7700 can be used in the state where the upper portion of the housing 7701 is suspended by a clip or the like, or in the state where the housing 7701 is fixed to a wall by magnets or the like.

FIG. 30I illustrates an example of a wrist-watch-type portable information terminal. A portable information terminal 7800 includes a band 7801, the display portion 7001, an input-output terminal 7802, operation buttons 7803, or the like. The band 7801 has a function of a housing. A flexible battery 7805 can be mounted on the portable information terminal 7800. The battery 7805 may overlap with the display portion 7001 or the band 7801, for example.

The band 7801, the display portion 7001, and the battery 7805 have flexibility. Thus, the portable information terminal 7800 can be easily curved to have a desired shape.

With the operation button 7803, a variety of functions such as time setting, on/off of the power, on/off of wireless communication, setting and cancellation of silent mode, and setting and cancellation of power saving mode can be performed. For example, the functions of the operation button 7803 can be set freely by the operating system incorporated in the portable information terminal 7800.

By touching an icon 7804 displayed on the display portion 7001 with a finger or the like, application can be started.

The portable information terminal 7800 can employ near field communication that is a communication method based on an existing communication standard. In that case, for example, mutual communication between the portable information terminal 7800 and a headset capable of wireless communication can be performed, and thus hands-free calling is possible.

The portable information terminal 7800 may include the input-output terminal 7802. In the case where the input-output terminal 7802 is included, data can be directly transmitted to and received from another information terminal via a connector. Charging through the input-output terminal 7802 is also possible. Note that charging of the portable information terminal described as an example in this embodiment can be performed by non-contact power transmission without using the input-output terminal.

This embodiment can be combined with any of other embodiments as appropriate.

[Example 1]

In this example, the results of fabricating the display device of one embodiment of the present invention are described. A display device fabricated in this example is a kawara-type multidisplay.

<Display Panel>

First, the display panel used in the display device in this example is described.

Figure 31A:
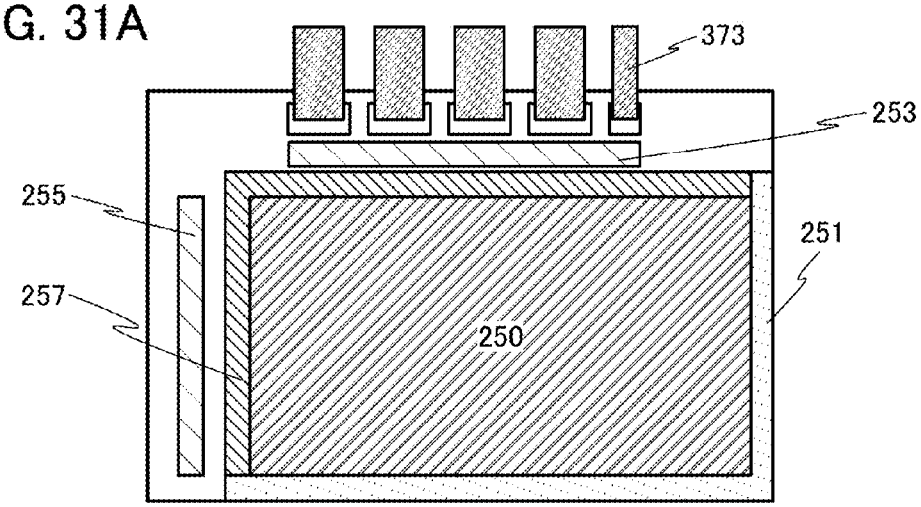
FIGS. 31A to 31C illustrate a display panel and a display device of Example 1.

FIG. 31A is a schematic view of the display panel in this example. The display panel illustrated in FIG. 31A is an active matrix organic EL display that has a light-emitting portion 250 with a size of 13.5 inches diagonally, 1280×720 effective pixels, a resolution of 108 ppi, and an aperture ratio of 61.0%. The display panel includes a demultiplexer (DeMUX) 253 serving as a source driver. In addition, the display panel also includes a scan driver 255. Two sides of the light-emitting portion 250 are in contact with a region 251 that transmits visible light. A lead wiring 257 is provided along the other two sides.

A channel-etched transistor including a CAAC-OS was used as a transistor. Note that an In—Ga—Zn-based oxide was used for the oxide semiconductor.

As the light-emitting element, a tandem (stacked-layer) organic EL element emitting white light was used. The light-emitting element has a top emission structure, where light generated by the light-emitting element is extracted to the outside of the display panel through a color filter.

Figure 31B:
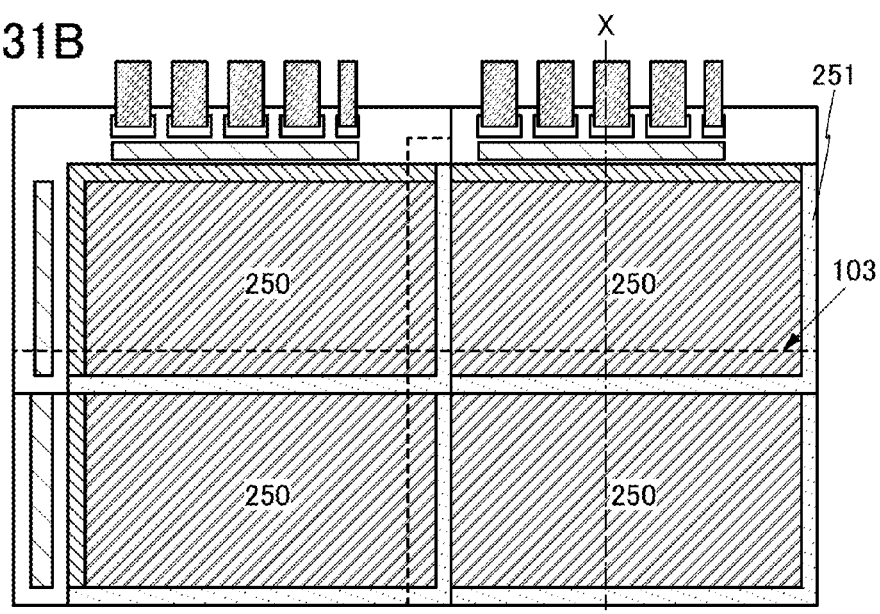
Figure 31C:
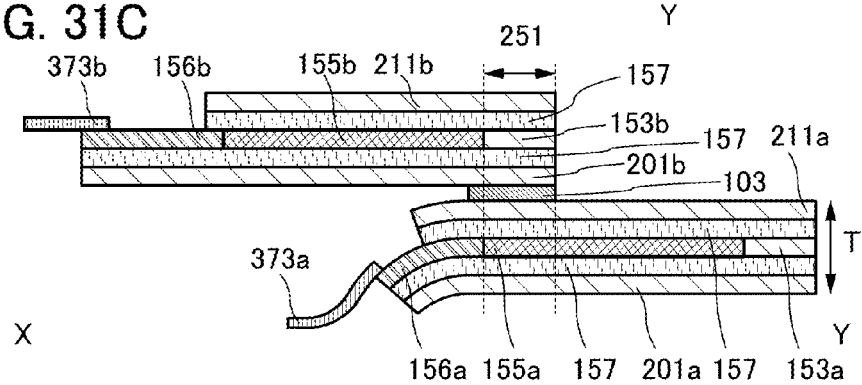

FIG. 31B is a schematic view of a display device in which four display panels overlap with each other and are arranged in a 2×2 matrix. FIG. 31C shows a cross-sectional schematic view taken along a dashed dotted line X-Y of the display device of FIG. 31B.

The display device in this example is formed by overlapping a plurality of display panels so that a non-display region between display regions is made small. Specifically, the light-transmitting layer 103 is provided between the region 251 that transmits visible light of an upper display panel and the light-emitting portion 250 of a lower display panel.

A structure that blocks visible light such as a lead wiring or a driver is not provided at all from an end portion of the light-emitting portion 250 to an end portion of the display panel along two sides of the display panel, and the region along two sides serves as the region 251 that transmits visible light. The width of the region 251 that transmits visible light of the display panel is approximately 2 mm. The thickness T of the region 251 that transmits visible light (also referred to as a thickness of one display panel) is very small, which is approximately 110 μm. Therefore, although the display device in this example has a region in which at most four display panels overlap with each other, a step formed on the display surface side is extremely small; thus, a seam hardly stands out.

The four display panels have flexibility. For example, as illustrate in FIG. 31C, a region near an FPC 373a of the lower display panel can be bent so that part of the lower display panel and part of the FPC 373a can be placed under the light-emitting portion 250 of the upper display panel adjacent to the FPC 373a. As a result, the FPC 373a can be placed without physical interference with the rear surface of the upper display panel. In this way, another display panel can be provided on four sides of the display panel, whereby a large-sized display panel is easily realized.

In this example, an attachment film including attachment layers on both surfaces of a base material was used as the light-transmitting layer 103. With use of the attachment film, two display panels included in the display device can be detachably attached to each other. An attachment layer on one side of the light-transmitting layer 103 was attached to a substrate 211a, and an attachment layer on the other side of the light-transmitting layer 103 was attached to a substrate 201b.

In FIG. 31B, the light-transmitting layer 103 includes not only a portion overlapping with the region 251 that transmits visible light, but also a portion overlapping with the light-emitting portion 250. In FIG. 31C, the light-transmitting layer 103 overlaps with the entire region 251 that transmits visible light from an end portion of the substrate 201b, and also overlaps with part of a region 155b containing a display element. Note that the light-transmitting layer 103 is not provided on a curved region of the display panel that is close to a region to which the FPC 373a is connected illustrated in FIG. 31C. However, the light-transmitting layer 103 may be provided on a curved region of the display panel depending on the thickness or flexibility of the light-transmitting layer 103.

Each of the display panels was formed by attaching a substrate and an element layer with a bonding layer. For example, as illustrated in FIG. 31C, a substrate 201a, the substrate 211a, the substrate 201b, and a substrate 211b are attached to an element layer 153a, the element layer 153a, an element layer 153b, and the element layer 153b respectively, with a bonding layer 157. The element layer 153a has a region 155a including a display element and a region 156a including a wiring electrically connected to the display element. Similarly, the element layer 153b has the region 155b including a display element and a region 156b including a wiring electrically connected to the display element.

Figure 32:
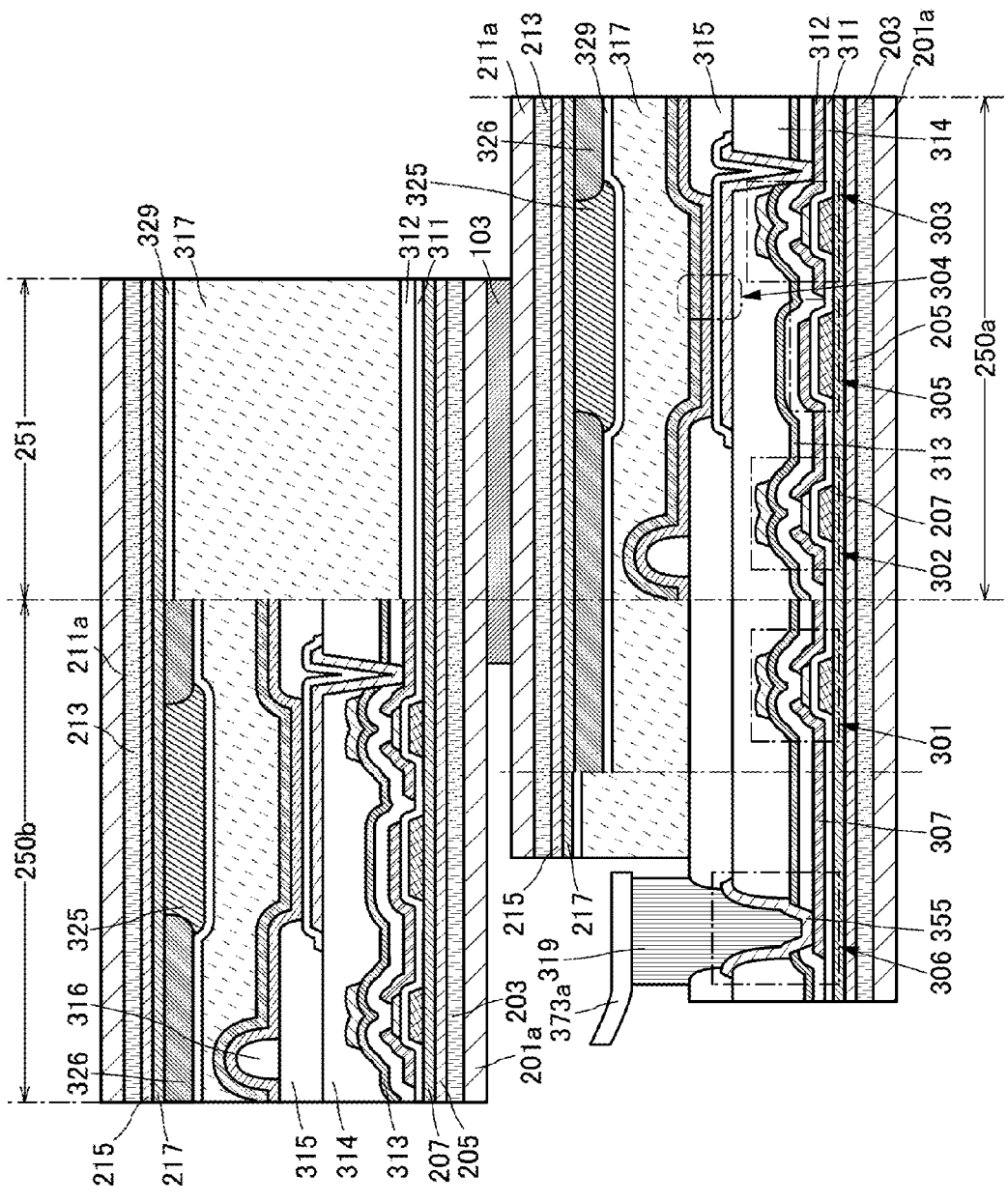
FIG. 32 is a cross-sectional view illustrating a display device of Example 1.

FIG. 32 illustrates a cross-sectional view of a display device including an overlapping area of two display panels. The structures of the light-emitting portion 250 and the region 251 that transmits visible light of the display panels used in this example are described with reference to FIG. 32. A light-emitting portion 250a and a light-emitting portion 250b have the same structure, and thus are collectively described as the light-emitting portion 250. The light-emitting portion 250 and the region 251 that transmits visible light include the first insulating layer 205, the second insulating layer 207, the gate insulating layer 311, the insulating layer 312, the third insulating layer 215, and the fourth insulating layer 217. The insulating layer 313, the insulating layer 314, and the insulating layer 315 are provided in the light-emitting portion 250 and not provided in the region 251 that transmits visible light. The display panel in this example has the same structure as that of FIG. 18A described in Embodiment 2 other than the structure of the region 251 that transmits visible light.

<Overlapping Area>

In this example, invisibility of overlapping areas of four samples, which are Sample a, Sample b, Sample c, and Sample d, was examined. Each sample is a display device including two display panels. The two display panels are arranged so that the region 251 that transmits visible light of an upper display panel overlaps with the light-emitting portion 250 of a lower display panel.

For Sample a, two display panels in which a film that is highly optically anisotropic is used for a pair of substrates (the substrates 201 and 211) are used.

For Sample b, two display panels in which a film that is highly optically isotropic is used for the pair of substrates (the substrates 201 and 211) are used.

Sample c has a structure in which the optical member 240 illustrated in FIG. 8F overlaps with Sample a. The optical member 240 includes the support member 292 that is an acrylic plate, the circular polarizer 295, and the anti-reflection member 296 that is an AR film. The optical member 240 is arranged so that the support member 292 is positioned closest to the display panel.

Sample d has a structure in which the optical member 240 illustrated in FIG. 8F overlaps with Sample b. Note that the structure of the optical member 240 is the same as that of Sample c.

FIGS. 33A to 33D show photographs of the overlapping areas in Sample a to Sample d in which the display device was not driven. The photographs were taken indoors under a fluorescent lamp at an illuminance of approximately 400 lx. The width W of the overlapping area in each sample is approximately 2 mm. A left side display panel is positioned over a right side display panel.

Figure 33A:
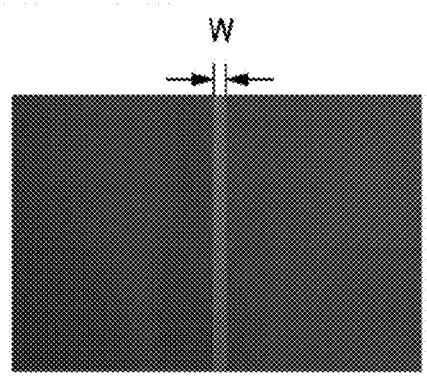
FIGS. 33A to 33D are each a photograph of an overlapping area of a display device of Example 1.
Figure 33B:
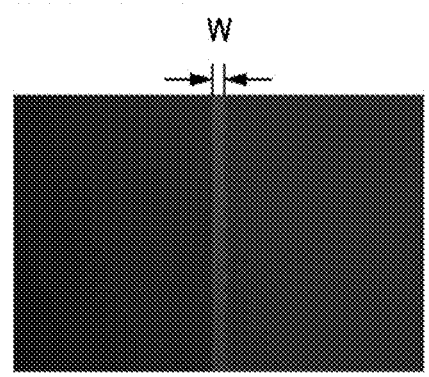

As illustrated in FIGS. 33A and 33B, the overlapping areas can be noticed in Sample a and Sample b regardless of the kind of films. As illustrated in FIG. 32, the region 251 that transmits visible light includes the second insulating layer 207, the gate insulating layer 311, the insulating layer 312, and the fourth insulating layer 217. Thus, there is a difference in reflectance between the overlapping area and the non-overlapping area, which probably makes the overlapping area easily recognizable.

Figure 33C:
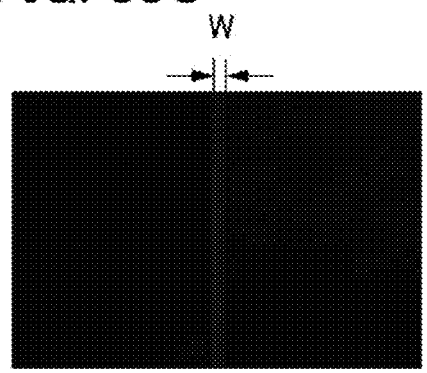
Figure 33D:
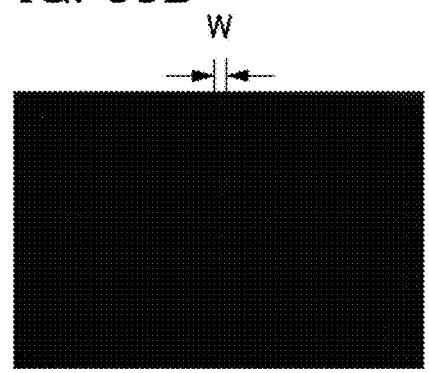

When FIGS. 33C and 33D are compared, the overlapping area can be noticed in Sample c formed using a film that is highly optically anisotropic, whereas the overlapping area is not obvious and is hardly noticed in Sample d formed using a film that is highly optically isotropic.

Table 1 shows the reflectance of the overlapping area and the non-overlapping area and the difference therebetween. A photomultiplier tube (PMT) was used for the measurement of the reflectance. Luminous efficacy was corrected in this measurement.

TABLE 1

|  | Without circular polarizer | | With circular polarizer | |
| --- | --- | --- | --- | --- |
|  | Sample a | Sample b | Sample c | Sample d |
| Overlapping area | 11.37% | 5.92% | 0.69% | 0.30% |
| Non-overlapping area | 7.41% | 4.44% | 0.27% | 0.21% |
| Difference | 3.96% | 1.48% | 0.42% | 0.09% |

Sample a has the largest difference in reflectance between the overlapping area and the non-overlapping area, and the difference becomes smaller and smaller in Sample b, Sample c, and Sample d in this order. This corresponds to the actual appearances of the overlapping areas shown in FIGS. 33A to 33D. This shows that the use of the film that is highly optically isotropic and the circular polarizer can suppress the reflection of external light. It can be said that the use of the film that is highly optically isotropic and the circular polarizer can prevent the overlapping area from being noticed easily because of the difference in reflectance between the overlapping area and the non-overlapping area.

<Transmittance of Region that Transmits Visible Light>

Figure 34:
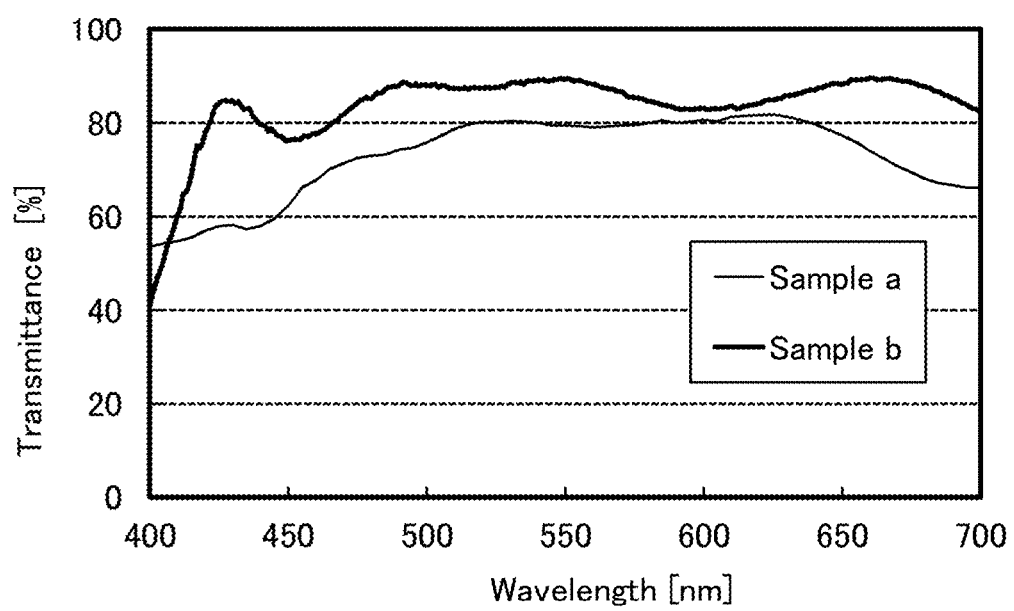
FIG. 34 shows a measurement result of a transmittance of a region that transmits visible light of a display device of Example 1.

FIG. 34 shows the measurement result of light transmittance of the region 110 that transmits visible light in the display panel used for Sample a and Sample b. The light transmittance was measured with a spectrophotometer.

As illustrated in FIG. 34, the display panel used for Sample b has a higher light transmittance in the region 110 that transmits visible light than the display panel used for Sample a. This shows that the transmittance of visible light in the film that is highly optically isotropic and used for Sample b is higher than that in the film that is highly optically anisotropic and used for Sample a.

<Display Device>

Figure 35A:
FIGS. 35A and 35B are photographs of a display panel and a display device of Example 1 each displaying an image.

FIG. 35A shows a photograph of display of one display panel used for Sample b. From FIG. 35A, it is found that the display panel fabricated using the film that is highly optically isotropic can emit light normally.

Figure 35B:

FIG. 35B shows a photograph of display of a wide quad high definition (WQHD) multidisplay that is fabricated using four (2×2) display panels and has a size of 27 inches diagonally.

FIG. 35B shows a structure in which four display panels used for Sample b are used and the optical member 240 overlaps with the display panels (that is, this structure corresponds to Sample d). The optical member 240 is screwed on a housing while the optical member 240 is closely attached to the display panels. The optical member 240 is not bonded to the display panels.

Figure 35C:
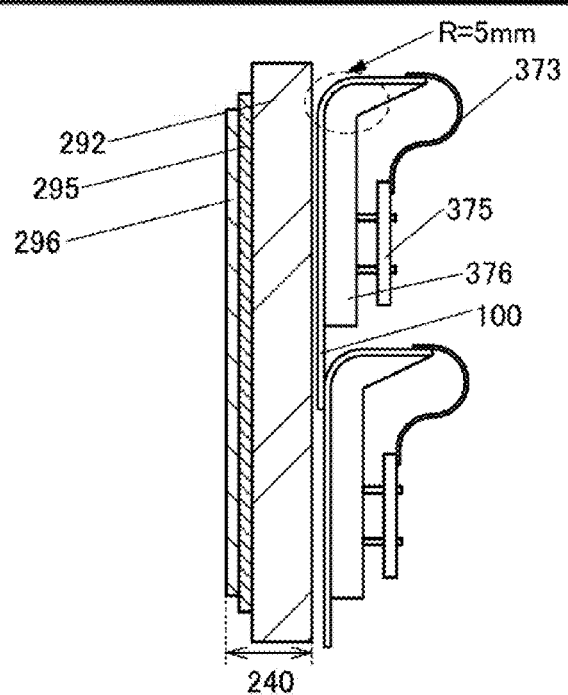
FIG. 35C is a side view illustrating a display device.

FIG. 35C illustrates a side view of the multidisplay. The display panel 100 is attached to one plane of a support 376 (aluminum plate). The support 376 has a curved surface whose curvature radius R is 5 mm, and the display panel 100 is curved along the curved surface. The display panel 100 has a portion extended from the support 376. The portion overlaps with an adjacent display panel 100. A driver circuit 375 is screwed on the other plane of the support 376. The display panel 100 is electrically connected to the driver circuit 375 with the FPC 373. The optical member 240 includes the anti-reflection member 296, the circular polarizer 295, and the support member 292.

As shown in FIG. 35B, the display device fabricated in this example has little reflection of surroundings. Furthermore, the overlapping area is not obvious and is less likely to be noticed. This shows that the reflection of light from a surface of the display device is suppressed.

As described above, in this example, a display device in which an overlapping area is less likely to be noticed can be fabricated using a display panel utilizing a film that is highly optically isotropic and a circular polarizer.

[Example 2]

In this example, a structure used for the region that transmits visible light of the display panel of one embodiment of the present invention is described.

The region 251 that transmits visible light of the display panel used in Example 1 (see FIG. 32) has a structure (corresponding to Condition 1 below) including the substrate 201, the bonding layer 203, the first insulating layer 205, the second insulating layer 207, the gate insulating layer 311, the insulating layer 312, the bonding layer 317, the fourth insulating layer 217, the third insulating layer 215, the bonding layer 213, and the substrate 211. The region 251 that transmits visible light includes, as insulating layers, a plurality of silicon oxide films whose refractive index is approximately 1.5 and a plurality of silicon nitride films whose refractive index is approximately 2.0, and thus includes a plurality of interfaces having a large difference in refractive index.

In the display panel used in Example 1, the first insulating layer 205 and the third insulating layer 215 are each a single-layer structure of a silicon oxide film whose refractive index is approximately 1.5. These insulating layers are preferably provided in the region 251 that transmits visible light to increase the yield of the fabrication process of the display panel.

In the display panel used in Example 1, a stack including the second insulating layer 207, the gate insulating layer 311, and the insulating layer 312 and the fourth insulating layer 217 include silicon oxide films whose refractive index is approximately 1.5 and silicon nitride films whose refractive index is approximately 2.0, and thus there are some interfaces having a large difference in refractive index.

In this example, the reflectance of a visible region in the case of a structure (corresponding to Condition 2 below) in which the region 251 that transmits visible light includes only the substrate 201, the bonding layer 203, the first insulating layer 205, the bonding layer 317, the third insulating layer 215, the bonding layer 213, and the substrate 211 and does not include the second insulating layer 207, the gate insulating layer 311, the insulating layer 312, or the fourth insulating layer 217 was simulated.

For the simulation, thin film calculation software, Essential Macleod (Thin Film Center Inc.), was used. The refractive index of the substrates and the bonding layers is 1.5.

Figure 36:
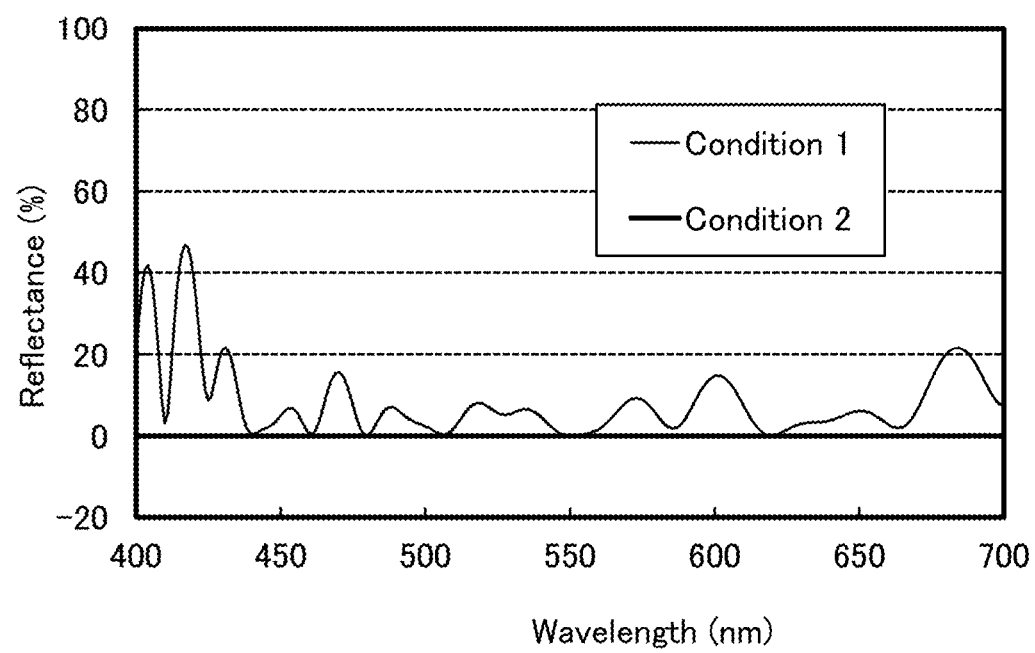
FIG. 36 shows a calculation result of a reflectance of a region that transmits visible light.

FIG. 36 shows the calculation results of the reflectance of the visible region of Condition 1 and Condition 2. The calculation results do not include the reflection on the surfaces of the substrates 201 and 211.

Condition 1 corresponds to a structure of the region 251 that transmits visible light of the display panel in Example 1. Condition 2 corresponds to a stacked-layer structure formed of the substrate 201, the bonding layer 203, the first insulating layer 205, the bonding layer 317, the third insulating layer 215, the bonding layer 213, and the substrate 211.

The results in FIG. 36 show that the reflectance of the visible region of Condition 2 is extremely small as compared to the reflectance of Condition 1. This shows that the reflection of external light can be suppressed by changing the structure of the region that transmits visible light to reduce the number of interfaces having a large difference in refractive index.

It can be said that when the number of interfaces having a large difference in refractive index in the region that transmits visible light is reduced, the reflection of external light can be suppressed without using a circular polarizer, and accordingly a decrease in extraction efficiency of light caused by a circular polarizer can be suppressed. This shows that by using one embodiment of the present invention, a display device which has high light extraction efficiency and in which a seam is less likely to be noticed can be manufactured.

Figure 37:
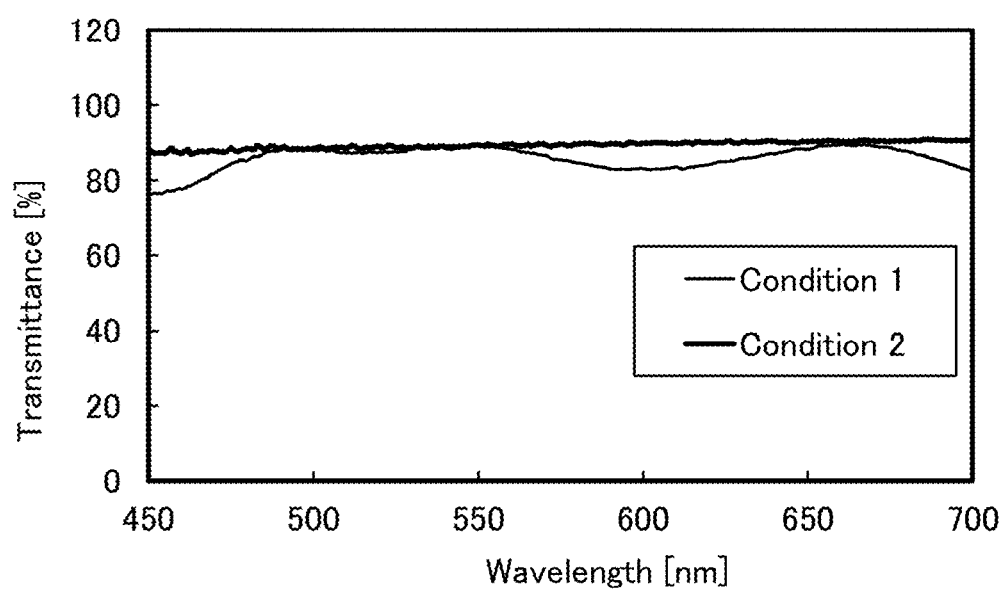
FIG. 37 shows a measurement result of a transmittance of a region that transmits visible light.

Next, a display panel in which a stacked-layer structure corresponding to Condition 2 is used in the region that transmits visible light was fabricated. FIG. 37 shows the measurement results of transmittance of the visible region in the region that transmits visible light. Note that the measurement results include the influence of reflection on the surfaces of the substrates 201 and 211.

The transmittance of the visible region was high in the region that transmits visible light of the display panel fabricated in this example (Condition 2) as compared to the region that transmits visible light of the display panel fabricated in Example 1 (Condition 1). It is found that the reflection of external light can be suppressed by reducing the number of interfaces having a large difference in refractive index in the region that transmits visible light.

Figure 38:
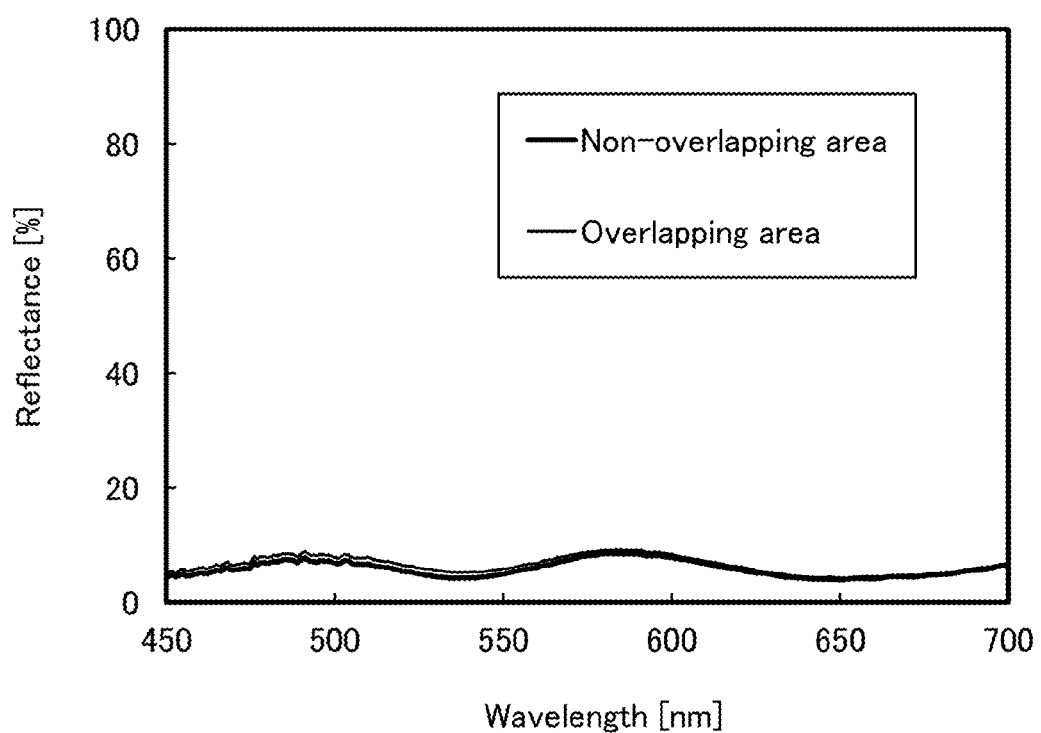
FIG. 38 shows a measurement result of a reflectance of an overlapping area and a non-overlapping area.

Furthermore, the region that transmits visible light of the structure of Condition 2 was positioned to overlap with a light-emitting portion of another display panel, and the reflectance of each of the overlapping area and a non-overlapping area was measured. FIG. 38 shows the measurement results of the reflectance. FIG. 38 shows that there are few differences in reflectance between the overlapping area and the non-overlapping area.

As described above, it is found that the reflection of external light can be suppressed without using a circular polarizer by reducing the number of interfaces having a large difference in refractive index in the region that transmits visible light. Since a circular polarizer is not used, a decrease in extraction efficiency of light caused by a circular polarizer can be suppressed. This shows that a display device which has high light extraction efficiency and in which a seam is less likely to be noticed can be manufactured by using one embodiment of the present invention.

This application is based on Japanese Patent Application serial No. 2015-232969 filed with Japan Patent Office on Nov. 30, 2015 and Japanese Patent Application serial No. 2016-101538 filed with Japan Patent Office on May 20, 2016, the entire contents of which are hereby incorporated by reference.

What is claimed is:

1. A display device comprising:
a first display panel; and
a second display panel,
wherein the first display panel comprises a first display region and a region that transmits visible light,
wherein the second display panel comprises a second display region and a region that blocks visible light,
wherein the first display region is adjacent to the region that transmits visible light,
wherein the second display region is overlapped by, on a display surface side, the region that transmits visible light,
wherein the region that blocks visible light is overlapped by the first display region,
wherein the first display panel comprises a first substrate, a second substrate, a first bonding layer, a second bonding layer, a first insulating layer, a second insulating layer, a transistor, and a display element,
wherein the first bonding layer is positioned between the first substrate and the first insulating layer,
wherein the second bonding layer is positioned between the second substrate and the first insulating layer,
wherein in the first display region, the transistor is positioned between the first insulating layer and the second insulating layer,
wherein in the first display region, the second insulating layer is positioned between the first insulating layer and the second bonding layer,
wherein in the first display region, the display element is positioned between the second insulating layer and the second bonding layer, and wherein in the region that transmits visible light, the first insulating layer is in contact with the second bonding layer.

2. The display device according to claim 1, wherein the first insulating layer is an oxide insulating film.

3. The display device according to claim 1, wherein the second insulating layer comprises a nitride insulating film.

4. The display device according to claim 1, wherein the first substrate and the second substrate are flexible.

5. The display device according to claim 1,
wherein a difference in refractive index between the first substrate and the first bonding layer is less than or equal to 0.20,
wherein a difference in refractive index between the first bonding layer and the first insulating layer is less than or equal to 0.20,
wherein a difference in refractive index between the second bonding layer and the first insulating layer is less than or equal to 0.20, and
wherein a difference in refractive index between the second substrate and the second bonding layer is less than or equal to 0.20.

6. The display device according to claim 1, further comprising a circular polarizer,
wherein the first display region and the second display region are overlapped by, on the display surface side, the circular polarizer.

7. The display device according to claim 1,
wherein the first substrate and the second substrate are each a substrate that is highly optically isotropic.

8. The display device according to claim 1, wherein the first display panel and the second display panel are flexible.

9. The display device according to claim 1, the display device comprising:
a first module, the first module comprising:
the first display panel; and
a first connector or a first integrated circuit; and
a second module, the second module comprising:
the second display panel; and
a second connector or a second integrated circuit.

10. An electronic device comprising:
the display device according to claim 1; and
at least one of an antenna, a battery, a housing, a camera, a speaker, a microphone, and an operation button.

11. The display device according to claim 1,
wherein the first display panel comprises a third insulating layer,
wherein the display element comprises a EL layer,
wherein the third insulating layer covers an end portion of the second insulating layer, and
wherein an end portion of the EL layer is in contact with the third insulating layer.

12. The display device according to claim 1,
wherein the first display panel comprises a third insulating layer,
wherein the display element comprises a EL layer,
wherein the third insulating layer is in contact with a side surface of the second insulating layer, and
wherein an end portion of the EL layer is in contact with the third insulating layer.

13. A display device comprising:
a first display panel; and
a second display panel,
wherein the first display panel comprises a first display region and a region that transmits visible light,
wherein the second display panel comprises a second display region and a region that blocks visible light,
wherein the first display region is adjacent to the region that transmits visible light,
wherein the second display region is overlapped by, on a display surface side, the region that transmits visible light,
wherein the region that blocks visible light is overlapped by the first display region,
wherein the first display panel comprises a first substrate, a second substrate, a first bonding layer, a second bonding layer, a third bonding layer, a first insulating layer, a second insulating layer, a third insulating layer, a fourth insulating layer, a fifth insulating layer, and a display element,
wherein the first bonding layer is positioned between the first substrate and the first insulating layer,
wherein the second bonding layer is positioned between the second substrate and the third insulating layer,
wherein the third bonding layer is positioned between the first insulating layer and the third insulating layer,
wherein in the first display region, the second insulating layer is positioned between the first insulating layer and the third bonding layer, and the fourth insulating layer is positioned between the third insulating layer and the third bonding layer,
wherein in the first display region, the display element is positioned between the second insulating layer and the third bonding layer,
wherein in the region that transmits visible light, the third bonding layer is in contact with the first insulating layer and the third insulating layer,
wherein the display element comprises a EL layer,
wherein the fifth insulating layer is in contact with a side surface of the second insulating layer, and
wherein an end portion of the EL layer is in contact with the fifth insulating layer.

14. The display device according to claim 13, wherein each of the first and third insulating layers is an oxide insulating film.

15. The display device according to claim 13, wherein each of the second and fourth insulating layers comprises a nitride insulating film.

16. The display device according to claim 13, wherein the first substrate and the second substrate are flexible.

17. The display device according to claim 13,
wherein a difference in refractive index between the first substrate and the first bonding layer is less than or equal to 0.20,
wherein a difference in refractive index between the first bonding layer and the first insulating layer is less than or equal to 0.20,
wherein a difference in refractive index between the third bonding layer and the first insulating layer is less than or equal to 0.20,
wherein a difference in refractive index between the second substrate and the second bonding layer is less than or equal to 0.20,
wherein a difference in refractive index between the second bonding layer and the third insulating layer is less than or equal to 0.20, and
wherein a difference in refractive index between the third bonding layer and the third insulating layer is less than or equal to 0.20.

18. The display device according to claim 13, further comprising a circular polarizer,
wherein the first display region and the second display region are overlapped by, on the display surface side, the circular polarizer.

19. The display device according to claim 13,
wherein the first substrate and the second substrate are each a substrate that is highly optically isotropic.

20. The display device according to claim 13, wherein the first display panel and the second display panel are flexible.

21. The display device according to claim 13, the display device comprising:
- a first module, the first module comprising:
  - the first display panel; and
  - a first connector or a first integrated circuit; and
- a second module, the second module comprising:
  - the second display panel; and
  - a second connector or a second integrated circuit.

22. An electronic device comprising:
- the display device according to claim 13; and
- at least one of an antenna, a battery, a housing, a camera, a speaker, a microphone, and an operation button.

23. The display device according to claim 13, further comprising a coloring layer and a light-blocking layer,
wherein in the first display region, the coloring layer is positioned between the third bonding layer and the fourth insulating layer,
wherein in the first display region, the light-blocking layer is positioned between the third bonding layer and the fourth insulating layer.

* * * * *